United States Patent
Yamamoto et al.

(10) Patent No.: US 8,022,903 B2
(45) Date of Patent: Sep. 20, 2011

(54) ORGANIC EL DEVICE AND ORGANIC EL DISPLAY APPARATUS

(75) Inventors: Tetsuro Yamamoto, Kanagawa (JP); Katsuhide Uchino, Kanagawa (JP); Junichi Yamashita, Tokyo (JP)

(73) Assignee: Sony Corporation, Tokyo (JP)

( * ) Notice: Subject to any disclaimer, the term of this patent is extended or adjusted under 35 U.S.C. 154(b) by 750 days.

(21) Appl. No.: 12/139,017

(22) Filed: Jun. 13, 2008

(65) Prior Publication Data

US 2009/0009441 A1 Jan. 8, 2009

(30) Foreign Application Priority Data

Jul. 3, 2007 (JP) ................................. 2007-175540

(51) Int. Cl.
*G09G 3/30* (2006.01)
*G09G 3/32* (2006.01)
(52) U.S. Cl. ............ 345/76; 345/82; 345/80; 315/169.3
(58) Field of Classification Search .............. 345/76–83, 345/169, 211; 430/312, 325, 504; 438/99, 438/940; 313/500, 503, 504; 365/149; 257/79, 257/103
See application file for complete search history.

(56) References Cited

U.S. PATENT DOCUMENTS

| 7,202,606 B2 * | 4/2007 | Eom et al. ................... 315/169.3 |
| 2008/0042939 A1 * | 2/2008 | Yamashita et al. .............. 345/76 |
| 2008/0218455 A1 * | 9/2008 | Yamamoto et al. ............. 345/76 |

FOREIGN PATENT DOCUMENTS

| JP | 2000-214800 A | 8/2000 |
| JP | 2002-244588 A | 8/2002 |
| JP | 2003-271076 A | 9/2003 |
| JP | 2005-136028 A | 5/2005 |
| JP | 2006-215213 | 8/2006 |
| JP | 2007-102046 A | 4/2007 |

OTHER PUBLICATIONS

Japanese Patent Office, Office Action issued in Patent Application JP 2007-175540, on Aug. 11, 2009.

* cited by examiner

*Primary Examiner* — Kevin Nguyen
*Assistant Examiner* — Lin Li
(74) *Attorney, Agent, or Firm* — SNR Denton US LLP

(57) ABSTRACT

In the present invention, there is provided an organic electro luminescence device including: an organic electro luminescence light emitting element; and a driving circuit for driving the organic electro luminescence light emitting element, wherein the driving circuit includes (A) an element driving transistor, (B) a video-signal write transistor, and (C) a capacitor having a pair of particular and other electrodes, with regard to the element driving transistor, (A-1) a source/drain area provided on a particular side of the element driving transistor to serve as a particular source/drain area of the element driving transistor is connected to a current supply section, and (A-2) a source/drain area provided on the other side of the element driving transistor to serve as another source/drain area of the element driving transistor is connected to the anode electrode of the organic electro luminescence light emitting element and the particular electrode of the capacitor, forming a second node.

10 Claims, 38 Drawing Sheets

[TP(5)₋₁]

[TP(5)₁]

[TP(5)₁] (CONTINUATION)

[TP(5)₂]

FIG.6A [TP(5)₃]
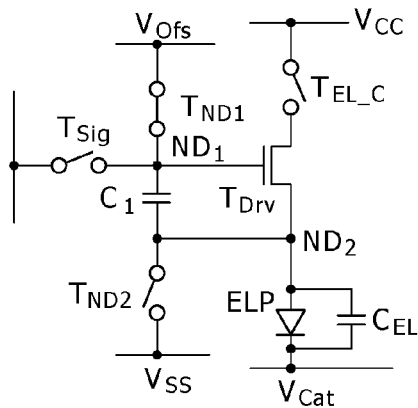
FIG.6B [TP(5)₄]
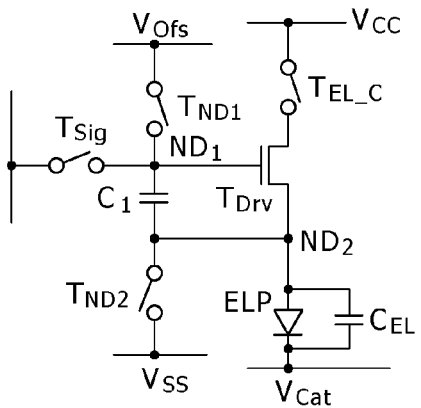
FIG.6C [TP(5)₅]
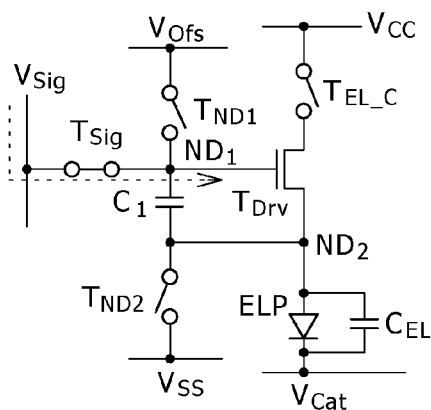
FIG.6D [TP(5)₆]
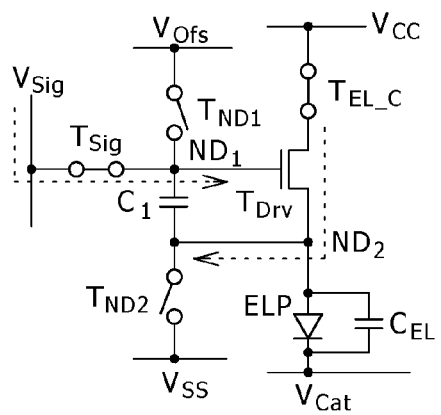
FIG.6E [TP(5)₇]
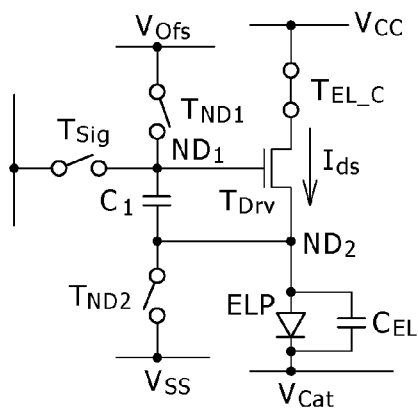

[TP(4)₋₁]

[TP(4)₁]

[TP(4)₂]

[TP(4)₃]

[TP(4)₄]

[TP(4)₅]

[TP(4)₆]

[TP(4)₇]

[TP(3)₋₁]

[TP(3)₀]

[TP(3)₁]

[TP(3)₂]

[TP(3)₃]

[TP(3)₄]

[TP(3)₅]

[TP(3)₆]

[TP(3)₇]

FIG.29A [TP(2)₋₁]
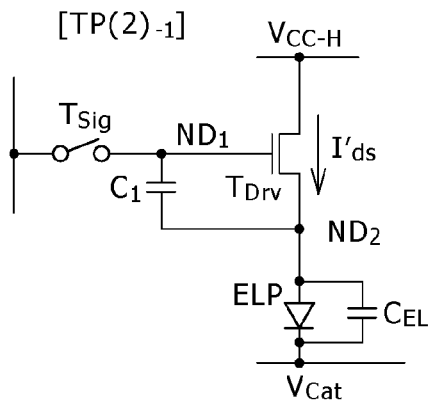
FIG.29B [TP(2)₀]
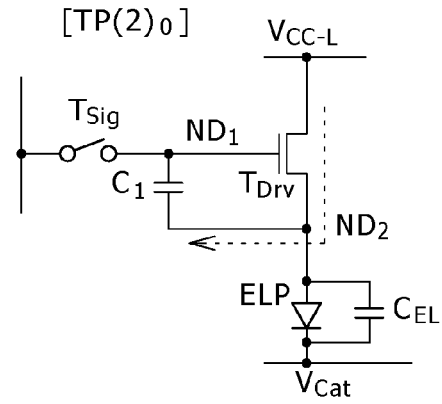
FIG.29C [TP(2)₁]
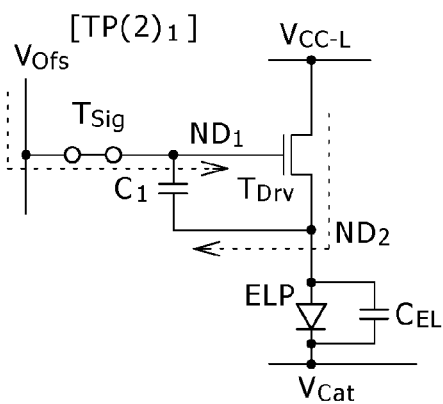
FIG.29D [TP(2)₂]
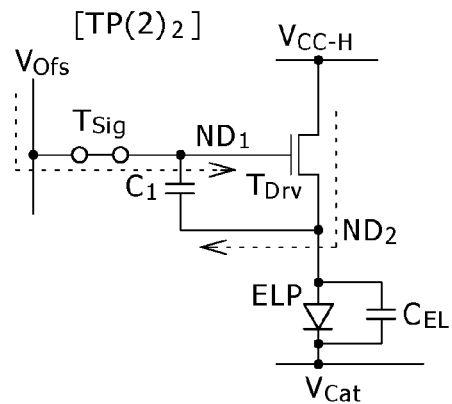
FIG.29E [TP(2)₃]
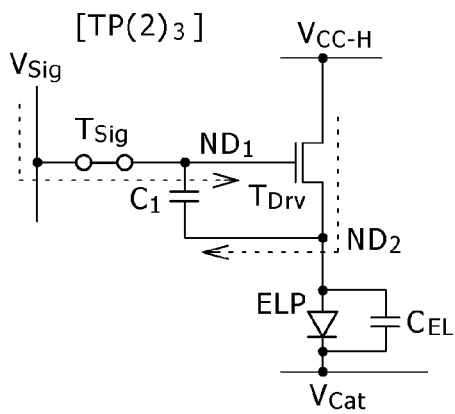
FIG.29F [TP(2)₄]
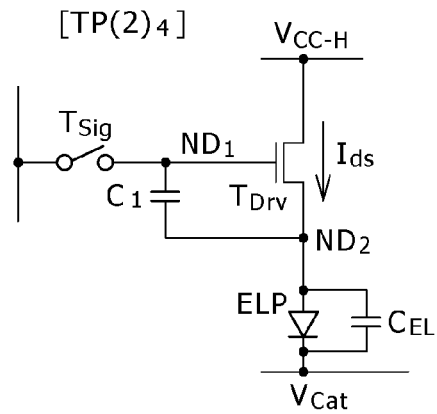

[TP(3₂)₋₁]

[TP(3₂)₀]

[TP(3₂)₁]

[TP(3₂)₂]

[TP(3₂)₃]

[TP(3₂)₄]

[TP(3₂)₅]

US 8,022,903 B2

ORGANIC EL DEVICE AND ORGANIC EL DISPLAY APPARATUS

CROSS REFERENCES TO RELATED APPLICATIONS

The present invention contains subject matter related to Japanese Patent Application JP 2007-175540 filed in the Japan Patent Office on Jul. 3, 2007, the entire contents of which being incorporated herein by reference.

BACKGROUND OF THE INVENTION

1. Field of the Invention

The present invention relates to an organic EL (electro luminescence) device and an organic EL (electro luminescence) display apparatus employing this organic EL device. In this specification, the technical term 'electro luminescence' is abbreviated to EL. In addition, two sides of a component are referred to as respectively particular and other sides of the component. By the same token, two electrodes of a component are referred to as respectively particular and other electrodes of the component. In the same way, two faces of an area are referred to as respectively particular and other faces of the area.

2. Description of the Related Art

In an organic EL display apparatus employing an organic EL device including an organic EL light emitting element, the luminance of the organic EL device is controlled by a current flowing through the organic EL device. Strictly speaking, the luminance of the organic EL device is the luminance of the organic EL light emitting element employed in the organic EL device. In addition, much like a liquid-crystal display apparatus, a simple matrix method and an active matrix method are each generally known as a driving method of the organic EL display apparatus. In comparison with the simple matrix method, the active matrix method has a shortcoming of a complicated structure. Nevertheless, the active matrix method offers merits such as a high degree of image luminance.

A circuit for included in the organic EL device as a circuit for driving an organic EL light emitting element employed in the organic EL device is, for example, a driving circuit having five transistors and one capacitor. In the following description, the driving circuit employing five transistors and one capacitor is referred to as a 5Tr/1C driving circuit. The 5Tr/1C driving circuit is described in documents such as Japanese Patent Laid-open No. 2006-215213. As shown in FIG. 36, the 5Tr/1C driving circuit employs five transistors and a capacitor $C_1$. The five transistors are a video-signal write transistor $T_{Sig}$, an element driving transistor $T_{Drv}$, a light-emission control transistor $T_{EL\_C}$, a first-node initialization transistor $T_{ND1}$ and a second-node initialization transistor $T_{ND2}$. In this configuration, the other source/drain area of the element driving transistor $T_{Drv}$ forms a second node $ND_2$ whereas the gate electrode of the element driving transistor $T_{Drv}$ forms a first node $ND_1$. In the following description, the other source/drain area of the element driving transistor $T_{Drv}$ is a source/drain area provided on a side close to the organic EL light emitting element to serve as the other source/drain area of the element driving transistor $T_{Drv}$.

Each of the transistors cited above is, for example, a TFT (Thin Film Transistor) of an n-channel type. The organic EL light emitting element denoted by notation ELP in figures in this specification is provided on a created inter-layer insulation layer for example, so as to cover the driving circuit. The anode electrode of the organic EL light emitting element ELP is connected to the other source/drain area of the element driving transistor $T_{Drv}$. On the other hand, a voltage $V_{Cat}$ of 0 volts, for example, is applied to the cathode electrode of the organic EL light emitting element ELP. Notation $C_{EL}$ shown in each figure of this specification denotes the parasitic capacitance of the organic EL light emitting element ELP.

SUMMARY OF THE INVENTION

FIG. 4 is a diagram showing a model of timing charts of the driving circuit. FIGS. 5A to 5D and FIGS. 6A to 6E are diagrams showing models of turned-on and turned-off states of the transistors. Details of driving operations of the driving circuit will be explained later. Some of the driving operations are described as follows. As shown in FIG. 4, during a period $TP(5)_1$, pre-processing is carried out for a threshold-voltage cancel process to be executed later. That is to say, a first-node initialization transistor control circuit 104 and a second-node initialization transistor control circuit 105, which are shown in FIG. 36, are driven in order to set a first-node initialization transistor control line $AZ_{ND1}$ and a second-node initialization transistor control line $AZ_{ND2}$ respectively at a high level so as to put the first-node initialization transistor $T_{ND1}$ and the second-node initialization transistor $T_{ND2}$ respectively in a turned-on state as shown in FIG. 5B. Thus, an electric potential appearing on the first node $ND_1$ becomes $V_{Ofs}$ which is 0 volts, for example, and an electric potential appearing on the second node $ND_2$ becomes $V_{SS}$ which is -10 volts, for example. As a result, a difference in electric potential between the gate electrode of the element driving transistor $T_{Drv}$ and the other source/drain area of the element driving transistor $T_{Drv}$ becomes at least the threshold voltage $V_{th}$ of the element driving transistor $T_{Drv}$, putting the element driving transistor $T_{Drv}$ in a turned-on state.

Then, during a period $TP(5)_2$ shown in FIG. 4, a threshold-voltage cancel process is carried out. As shown in FIG. 5D, with the turned-on state of the first-node initialization transistor $T_{ND1}$ sustained as it is, at the beginning of the period $TP(5)_2$, a light-emission control transistor control circuit 103 is driven in order to raise a light-emission control transistor control line $CL_{EL\_C}$ to a high level. The light-emission control transistor control line $CL_{EL\_C}$ raised to a high level puts the light-emission control transistor $T_{EL\_C}$ in a turned-on state. As a result, an electric potential appearing on the second node $ND_2$ changes in a direction to an electric potential equal to a difference obtained as a result of subtracting the threshold voltage $V_{th}$ of the element driving transistor $T_{Drv}$ from an electric potential appearing on the first node $ND_1$. That is to say, an electric potential appearing on the second node $ND_2$, which is in a floating state, rises. Then, as the difference in electric potential between the gate electrode of the element driving transistor $T_{Drv}$ and the other source/drain area of the element driving transistor $T_{Drv}$ reaches the threshold voltage $V_{th}$ of the element driving transistor $T_{Drv}$, the element driving transistor $T_{Drv}$ is put in a turned-off state. In this state, the electric potential appearing on the second node $ND_2$ is equal to about a voltage difference of $(V_{Ofs}-V_{th})$. Then, during the next period $TP(5)_3$, with the turned-on state of the first-node initialization transistor $T_{ND1}$ sustained as it is, the light-emission control transistor control circuit 103 is driven in order to pull down the light-emission control transistor control line $CL_{EL\_C}$ to a low level. The light-emission control transistor control line $CL_{EL\_C}$ pulled down to a low level puts the light-emission control transistor $T_{EL\_C}$ in a turned-off state. Subsequently, during the next period $TP(5)_4$, first-node initialization transistor control circuit 104 is driven in order to pull down the first-node initialization transistor control line $AZ_{ND1}$ to a low level. The first-node initialization transistor control line $AZ_{ND1}$ pulled down to a low level puts the first-node initialization transistor $T_{ND1}$ in a turned-off state.

Then, during the next period $TP(5)_5$, as shown in FIG. 4, a signal write operation for the element driving transistor $T_{Drv}$ is carried out. To put it more concretely, as shown in FIG. 6C, with the turned-off states of the first-node initialization transistor $T_{ND1}$, the second-node initialization transistor $T_{ND2}$ and the light-emission control transistor $T_{EL\_C}$ sustained as they are, an electric potential is asserted on the data line DTL to serve as a voltage corresponding to a video signal. This voltage is thus a video signal (also referred to as a driving signal or a luminance signal) $V_{Sig}$ for controlling the luminance of the organic EL light emitting element ELP. Then, the scan line SCL is put at a high level in order to put the video-signal write transistor $T_{Sig}$ in a turned-on state. As a result, an electric potential appearing on the first node $ND_1$ rises to a voltage $V_{Sig}$. An electric charge based on a variation of an electric potential appearing on the first node $ND_1$ is distributed to the capacitance $c_1$ of the capacitor $C_1$, the parasitic capacitance $C_{EL}$ of the organic EL light emitting element ELP as well as a parasitic capacitance $C_{gs}$ between the gate electrode of the element driving transistor $T_{Drv}$ and a source/drain area located on the side close to the organic EL light emitting element ELP to function as the other source/drain area of the element driving transistor $T_{Drv}$. Thus, when an electric potential appearing on the first node $ND_1$ changes, an electric potential appearing on the second node $ND_2$ also changes. However, the larger the parasitic capacitance $C_{EL}$ of the organic EL light emitting element ELP, the smaller the change of the electric potential appearing on the second node $ND_2$. In addition, the parasitic capacitance $C_{EL}$ of the organic EL light emitting element ELP is generally greater than the capacitance $c_1$ of the capacitor $C_1$ and the parasitic capacitance $C_{gs}$ between the gate electrode of the element driving transistor $T_{Drv}$ and a source/drain area located on the side close to the organic EL light emitting element ELP as the source/drain area of the element driving transistor $T_{Drv}$. As described above, the source/drain area located on the side close to the organic EL light emitting element ELP to function as the source/drain area of the element driving transistor $T_{Drv}$ is the aforementioned other source/drain area of the element driving transistor $T_{Drv}$. By assuming that an electric potential appearing on the second node $ND_2$ hardly changes, an electric-voltage difference $V_{gs}$ between the gate electrode of the element driving transistor $T_{Drv}$ and the other source/drain area of the element driving transistor $T_{Drv}$ can be expressed by Eq. (A) given as follows.

$$V_{gs} \approx V_{Sig} - (V_{Ofs} - V_{th}) \qquad (A)$$

Then, during the next period $TP(5)_6$, as shown in FIG. 4, a mobility correction process is carried out in order to raise an electric potential appearing on the other source/drain area of the element driving transistor $T_{Drv}$ in accordance with the characteristics of the element driving transistor $T_{Drv}$. The characteristics of the element driving transistor $T_{Drv}$ include the magnitude of the mobility μ of the element driving transistor $T_{Drv}$. The electric potential appearing on the other source/drain area is an electric potential appearing on the second node $ND_2$. To put it more concretely, as shown in FIG. 6D, with the turned-on state of the element driving transistor $T_{Drv}$ sustained as it is, the light-emission control transistor control circuit 103 is driven in order to put the light-emission control transistor $T_{EL\_C}$ in a turned-on state. Then, after a time period $t_0$ determined in advance has lapsed, the video-signal write transistor $T_{Sig}$ is put in a turned-off state. As a result, if the mobility μ of the element driving transistor $T_{Drv}$ is large, the raise ΔV of an electric potential appearing in the other source/drain area of the element driving transistor $T_{Drv}$ increases. If the mobility μ of the element driving transistor $T_{Drv}$ is small, on the other hand, the raise ΔV of an electric potential appearing in the other source/drain area of the element driving transistor $T_{Drv}$ decreases. In the following description, the raise ΔV of an electric potential appearing in the other source/drain area of the element driving transistor $T_{Drv}$ is also referred to as a voltage correction quantity. In this case, the expression of an electric-voltage difference $V_{gs}$ between the gate electrode of the element driving transistor $T_{Drv}$ and the other source/drain area of the element driving transistor $T_{Drv}$ is changed from Eq. (A) given above to Eq. (B) given below. In addition, it is nice to determine the entire length $t_0$ of the period $TP(5)_6$, which is set in advance as the time it takes to carry out the mobility correction process, as a design value when designing the organic EL display apparatus.

$$V_{gs} \approx V_{Sig} - (V_{Ofs} - V_{th}) - \Delta V \qquad (B)$$

The operations described above complete the threshold-voltage cancel process, the signal write process and the mobility correction process. Then, in the next period $TP(5)_7$ following the period $TP(5)_6$, the video-signal write transistor $T_{Sig}$ is put in a turned-off state. In this state, the first node $ND_1$ is in a floating state as shown in FIG. 6E. As shown in the same figure, the first node $ND_1$ is the gate electrode of the element driving transistor $T_{Drv}$. On the other hand, the light-emission control transistor $T_{EL\_C}$ is sustaining its turned-on state. The source/drain area of the light-emission control transistor $T_{EL\_C}$ on the side opposite to the side close the organic EL light emitting element ELP is connected to the current supply section serving as a section for controlling an operation to drive the organic EL light emitting element ELP to emit light. The current supply section generates a typical voltage $V_{CC}$ of 20 volts, for example. Thus, as a result of the operations carried out in the period $TP(5)_7$, an electric potential appearing on the second node $ND_2$ rises, causing the same phenomenon as that of the so-called bootstrap circuit to occur in the gate electrode of the element driving transistor $T_{Drv}$. Therefore, an electric potential appearing on the first node $ND_1$ also increases. As a result, an electric-voltage difference $V_{gs}$ between the gate electrode of the element driving transistor $T_{Drv}$ and the other source/drain area of the element driving transistor $T_{Drv}$ is kept at a value expressed by Eq. (B). In addition, a current flowing through the organic EL light emitting element ELP is a drain current $I_{ds}$ flowing from the drain of the element driving transistor $T_{Drv}$ to the source of the element driving transistor $T_{Drv}$. Thus, the current flowing through the organic EL light emitting element ELP can be expressed by Eq. (C). The organic EL light emitting element ELP emits light with at a luminance according to the magnitude of the drain current $I_{ds}$.

$$\begin{aligned} I_{ds} &= k * u * (V_{gs} - V_{th})^2 \\ &= k * u * (V_{Sig} - V_{Ofs} - \Delta V)^2 \end{aligned} \qquad (C)$$

The driving and other features of the 5Tr/1C driving circuit having its outline explained so far will also described later in detail.

By the way, in the organic EL device provided with the 5Tr/1C driving circuit shown in FIG. 36, when the organic EL light emitting element ELP is in a light emission state, the transistors connected to the first node $ND_1$ are put in a turned-off state. To put it more concretely, the transistors connected to the first node $ND_1$ are the video-signal write transistor $T_{Sig}$ and the first-node initialization transistor $T_{ND1}$. However, currents flowing through the transistors each put in a turned-off state cannot be ignored completely. A current flowing through a transistor put in a turned-off state is the leak current of the transistor. Thus, the leak currents flowing through the transistors each connected to the first node $ND_1$ cause the amount of electric charge accumulated in the capacitor $C_1$ to vary. The variations of the amount of electric charge accumulated in the capacitor $C_1$ cause an electric potential appearing on the first node $ND_1$ to change and changes of the electric potential appearing on the first node $ND_1$ cause the electric-voltage difference $V_{gs}$ between the gate electrode of the element driving transistor $T_{Drv}$ and the other source/drain area of the element driving transistor $T_{Drv}$ also to vary as well. As shown by Eq. (C) given above, the variations of the electric-voltage difference $V_{gs}$ between the gate electrode of the element driving transistor $T_{Drv}$ and the other source/drain area of the element driving transistor $T_{Drv}$ cause the drain current $I_{ds}$ flowing from the drain of the element driving transistor $T_{Drv}$ to the source of the element driving transistor $T_{Drv}$ to change and variations of the current $I_{ds}$ eventually cause the luminance of the organic EL light emitting element ELP also to change as well. In addition, if the leak current characteristic of each of the transistors connected to the first node $ND_1$ in the organic EL device varies from device to device, the degree to which the luminance of the organic EL light emitting element ELP changes also varies from device to device, causing the uniformity of the luminance of the organic EL light emitting element ELP employed in the organic EL display apparatus to deteriorate. Qualitatively speaking, the smaller the leak current determined at a design stage as the leak current of each of transistors connected to the first node $ND_1$, the narrower the width of a range of variations of the leak current characteristic exhibited by the transistors. Thus, by setting the leak current determined at a design stage as the leak current of each of transistors connected to the first node $ND_1$ at a small value, the uniformity of the luminance of the organic EL display apparatus can be improved.

Thus, in order to reduce luminance changes caused by the leak currents of the transistors connected to the first node $ND_1$ as described above as the changes of the luminance of the organic EL light emitting element ELP, a case in which any one of the transistors is designed into a dual-gate structure is taken into consideration. A dual-gate structure is a structure in which two gate electrodes of respectively two sub-transistors which are connected to each other to form a series circuit are wired to each other on a gate insulation layer and a high-concentration area having a high conductivity is provided between the gate electrodes as a gate common area. FIG. 37 is a diagram showing a typical equivalent circuit of the 5Tr/1C driving circuit in which the video-signal write transistor $T_{Sig}$ is designed into a dual-gate structure as an example. An area A1 is a source/drain area provided on a particular side of the first one of the two sub-transistors, which jointly serve as the video-signal write transistor $T_{Sig}$, to function as the particular source/drain area of the first sub-transistor. An area A2 is a source/drain area provided on the other side of the second one of the two sub-transistors to function as the other source/drain area of the second sub-transistor. An area A3 is a common source/drain area in which a source/drain area provided on the other side of the first sub-transistor to function as the other source/drain area of the first sub-transistor overlaps a source/drain area provided on a particular side of the second sub-transistor to function as the particular source/drain area of the second sub-transistor. In the following description, the common source/drain area is referred to simply as a common area.

Qualitatively speaking, a transistor designed into a dual-gate structure is more capable of suppressing the leak current thereof than a transistor having a single-gate structure. Thus, changes of the luminance of the organic EL light emitting element ELP are suppressed and, on top of that, the width of a range of variations of the leak-current characteristic from device to device can be reduced. As a result, the deterioration of the uniformity of the luminance exhibited by the organic EL display apparatus can be reduced. In the typical 5Tr/1C driving circuit shown in FIG. 37, only the video-signal write transistor $T_{Sig}$ is designed into a dual-gate structure. It is to be noted, however, that in place of the video-signal write transistor $T_{Sig}$, the first-node initialization transistor $T_{ND1}$ can also be designed into a dual-gate structure. As an alternative, each of the video-signal write transistor $T_{Sig}$ and the first-node initialization transistor $T_{ND1}$ can also be designed into a dual-gate structure.

The following description explains a consideration of an electric potential appearing in the common area A3 in a transition of the video-signal write transistor $T_{Sig}$ from a turned-on state to a turned-off state in the 5Tr/1C driving circuit shown in FIG. 37. FIG. 38A is a diagram showing the dual-gate structure of the video-signal write transistor $T_{Sig}$. As shown in the figure, the video-signal write transistor $T_{Sig}$ having the dual-gate structure includes a parasitic capacitance $C_{A1}$ between the area A1 and one of the gate electrode, a parasitic capacitance $C_{A2}$ between the area A2 and the other gate electrode and gate electrode parasitic capacitances $C_{A3}$ between the gate electrodes and the common area A3. FIG. 38B is a diagram showing the 5Tr/1C driving circuit carrying out a signal write process for the element driving transistor $T_{Drv}$. In this figure, a voltage $V_{Sig}$ representing a video signal is an electric potential appearing on a data line DTL. Then, when a scan line SCL is set at a high level such as 10 volts, the video-signal write transistor $T_{Sig}$ is put in a turned-on state. In this state, each of an electric potential appearing in the area A1, an electric potential appearing in the area A2 and an electric potential appearing in the common area A3 is set at the voltage $V_{Sig}$. The electric potential appearing in the area A2 is an electric potential appearing on the first node $ND_1$. Later on, an operation is carried out to set the scan line SCL at a low level such as −10 volts as shown in FIG. 38C in order to put the video-signal write transistor $T_{Sig}$ in a turned-off state.

As described above, the video-signal write transistor $T_{Sig}$ having the dual-gate structure includes a parasitic capacitance $C_{A1}$ between the area A1 and one of the gate electrode, a parasitic capacitance $C_{A2}$ between the area A2 and the other gate electrode and gate electrode parasitic capacitances $C_{A3}$ between the gate electrodes and the common area A3. Thus, when the scan line SCL makes a transition from a high level to a low level, electrostatic coupling due to the parasitic capacitances $C_{A1}$, $C_{A2}$ and $C_{A3}$ makes an attempt to change each of the electric potentials appearing in the areas A1, A2 and A3 to a potential on the minus side. However, the voltage $V_{Sig}$ from the data line DTL is then applied to the area A1. In addition, since the capacitor $C_1$ has an electrostatic capacitance sufficiently greater than the parasitic capacitances $C_{A1}$, $C_{A2}$ and $C_{A3}$, an electric potential appearing in the area A2 is virtually sustained at the voltage $V_{Sig}$. As described earlier, the electric potential appearing in the area A2 is an electric potential appearing on the first node $ND_1$. Thus, when the video-signal write transistor $T_{Sig}$ makes a transition from a turned-on state to a turned-off state, the electric potential appearing in the common area A3 is changed to a potential relatively lower than those appearing in the areas A1 and A2.

As a result, in this state, the common area A3 serves as a source whereas each of the areas A1 and A2 functions as a drain.

It is to be noted that, even in the case in which the first-node initialization transistor $T_{ND1}$ is designed as a transistor having a dual-gate structure, the phenomenon described above occurs. That is to say, even if the first-node initialization transistor $T_{ND1}$ has a dual-gate structure having first and second sub-transistors, when the first-node initialization transistor $T_{ND1}$ makes a transition from a turned-on state to a turned-off state, an electric potential appearing in a common area A3' is changed to a potential relatively lower than those appearing in the areas A1' and A2' where the area A1' is the source/drain area provided on a particular side of the first sub-transistor to serve as the particular source/drain area of the first sub-transistor, the area A2' is the source/drain area provided on the other side of the second sub-transistor to serve as the other source/drain area of the second sub-transistor whereas the common area A3' is an area in which the source/drain area provided on the other side of the first sub-transistor to serve as the other source/drain area of the first sub-transistor overlaps the source/drain area provided on a particular side of the second sub-transistor to serve as the particular source/drain area of the second sub-transistor. In this state, the common area A3' serves as a source whereas the areas A1' and A2' function as the drains of the first and second sub-transistors respectively.

In general, the fact that an electric field applied to a channel creation area of a transistor is affected by a change of an electric potential appearing on an electrode other than the gate electrode of the transistor is not desirable for the operation of the driving circuit employing the transistor. For example, an electric potential appearing on the anode electrode of the organic EL light emitting element ELP varies in accordance with the luminance of an image to be displayed. If the organic EL light emitting element ELP and the driving circuit are provided at locations close to each other, it is quite within the bounds of possibility that variations of the electric potential appearing on the anode electrode of the organic EL light emitting element ELP affect an electric field applied to the channel creation area of a transistor employed in the driving circuit. In this case, for example, by creating a shield electrode connected to the ground as an electrode for covering the channel creation area of the transistor through an insulation layer sandwiched by the electrode and the channel creation area, the effect of variations of the electric potential appearing at such an external electrode on an electric field applied to the channel creation area of the transistor can be reduced. In the case of a transistor having a dual-gate structure, however, if a shield electrode connected to the ground is merely created to cover the channel creation areas A1, A2 and A3 of the transistor, a leak current increases, raising a problem. That is to say, since an electric potential appearing in the area A3 of the transistor connected to the first node $ND_1$ changes to a potential on the minus side when the transistor makes a transition from a turned-on state to a turned-off state, the shield electrode connected to the ground works as if the electrode were a gate electrode, causing the so-called back channel effect. Thus, the leak current increases, losing the effect of creating the transistor connected to the first node $ND_1$ into a dual-gate structure.

In order to solve the problems described above, inventors of the present invention have innovated an organic EL device capable of effectively suppressing a leak current of a transistor connected to a first node $ND_1$ of the organic EL device so as to sustain the effect of creating the transistor into a dual-gate structure and innovated an organic EL display apparatus making use of the organic EL device.

In accordance with a first or second embodiment of the present invention, there is provided an organic EL display apparatus employing:

(1) a scan circuit;

(2) a video-signal outputting circuit;

(3) a total of M×N organic EL devices laid out to form a two-dimensional matrix of N aforementioned organic EL devices arranged in a first direction and M aforementioned organic EL devices arranged in a second direction different from the first direction;

(4) M scan lines each connected to the scan circuit and each stretched in the first direction;

(5) N data lines each connected to the video-signal outputting circuit and each stretched in the second direction; and (6) a current supply section.

The organic EL device employed in the organic EL display apparatus provided in accordance with the first embodiment of the present invention as an apparatus and an organic EL device provided in accordance with the first embodiment of the present invention as a device each employ an organic EL light emitting element and a driving circuit for driving the organic EL light emitting element. In the following description, the organic EL device employed in the organic EL display apparatus according to the first embodiment of the present invention and the organic EL device according to the first embodiment of the present invention are each referred to simply as an organic EL device according to the first embodiment of the present invention. The driving circuit includes:

(A) an element driving transistor;

(B) a video-signal write transistor; and (C) a capacitor having a pair of particular and other electrodes.

With regard to the element driving transistor, (A-1) a source/drain area provided on a particular side of the element driving transistor to serve as a particular source/drain area of the element driving transistor is connected to the current supply section; and (A-2) a source/drain area provided on the other side of the element driving transistor to serve as another source/drain area of the element driving transistor is connected to the anode electrode of the organic EL light emitting element and the particular electrode of the capacitor, forming a second node.

In the following description, a source/drain area provided on a particular side of any transistor to serve as a particular source/drain area of the transistor is also referred to simply as the particular source/drain area of the element driving transistor. By the same token, a source/drain area provided on the other side of the transistor to serve as another source/drain area of the transistor is also referred to simply as the other source/drain area of the element driving transistor. In addition, the capacitor electrode connected to the anode of the organic EL light emitting element is also referred to as the particular electrode of the capacitor whereas the capacitor electrode on the other side of the capacitor is also referred to as the other electrode of the capacitor.

In addition, in the first embodiment of the present invention, there is provided an organic EL device
wherein:
the video-signal write transistor is a transistor with a dual-gate structure including a first sub-transistor having a first channel creation area as well as a first gate electrode and including a second sub-transistor having a second channel creation area as well as a second gate electrode;

a source/drain area provided on a particular side of the first sub-transistor to serve as a particular source/drain area of the first sub-transistor is connected to one of the data lines;

a source/drain area provided on the other side of the second sub-transistor to serve as another source/drain area of the second sub-transistor is connected to the gate electrode of the element driving transistor and the other electrode of the capacitor, forming the first node;

the first gate electrode of the first sub-transistor and the second gate electrode of the second sub-transistor are connected to one of the scan lines;

the first gate electrode of the first sub-transistor faces a particular face of the first channel creation area of the first sub-transistor through a gate insulation layer sandwiched by the first gate electrode and the particular face of the first channel creation area;

the second gate electrode of the second sub-transistor faces a particular face of the second channel creation area of the second sub-transistor through the gate insulation layer sandwiched by the second gate electrode and the particular face of the second channel creation area;

the second sub-transistor has a shield electrode facing the other face of the second channel creation area through a shield insulation layer sandwiched by the shield electrode and the other face of the second channel creation area; and the shield electrode is connected to the other source/drain area of the second sub-transistor.

The organic EL device employed in the organic EL display apparatus provided in accordance with the second embodiment of the present invention as an apparatus and an organic EL device provided in accordance with the second embodiment of the present invention as a device each employ an organic EL light emitting element and a driving circuit for driving the organic EL light emitting element. In the following description, the organic EL device employed in the organic EL display apparatus according to the second embodiment of the present invention and the organic EL device according to the second embodiment of the present invention are each referred to simply as an organic EL device according to the second embodiment of the present invention. The driving circuit includes:

(A) an element driving transistor;
(B) a video-signal write transistor;
(C) a capacitor having a pair of particular and other electrodes; and
(D) a first-node initialization transistor.

With regard to the element driving transistor, (A-1) a source/drain area provided on a particular side of the element driving transistor to serve as a particular source/drain area of the element driving transistor is connected to the current supply section; and (A-2) a source/drain area provided on the other side of the element driving transistor to serve as another source/drain area of the element driving transistor is connected to the anode electrode of the organic EL light emitting element and the particular electrode of the capacitor, forming a second node;

With regard to the video-signal write transistor, (B-1) a source/drain area provided on a particular side of the video-signal write transistor to serve as a particular source/drain area of the video-signal write transistor is connected to one of the data lines;

(B-2) a source/drain area provided on the other side of the video-signal write transistor to serve as another source/drain area of the video-signal write transistor is connected to the gate electrode of the element driving transistor and the other electrode of the capacitor, forming the first node; and (B-3) the gate electrode of the video-signal write transistor is connected to one of the scan lines.

In addition, in the second embodiment of the present invention, there is provided an organic EL device wherein:

the first-node initialization transistor is a transistor with a dual-gate structure including a first sub-transistor having a first channel creation area as well as a first gate electrode and including a second sub-transistor having a second channel creation area as well as a second gate electrode;

a source/drain area provided on a particular side of the first sub-transistor to serve as a particular source/drain area of the first sub-transistor is connected to a first-node initialization voltage supply line;

a source/drain area provided on the other side of the second sub-transistor to serve as another source/drain area of the second sub-transistor is connected to the first node;

the first gate electrode of the first sub-transistor and the second gate electrode of the second sub-transistor are connected to a first-node transistor control line;

the first gate electrode of the first sub-transistor faces a particular face of the first channel creation area of the first sub-transistor through a gate insulation layer sandwiched by the first gate electrode and the particular face of the first channel creation area;

the second gate electrode of the second sub-transistor faces a particular face of the second channel creation area of the second sub-transistor through the gate insulation layer sandwiched by the second gate electrode and the particular face of the second channel creation area;

the second sub-transistor has a shield electrode facing the other face of the second channel creation area through a shield insulation layer sandwiched by the shield electrode and the other face of the second channel creation area; and the shield electrode is connected to the other source/drain area of the second sub-transistor.

It is to be noted that, in the organic EL device provided in accordance with the second embodiment of the present invention as a device having the preferred configuration described above, the video-signal write transistor, for example, can have a single-gate structure or a dual-gate structure. If the video-signal write transistor is a transistor having a dual-gate structure, the video-signal write transistor can be configured into one of a plurality of configurations including the preferred embodiments each implementing the organic EL device according to the first embodiment of the present invention as described earlier. Concrete configurations obtained by adding shield electrodes to the first-node initialization transistor and the video-signal write transistor in a variety of ways are explained below by referring to a table. In particular, the first combination on the top row of the table offers a merit that this combination is capable of reducing the magnitudes of leak currents of both the first-node initialization transistor and the video-signal write transistor while suppressing the number of shield electrodes provided in the organic EL device. In the table, "○" denotes "Exists", and "x" denotes "Does not Exist."

|   | First-node initialization transistor | | | | Video-signal write transistor | | | |
|---|---|---|---|---|---|---|---|---|
|   | (First) shield electrode | Second shield electrode | Third shield electrode | Fourth shield electrode | (First) shield electrode | Second shield electrode | Third shield electrode | Fourth shield electrode |
| 1  | O | X | X | X | O | X | X | X |
| 2  | O | X | X | X | O | O | X | X |
| 3  | O | X | X | X | O | X | O | X |
| 4  | O | X | X | X | O | O | O | O |
| 5  | O | O | X | X | O | X | X | X |
| 6  | O | O | X | X | O | O | X | X |
| 7  | O | O | X | X | O | X | O | X |
| 8  | O | O | X | X | O | O | O | O |
| 9  | O | X | O | X | O | X | X | X |
| 10 | O | X | O | X | O | O | X | X |
| 11 | O | X | O | X | O | X | O | X |
| 12 | O | X | O | X | O | O | O | O |
| 13 | O | O | O | O | O | X | X | X |
| 14 | O | O | O | O | O | O | X | X |
| 15 | O | O | O | O | O | X | O | X |
| 16 | O | O | O | O | O | O | O | O |

In the organic EL display apparatus provided in accordance with the first or second embodiment of the present invention as an apparatus having a plurality of configurations including the preferred embodiments described above or in the organic EL device according to the first or second embodiment, a variety of circuits such as the scan circuit and the video-signal outputting circuit, a variety of lines including the scan and data lines, the current supply section and the organic EL light emitting element ELP can each be designed into a configuration and/or a structure which are already generally known. To put it more concretely, for example, the organic EL light emitting element can be designed into a configuration including, for example, an anode electrode, a hole transport layer, a light emitting layer, an electron transport layer and a cathode electrode. In the following description, the organic EL display apparatus provided in accordance with the first or second embodiment of the present invention and the organic EL device according to the first or second embodiment are also referred to simply as the present invention whereas the organic EL light emitting element is also referred to simply as a light emitting element.

It is also possible to provide a configuration in which, in addition to the element driving transistor and the video-signal write transistor, the driving circuit employed in the organic EL device according to the first embodiment of the present invention employs other transistors. By the same token, it is also possible to provide a configuration in which, in addition to the element driving transistor, the video-signal write transistor and the first-node initialization transistor, the driving circuit employed in the organic EL device according to the second embodiment of the present invention employs other transistors. For example, it is possible to provide each of the organic EL devices according to the first and second embodiments of the present invention with a configuration in which a second-node initialization transistor is further provided in each of the driving circuits as a transistor including source/drain areas each serving as a source or a drain, a channel creation area and a gate electrode. In this second-node initialization transistor, the source/drain area provided on a particular side of the second-node initialization transistor to serve as a particular source/drain area of the second-node initialization transistor is connected to a second-node initialization voltage supply line, the source/drain area provided on the other side of the second-node initialization transistor to serve as another source/drain area of the transistor is connected to the second node whereas the gate electrode is connected to a second-node initialization transistor control line. As an alternative, it is possible to provide each of the organic EL devices according to the first and second embodiments of the present invention with a configuration in which a light-emission control transistor is further provided in each of the driving circuits as a transistor including source/drain areas each serving as a source or a drain, a channel creation area and a gate electrode. In this alternative configuration, the source/drain area provided on a particular side of the element driving transistor to serve as a particular source/drain area of the element driving transistor is connected to the current supply section through the light-emission control transistor whereas the gate electrode of the light-emission control transistor is connected to a light-emission control transistor control line. In addition, it is also possible to provide a configuration in which the driving circuit employed in the organic EL device according to the first embodiment of the present invention employs a first-node initialization transistor. In this configuration, the first-node initialization transistor can have a single-gate structure or a dual-gate structure.

In general, it is possible to provide a configuration in which the driving circuit employed in the organic EL device according to the first embodiment of the present invention is a driving circuit employing, for example, five transistors and one capacitor, four transistors and one capacitor, three transistors and one capacitor or two transistors and one capacitor in place of the configuration including only two transistors and one capacitor as described previously. By the same token, it is possible to provide a configuration in which the driving circuit employed in the organic EL device according to the second embodiment of the present invention is a driving circuit employing, for example, five transistors and one capacitor, four transistors and one capacitor or three transistors and one capacitor in place of the configuration including only three transistors and one capacitor as described previously.

Each of the transistors employed in the driving circuit is, for example, a TFT (Thin Film Transistor) of an n-channel type. In some typical driving circuits, however, the light-emission control transistor can be a TFT (Thin Film Transistor) of a p-channel type. It is possible to provide a configuration in which the capacitor has an electrode on a particular side, another electrode on the other side as well as a dielectric layer sandwiched by the electrode on the particular side and the electrode on the other side. The particular and other electrodes mentioned so far are respectively the electrodes on the particular and other sides of the capacitor. The transistors and the capacitor, which are employed in the driving circuit, are created on a certain plain such as a support body. On the other hand, the organic EL light emitting element is created over the transistors and the capacitor, which are employed in the driving circuit, being separated from the transistors and the capacitor by an inter-layer insulation layer sandwiched by the organic EL light emitting element on one side and the transistors as well as the capacitor on the other side. A source/drain area provided on the other side of the element driving transistor to serve as the other source/drain area of the element driving transistor is connected to the anode electrode of the organic EL light emitting element through a contact hole, for example. In addition, it is also possible to provide a configuration in which the transistors are created on a semiconductor substrate or the like.

In the organic EL device according to the first embodiment of the present invention, the second sub-transistor of the video-signal write transistor employed in driving circuit of the organic EL device as a transistor with a dual-gate structure has a shield electrode facing the other face of the second channel creation area of the second sub-transistor through a shield insulation layer sandwiched by the shield electrode and the other face of the second channel creation area. The shield electrode is connected to the source/drain area provided on the other side of the second sub-transistor to serve as the other source/drain area of the second sub-transistor and as the first node. As described above, when the video-signal write transistor makes a transition from a turned-on state to a turned-off state, the common area becomes the source of the second sub-transistor whereas the other source/drain area of the second sub-transistor becomes the drain of the second sub-transistor. The shield electrode covers the drain-area side of the second channel creation area and, in this state, the electric potential appearing on the shield electrode is higher than an electric potential appearing in the common area. Thus, the shield electrode attracts electrons serving as carriers on the second channel creation area. As a result, a depletion layer is generated on the common-area side of the second channel creation area so that the magnitude of a leak current flowing between the second channel creation area and the common area decreases. The shape of the shield electrode can be properly set in accordance with the design specifications of the organic EL device. It is to be noted that the shapes of the second to fourth shield electrodes employed in the organic EL device according to the first embodiment of the present invention can also be properly set in accordance with the design specifications of the organic EL device.

In the organic EL device according to the second embodiment of the present invention, the second sub-transistor of the first-node initialization transistor employed in the driving circuit of the organic EL device as a transistor with a dual-gate structure has a shield electrode facing the other face of the second channel creation area of the second sub-transistor through a shield insulation layer sandwiched by the shield electrode and the other face of the second channel creation area. As described earlier, a source/drain area provided on the other side of the first-node initialization transistor to serve as the other source/drain area of the first-node initialization transistor is connected to the first node, virtually forming the first node. The shield electrode is virtually connected to the first node, which is the source/drain area provided on the other side of the second sub-transistor to serve as the other source/drain area of the second sub-transistor. Also when the first-node initialization transistor makes a transition from a turned-on state to a turned-off state, a phenomenon occurs. This phenomenon is the same as the phenomenon described above as the phenomenon of the video-signal write transistor of the organic EL device according to the first embodiment of the present invention. As a result, a depletion layer is generated on the common-area side of the second channel creation area so that the magnitude of a leak current between the second channel creation area and the common area decreases. The shape of the shield electrode can be properly set in accordance with the design specifications of the organic EL device. It is to be noted that the shapes of the second to fourth shield electrodes employed in the organic EL device according to the second embodiment of the present invention can also be properly set in accordance with the design specifications of the organic EL device.

The organic electro luminescence display apparatus also referred to hereafter simply as an organic EL display apparatus employs, for example, (N/3)×M pixels arranged to form a two-dimensional (N/3)–column×M-row matrix. Each of the pixels is composed of, for example, three sub-pixels which are a red light emitting sub-pixel for generating red-color light, a green light emitting sub-pixel for generating green-color light and a blue light emitting sub-pixel for generating blue-color light. Thus, each column of pixels consists of three columns of sub-pixels. That is to say, the number of pixel columns in the matrix is N/3 whereas the number of sub-pixel columns in the matrix is N. Each of the sub-pixels is the organic EL device described so far. However, implementations of the organic EL display apparatus are by no means limited to this configuration. For example, the organic EL display apparatus can also be configured to function as the so-called monochrome display apparatus.

The organic EL devices each serving as a sub-pixel as described above is driven by, for example, adoption of a line-to-line sequential technique. As described earlier, the organic electro luminescence device is also referred to simply as an organic EL device. In this case, the display frame rate is set at FR (times per second). In accordance with this line-to-line sequential technique, N/3 pixels or N sub-pixels arranged on an mth row, where m=1, 2, 3 . . . or M and notation M denotes the number of rows in the matrix, can be driven at the same time. To put it more concretely, the organic EL devices each serving as a sub-pixel are driven simultaneously. In other words, the timing to drive organic EL devices arranged on the same row is controlled by handling the organic EL devices as one unit or the timings to drive all drive organic EL devices are controlled in row units. It is to be noted, however, that methods to drive organic EL devices are by no means limited to this line-to-line sequential technique.

It is also worth noting that a process to write video signals into pixels arranged on a row in processing based on the line-to-line sequential technique can be a process to write video signals into all pixels at the same time or a process to sequentially write a video signal into each of individual pixels. In the following description, the process to write video signals into all pixels at the same time may also be referred to simply as a simultaneous signal write process whereas the process to sequentially write a video signal into each of individual pixels may also be referred to simply as a sequential signal write process. The simultaneous or sequential signal write process is properly selected in accordance with the configuration of the driving circuit.

As a rule, the following description explains the process to drive an organic EL device provided at the intersection of an mth row and an nth column where n=1, 2, 3 . . . or N whereas notation N denotes the number of sub-pixel columns in the matrix. In the following description, an organic EL device provided at the intersection of an mth row and an nth column is an (n, m)th organic EL device or an (n, m)th sub-pixel. Prior to the end of a horizontal scan period to scan organic EL devices arranged on an mth row, a variety of processes such as a threshold-voltage cancel process, a signal write process and a mobility correction process, which are to be described later, are completed. In the following description, the horizontal scan period to scan organic EL devices arranged on an mth row is referred to as an mth horizontal scan period. It is to be noted that the signal write process and the mobility correction process need to be carried out within the mth horizontal scan period. Depending on the type of the driving circuit, on the other hand, the threshold-voltage cancel process and pre-processing accompanying the threshold-voltage cancel process can be carried out prior to the mth horizontal scan period.

Then, after the various processes described above have all been completed, the organic EL light emitting element employed in each of the organic EL devices arranged on an mth row is driven to emit light. It is to be noted that, after the various processes described above have all been completed, the organic EL light emitting element employed in each of the organic EL devices arranged on an mth row can be driven to emit light immediately or the organic EL light emitting element employed in each of the organic EL devices arranged on an mth row can be driven to emit light upon the lapse of a predetermined period of time. For example, the predetermined period of time is a horizontal scan period to scan a predetermined number of rows. The predetermined period of time can be set at a proper value in accordance with the design specifications of the organic EL display apparatus and/or the configuration of the driving circuit employed in each organic EL device of the organic EL display apparatus. It is to be noted that, in the following description, in order to make the explanation simple, after the various processes described above have all been completed, the organic EL light emitting element employed in each of the organic EL devices arranged on an mth row is assumed to be driven to emit light immediately. Then, it is assumed that the light emission of the organic EL light emitting element employed in each of the organic EL devices arranged on an mth row continues to a point of time immediately before the start of a horizontal scan period to scan organic EL devices arranged on an (m+m')th row where notation m' denotes an integer determined in accordance with the design specifications of the organic EL display apparatus. That is to say, it is assumed that the light emission of the organic EL light emitting element employed in each of the organic EL devices arranged on an mth row on a certain display frame continues to a horizontal scan period to scan organic EL devices arranged on an (m+m'−1)th row on the same display frame. From the horizontal scan period to scan organic EL devices arranged on the (m+m')th row on the certain display frame to the completions of the signal write process and the mobility correction process in the horizontal scan period to scan organic EL devices arranged on the mth row on the next display frame, on the other hand, as a rule, the organic EL light emitting element employed in each of the organic EL devices arranged on the mth row sustains a state of emitting no light. In the following description, the period of the state of emitting no light is also referred to simply as a no-light emission period. By providing such a no-light emission period, the degree of residual-image fading caused by an active matrix driving technique can be lowered and the quality of the moving image can be made more excellent. It is to be noted, however, that the light emission and no-light emission states of each organic EL device serving as a sub-pixel are by no means limited to the states sustained during the periods described above. In addition, the length of the horizontal scan period is smaller than (1/FR)×(1/M) seconds. Thus, if the value of (m+m') exceeds M, an excessive part of the horizontal scan period is processed in the next display frame.

With regard to two source/drain areas of a transistor, a phrase stating: "a source/drain area provided on a particular side of the transistor to serve as the particular source/drain area of the transistor" may be used in some cases to imply the source/drain area connected to a power supply section. In addition, a phrase stating that a transistor is put in a turned-on state is used to mean a state in which a channel has been created in a channel creation area between the source and drain of the transistor. No attempt is made to set up any distinction as to whether a current is flowing from a source/drain area provided on a particular side of a transistor to serve as the particular source/drain area of the transistor to a source/drain area provided on the other side of the transistor to serve as the other source/drain area of the transistor or vice versa in a turned-on state of the transistor. On the other hand, a phrase stating that a transistor is put in a turned-off state is used to mean a state in which no channel has been created in a channel creation area between the source and drain of the transistor. In addition, a phrase stating that the particular source/drain area of a specific transistor is connected to the other source/drain area of another transistor is used to imply that the particular source/drain area of the specific transistor occupies the same area as the other source/drain area of the other transistor. In the following description, this same area is referred to as a common source/drain area or simply a common area. Furthermore, it is possible to make a source/drain area as well as a common area not only from a conductive material such as polysilicon or amorphous silicon, but also from a metal, an alloy, a structure of stacked layers of the metal and the alloy or an organic material (or a conductive polymer). In this case, the polysilicon or the amorphous silicon includes impurities. In addition, in timing charts used in the following description, a length quantity on the horizontal axis representing the lapse of time is merely a model. That is to say, the length of a lapse of time along the horizontal axis is not an absolute values and should thus be interpreted as a relative value.

As described above, in the organic EL device according to the first embodiment of the present invention, the second sub-transistor of the video-signal write transistor employed in the driving circuit of the organic EL device as a transistor with a dual-gate structure has a shield electrode facing the other face of the second channel creation area of the second sub-transistor through a shield insulation layer sandwiched by the shield electrode and the other face of the second channel creation area. The shield electrode is connected to the first node, which is a source/drain area provided on the other side of the second sub-transistor to serve as the other source/drain area of the second sub-transistor. Also as explained previously, when the video-signal write transistor makes a transition from a turned-on state to a turned-off state, a depletion layer is generated on the common-area side of the second channel creation area so that the magnitude of a leak current between the second channel creation area and the common area decreases. Thus, electric-potential variations appearing on the first node as the variations of the amount of electric charge accumulated in the capacitor can be effectively suppressed. As a result, it is possible to improve the uniformity of the luminance of the organic EL display apparatus.

In addition, also as described above, in the organic EL device according to the second embodiment of the present invention, the second sub-transistor of the first-node initialization transistor employed in the driving circuit of the organic EL device as a transistor with a dual-gate structure has a shield electrode facing the other face of the second channel creation area of the second sub-transistor through a shield insulation layer sandwiched by the shield electrode and the other face of the second channel creation area. The shield electrode is virtually connected to the first node, which is a source/drain area provided on the other side of the second sub-transistor to serve as the other source/drain area of the second sub-transistor. Also as explained previously, when the first-node initialization transistor makes a transition from a turned-on state to a turned-off state, a depletion layer is generated on the common-area side of the second channel creation area so that the magnitude of a leak current between the second channel creation area and the common area decreases. Thus, electric-potential variations appearing on the first node as the variations of the amount of electric charge accumulated in the capacitor can be effectively suppressed. As a result, it is possible to improve the uniformity of the luminance of the organic EL display apparatus.

Figure 7A:
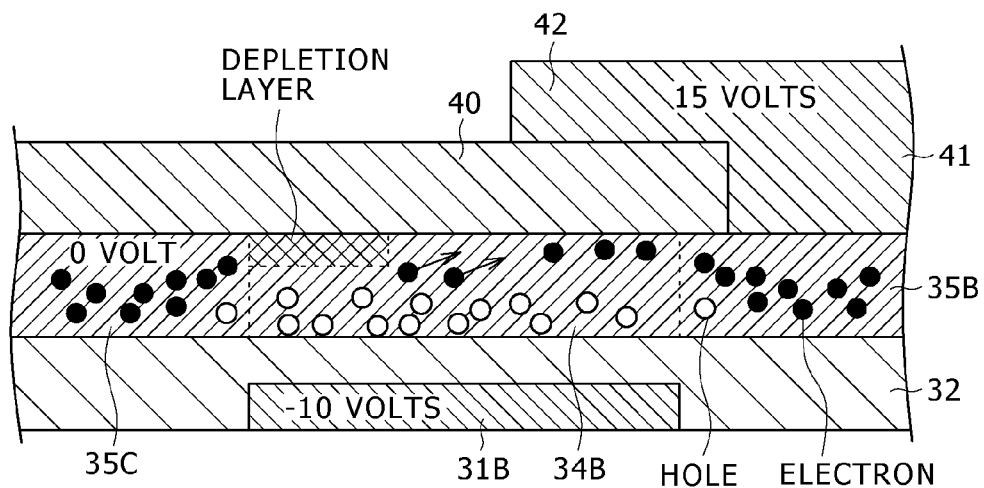
Figure 7B:
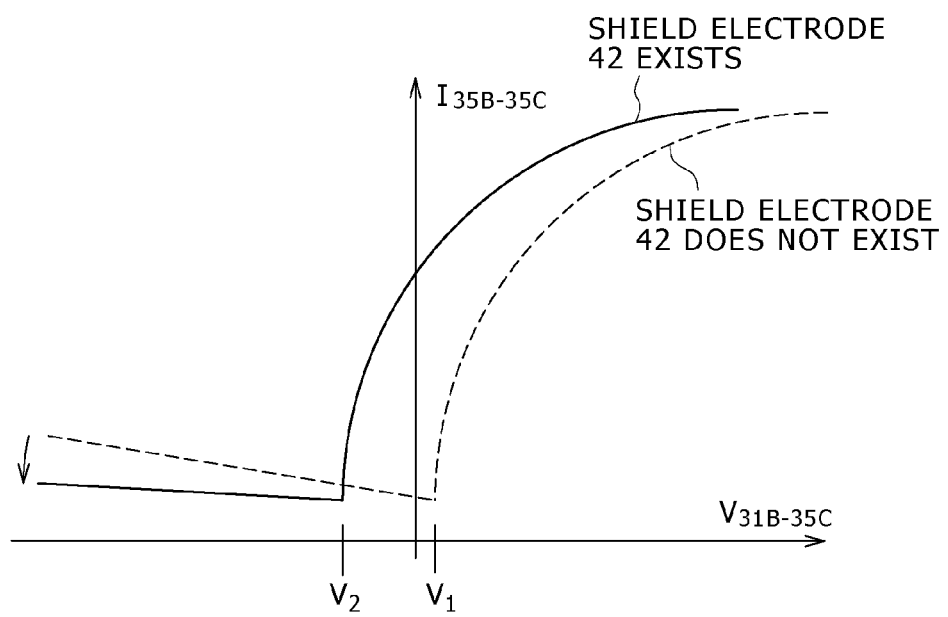
Figure 8:
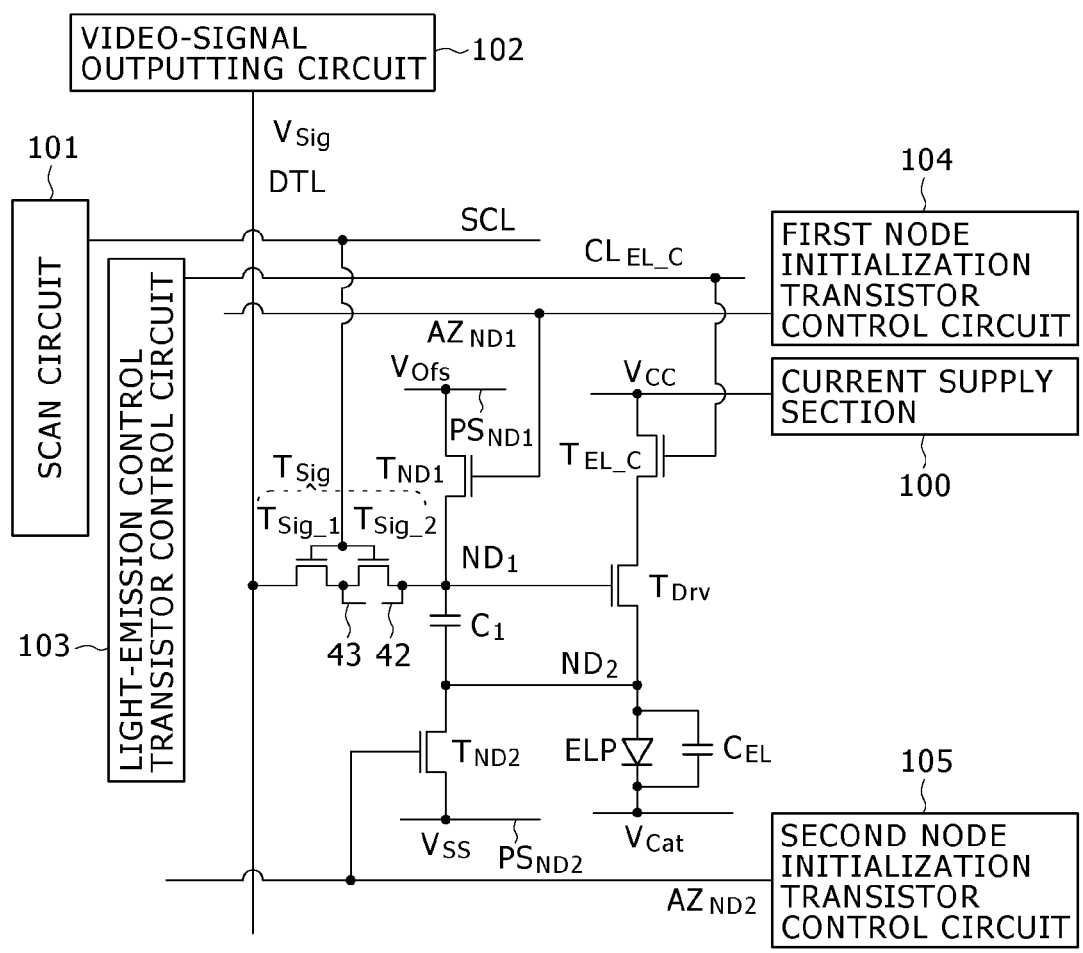
Figure 9A:
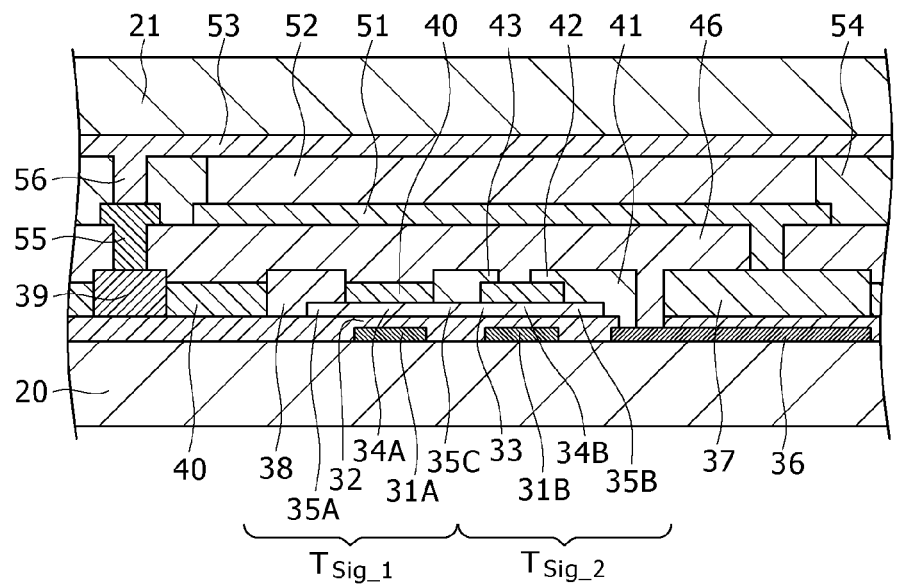
Figure 9B:
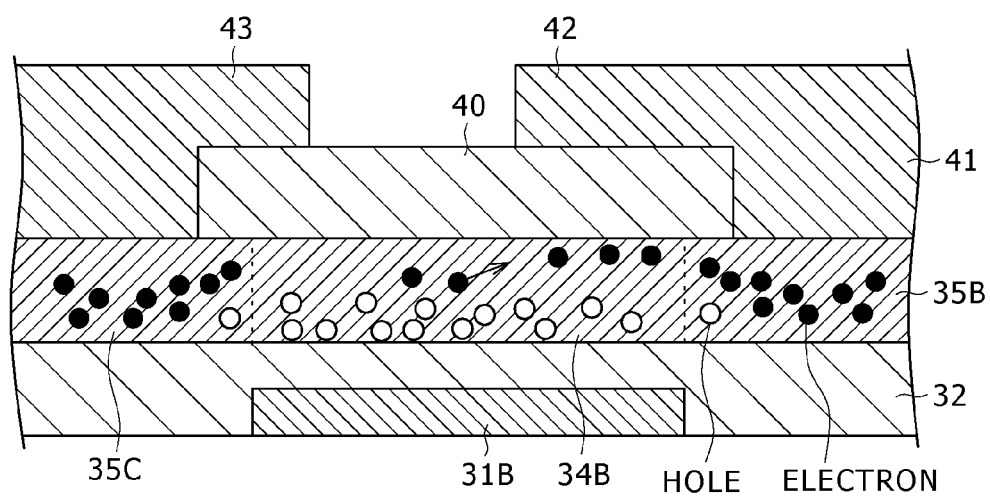
Figure 10A:
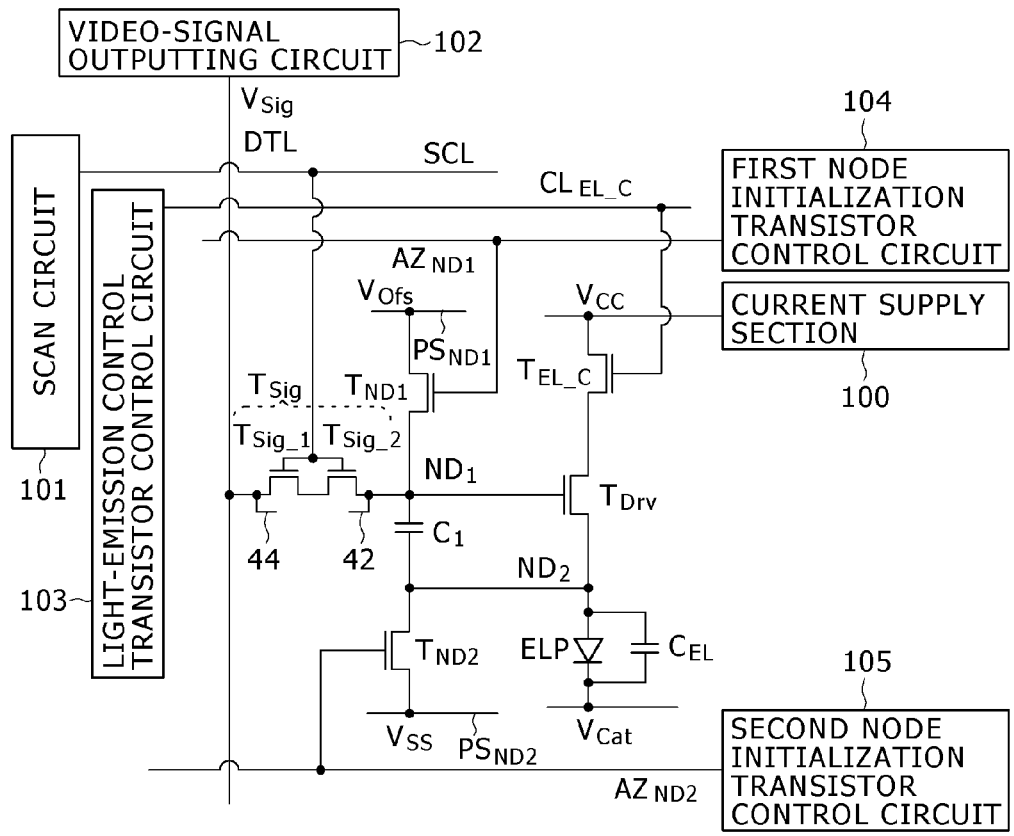
Figure 10B:
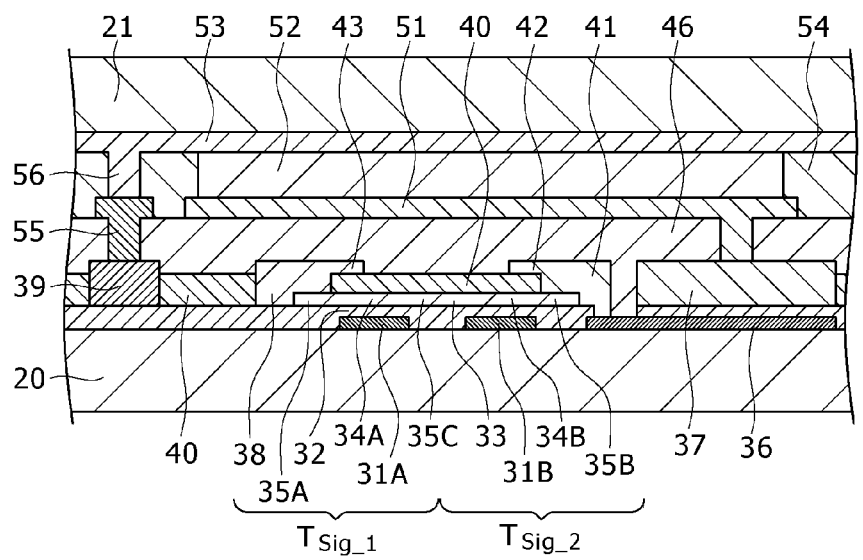
Figure 11A:
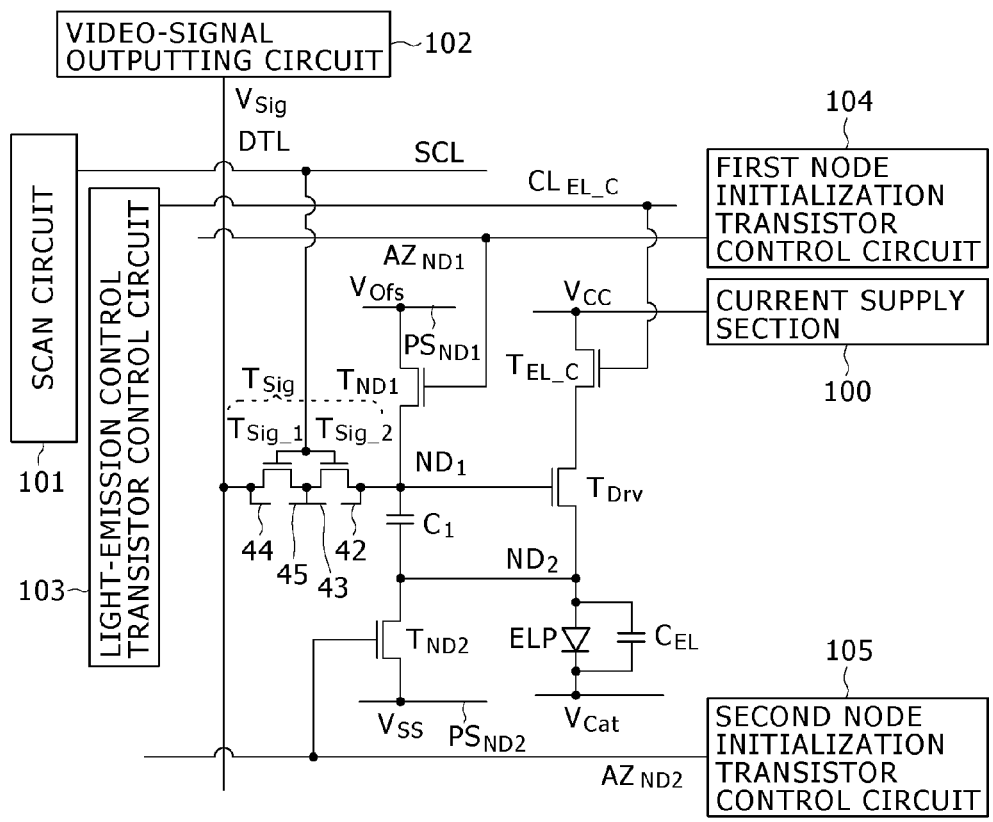
Figure 11B:
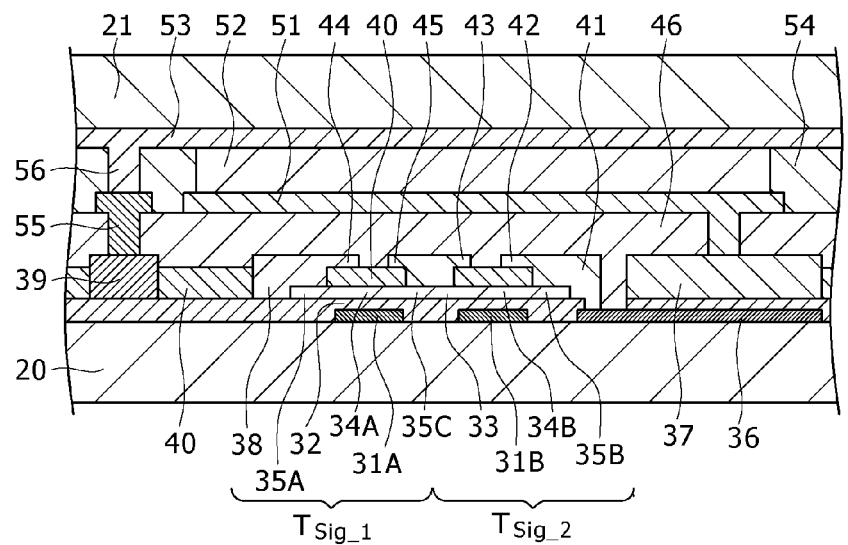
Figure 12A:
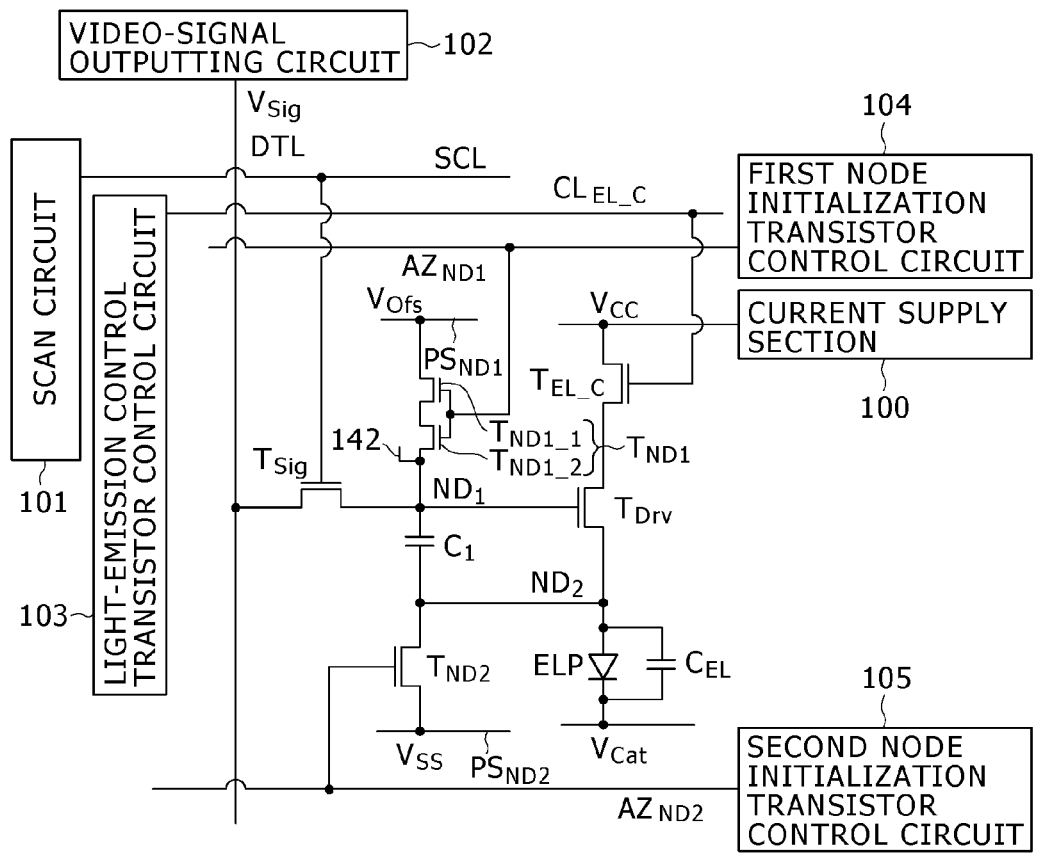
Figure 12B:
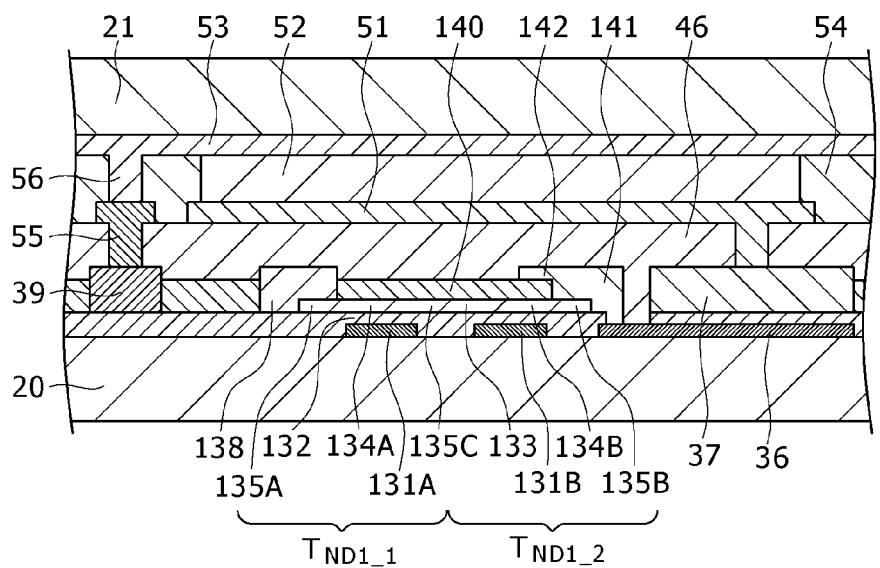
Figure 13A:
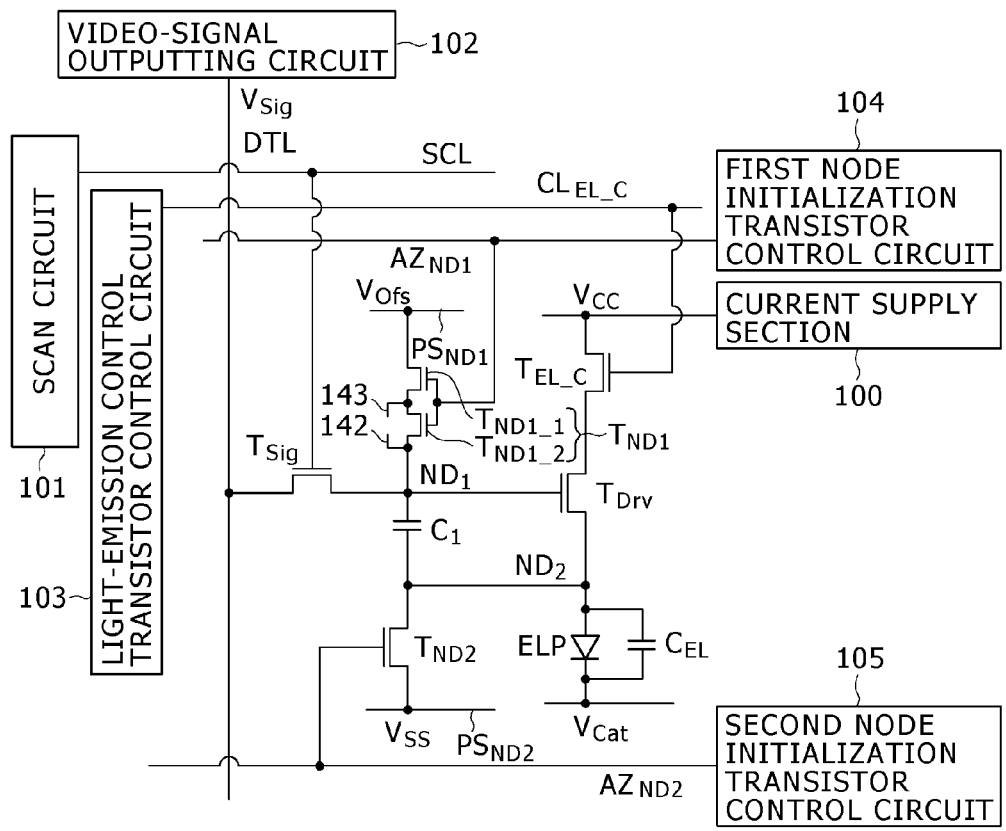
Figure 13B:
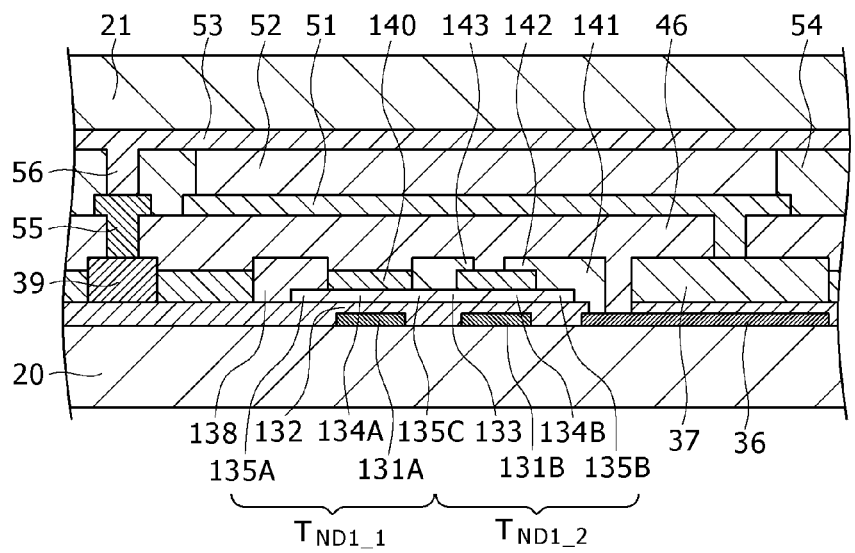
Figure 14A:
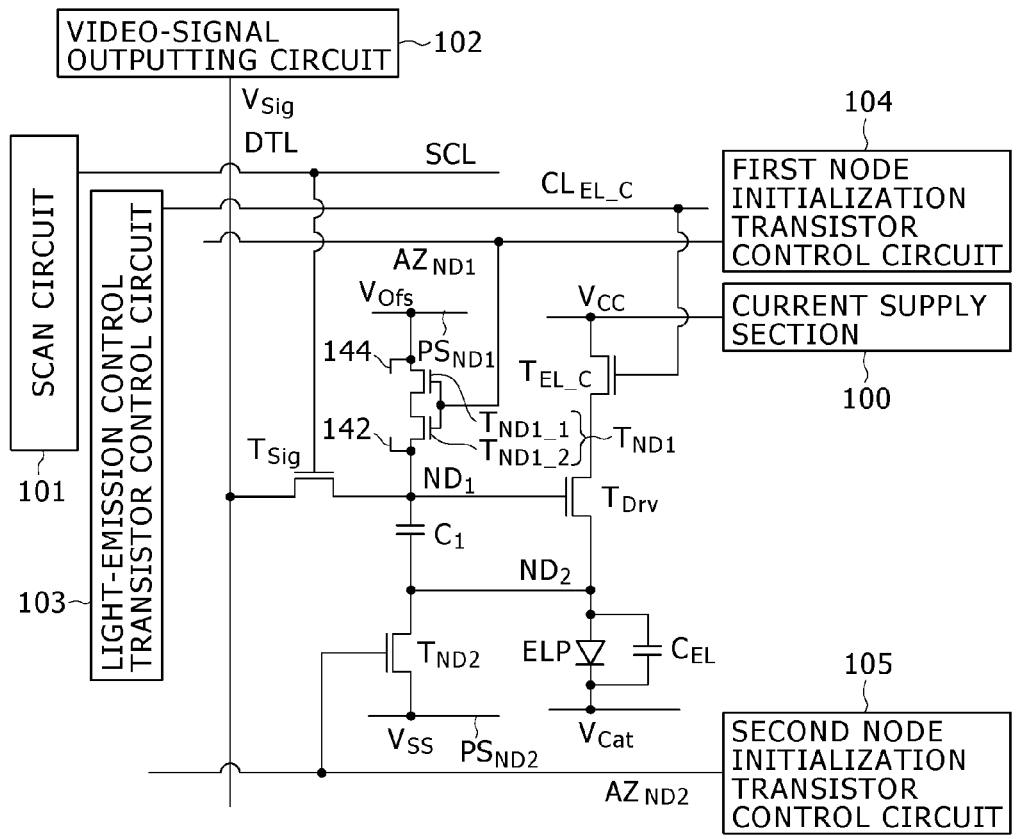
Figure 14B:
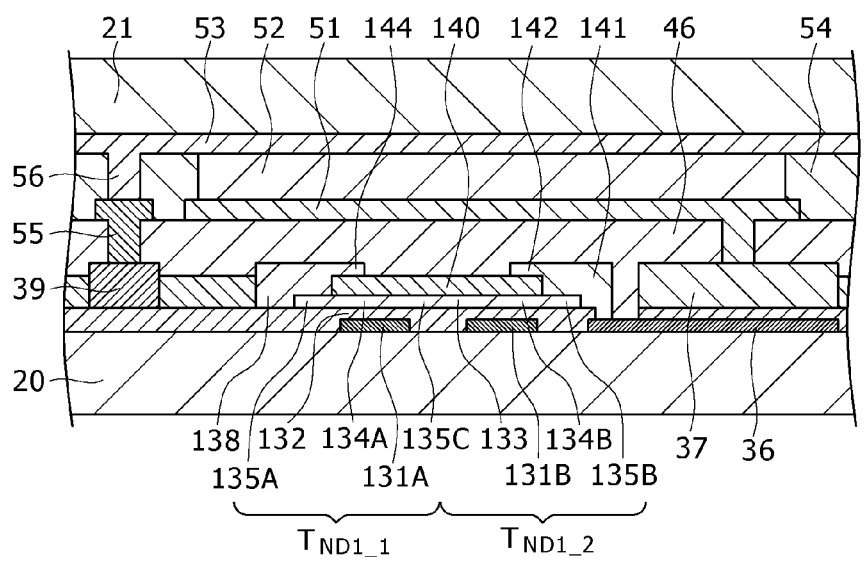
Figure 15A:
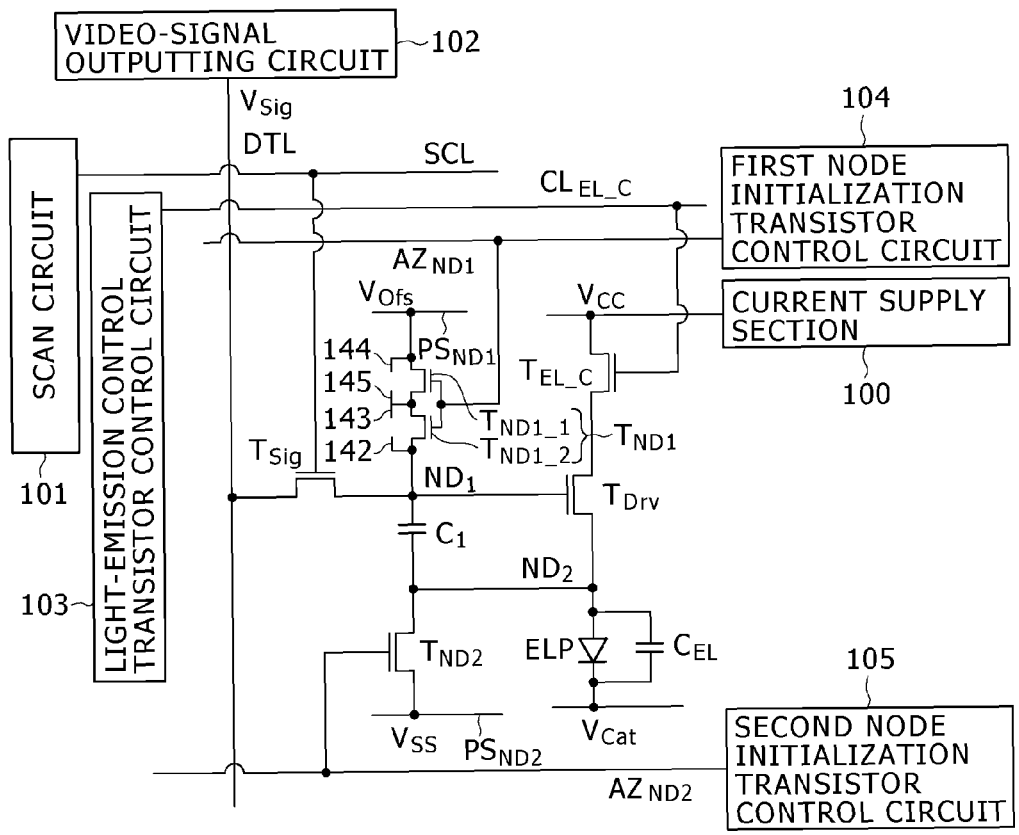
Figure 15B:
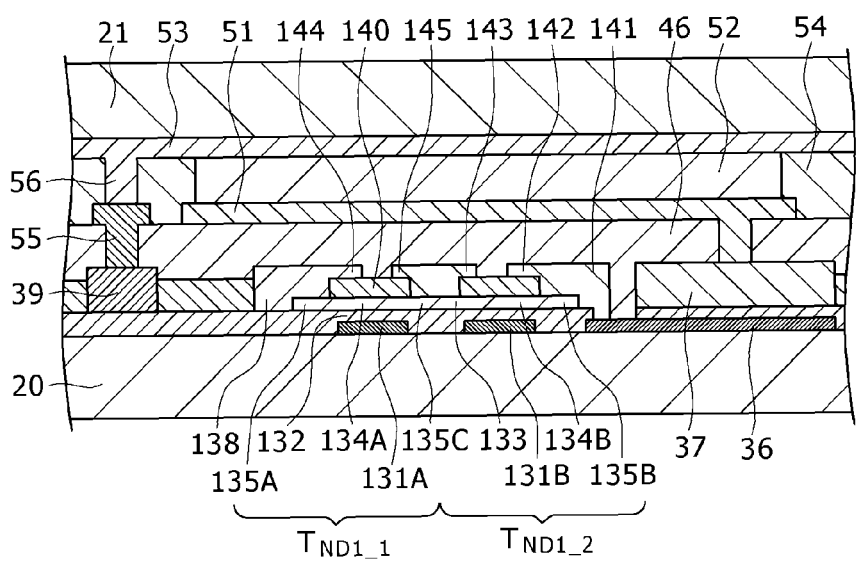
Figure 16:
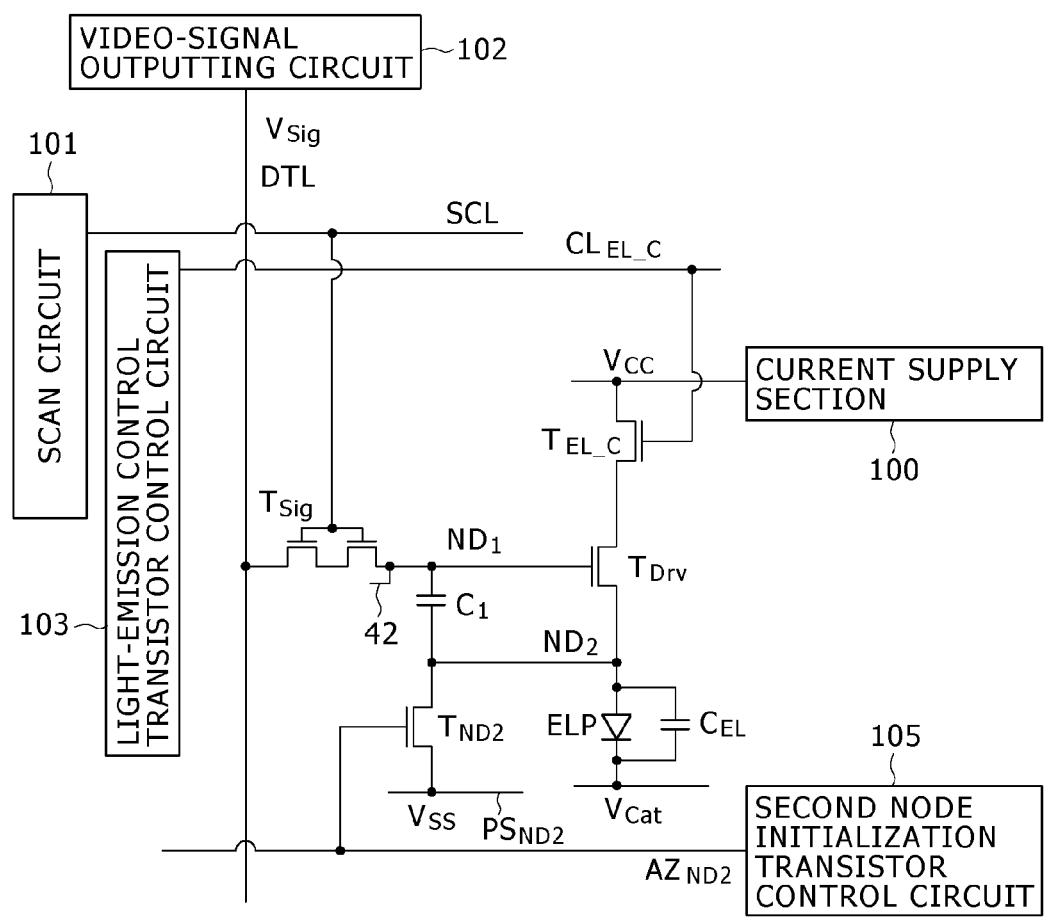
Figure 17:
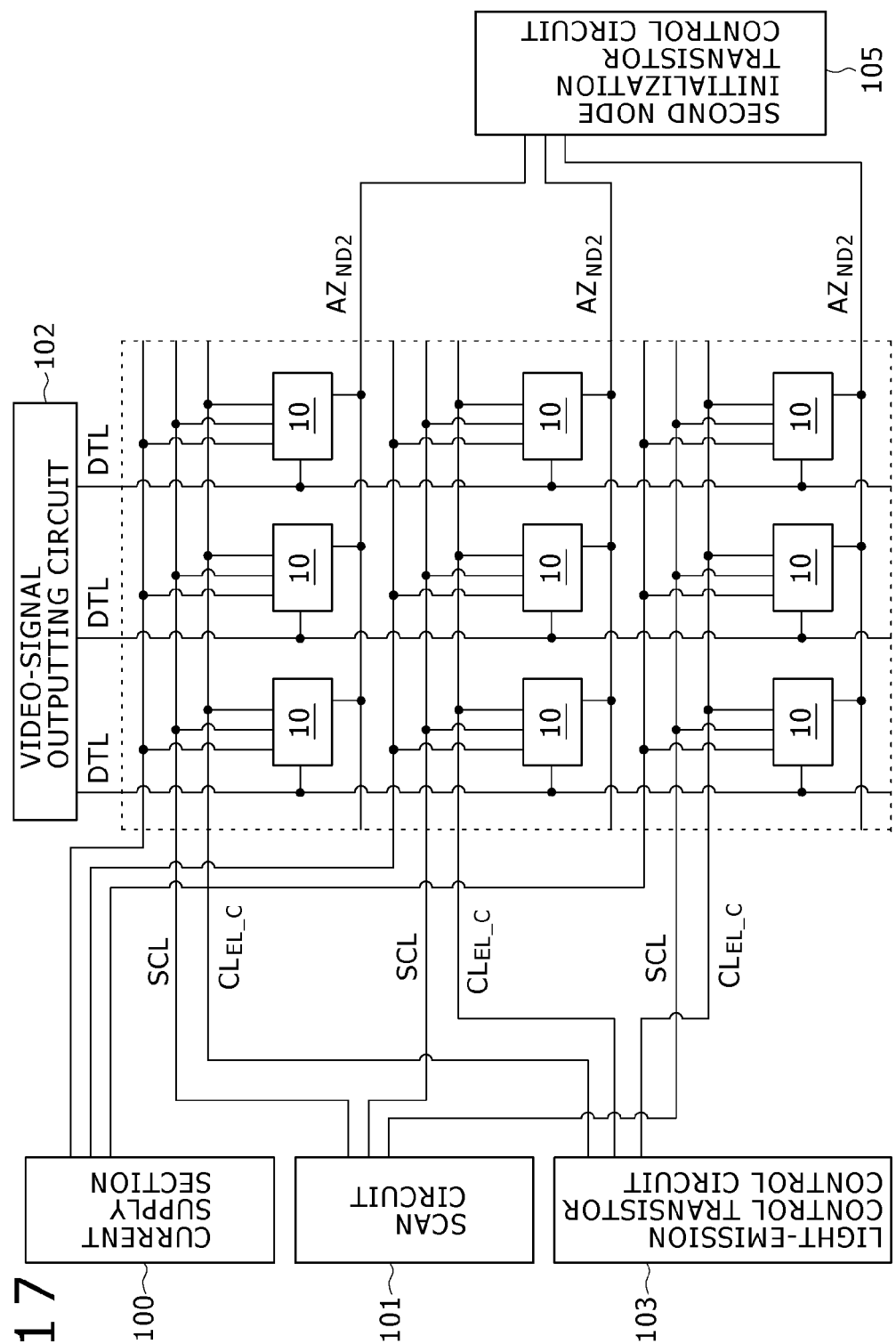
Figure 18:
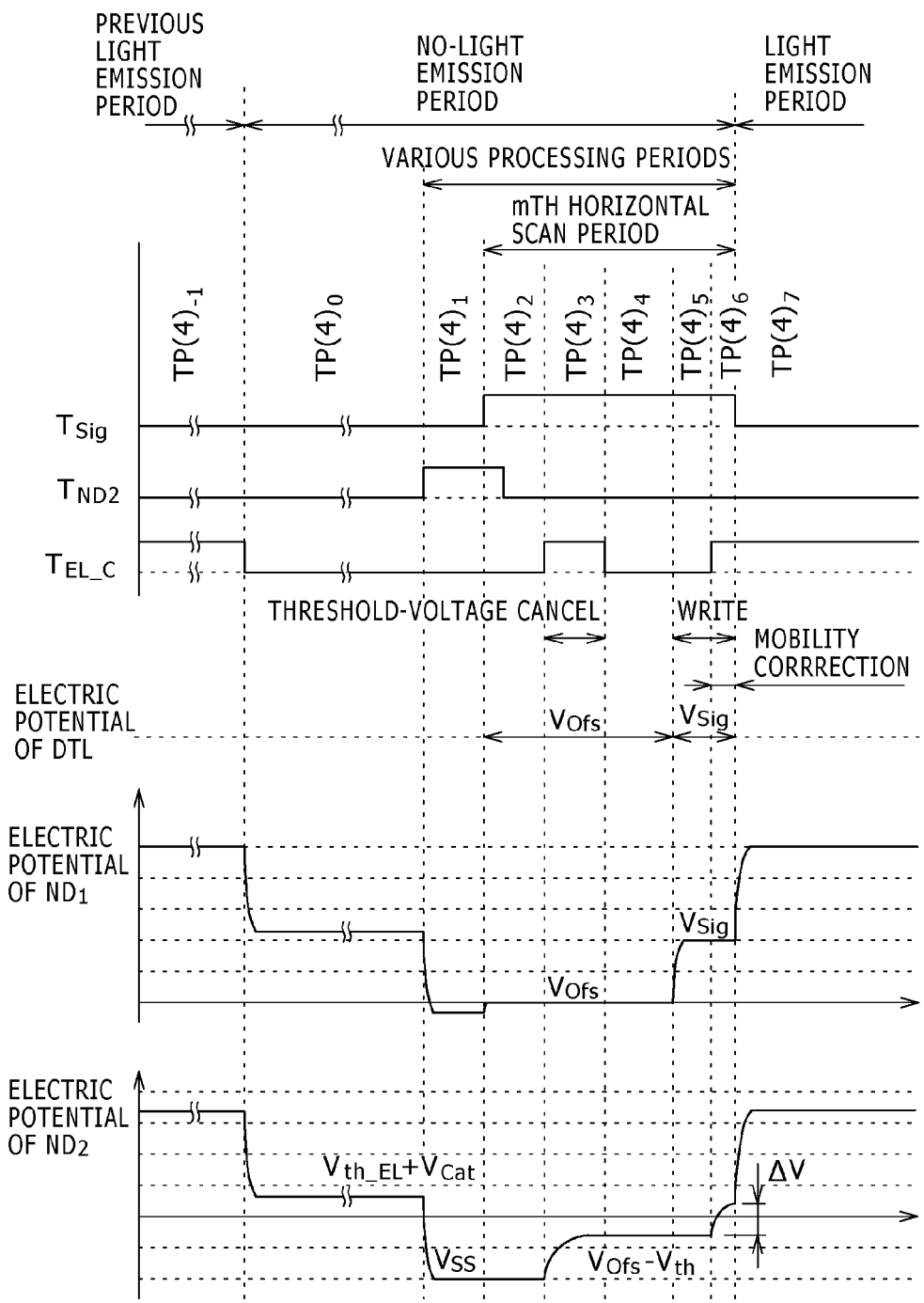
Figure 21:
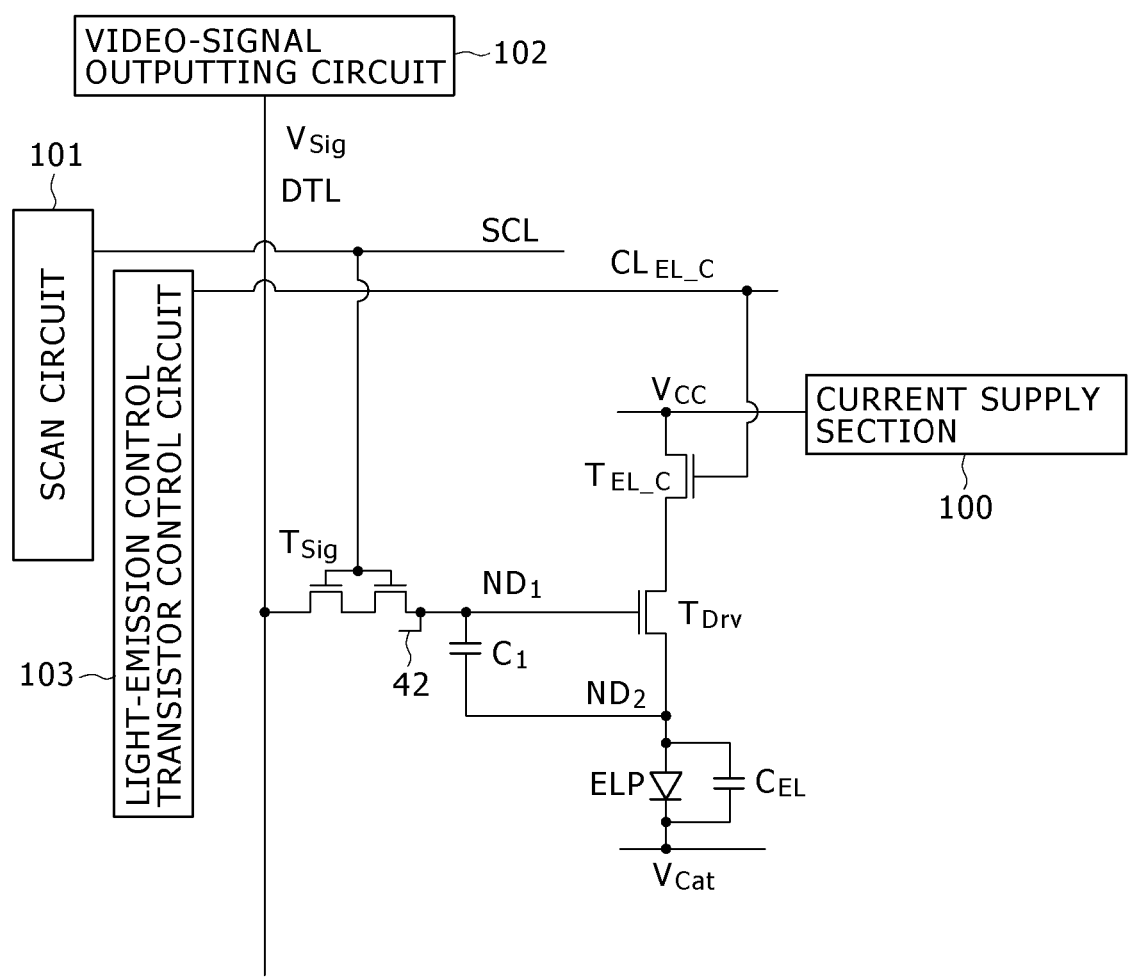
Figure 22:
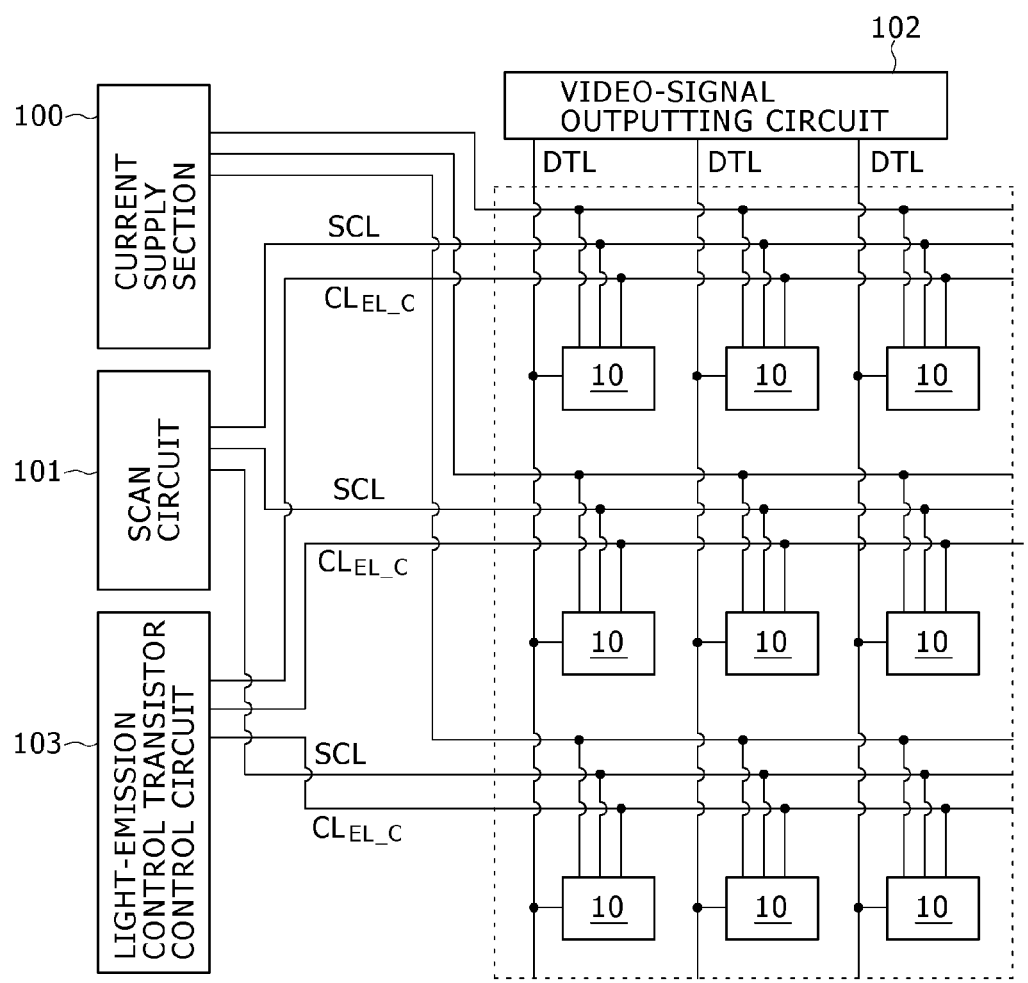
Figure 23:
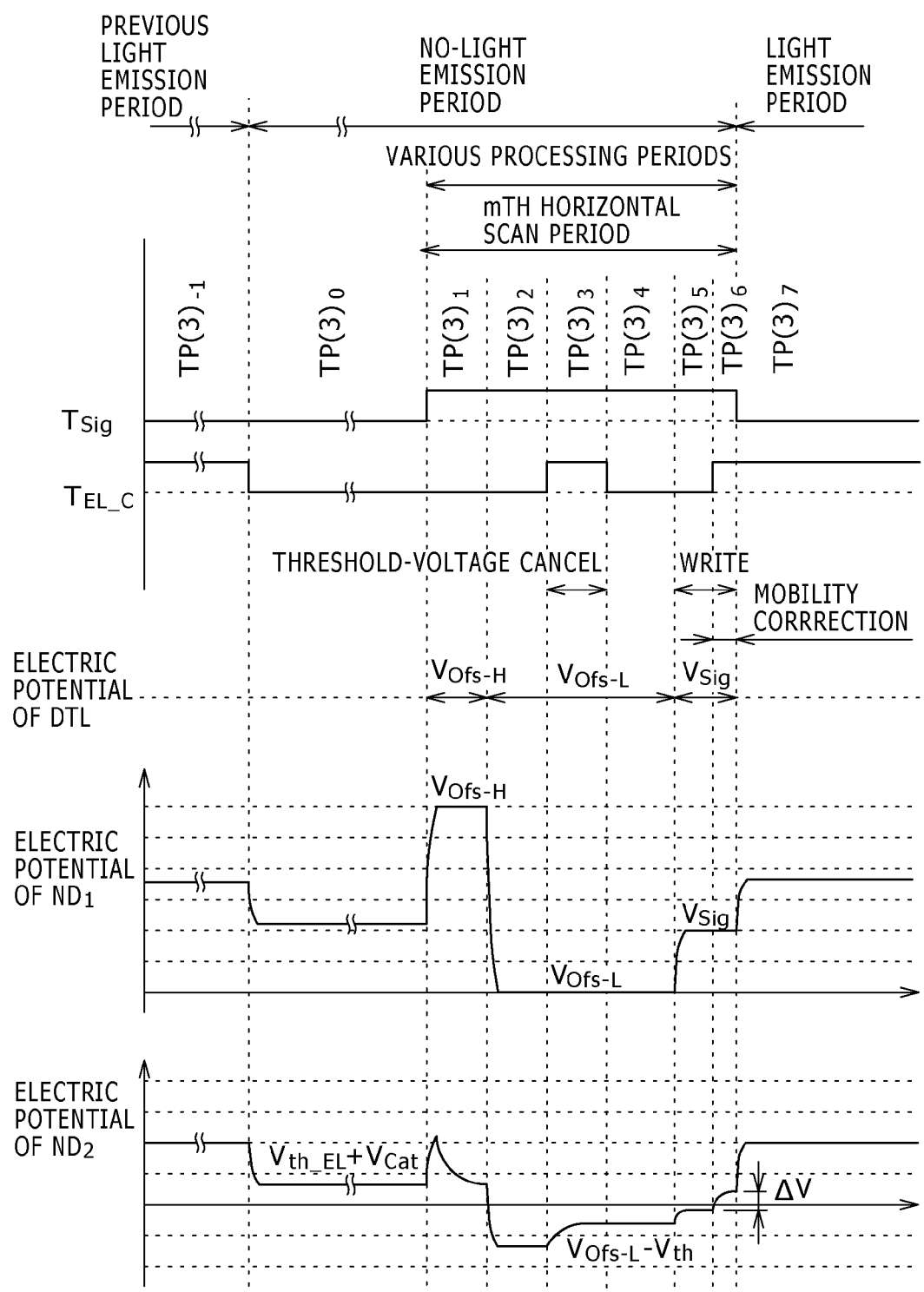
Figure 26:
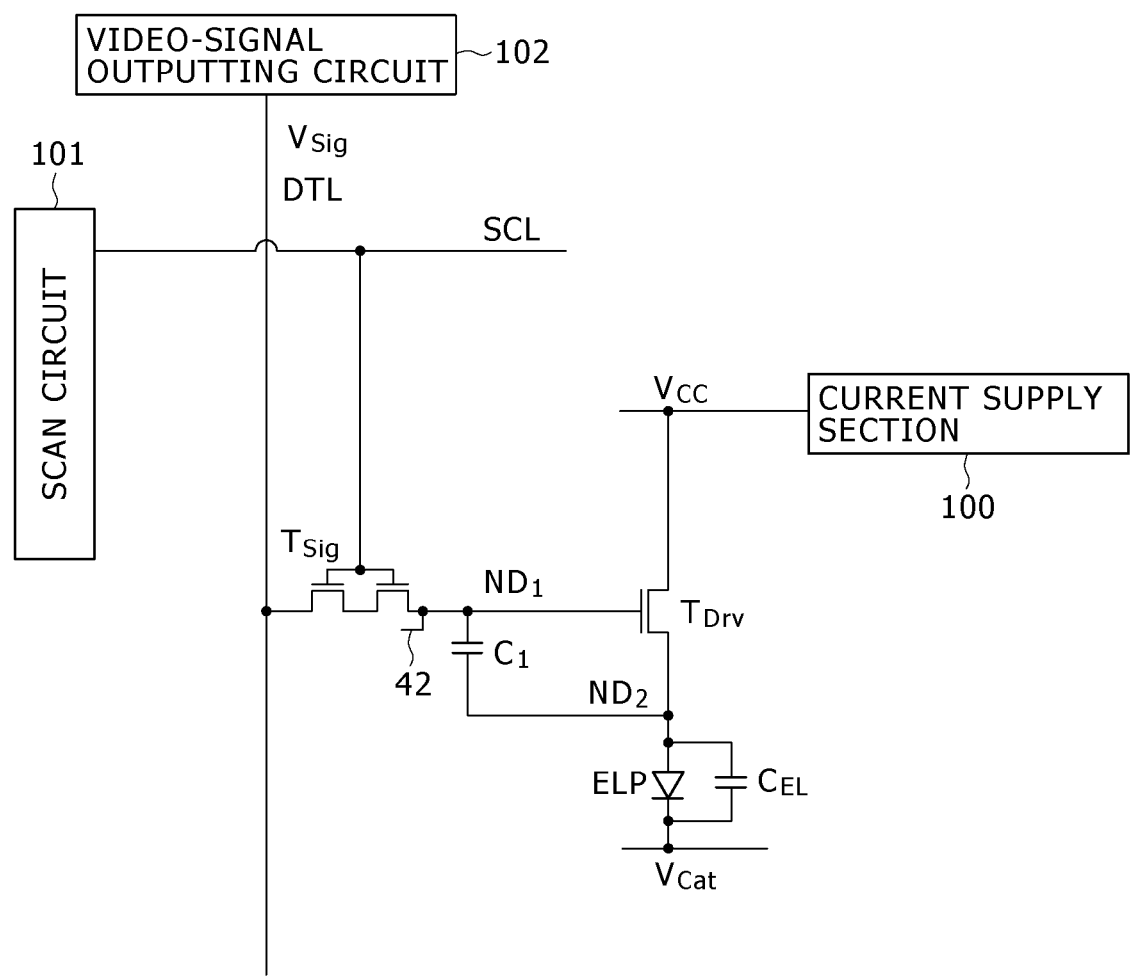
Figure 27:
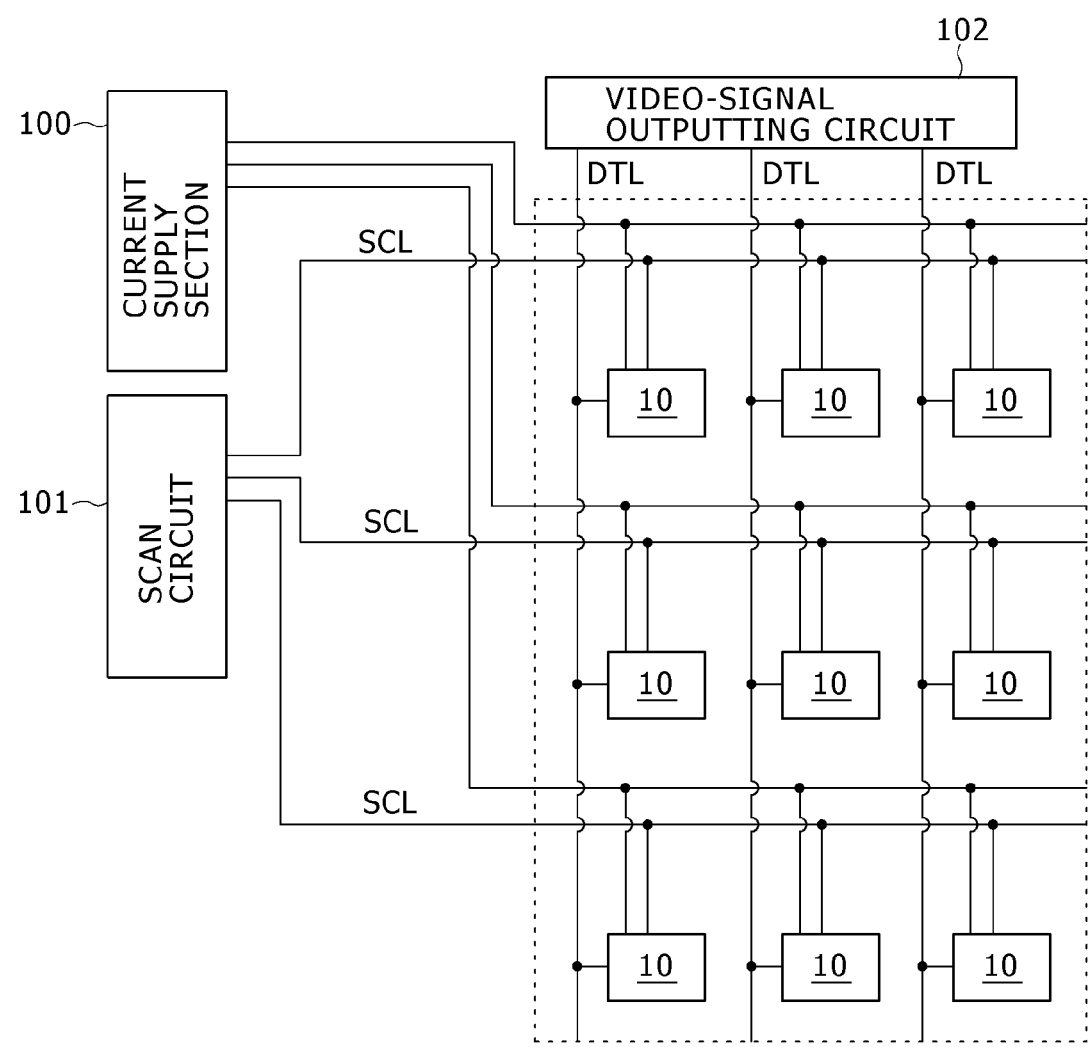
Figure 28:
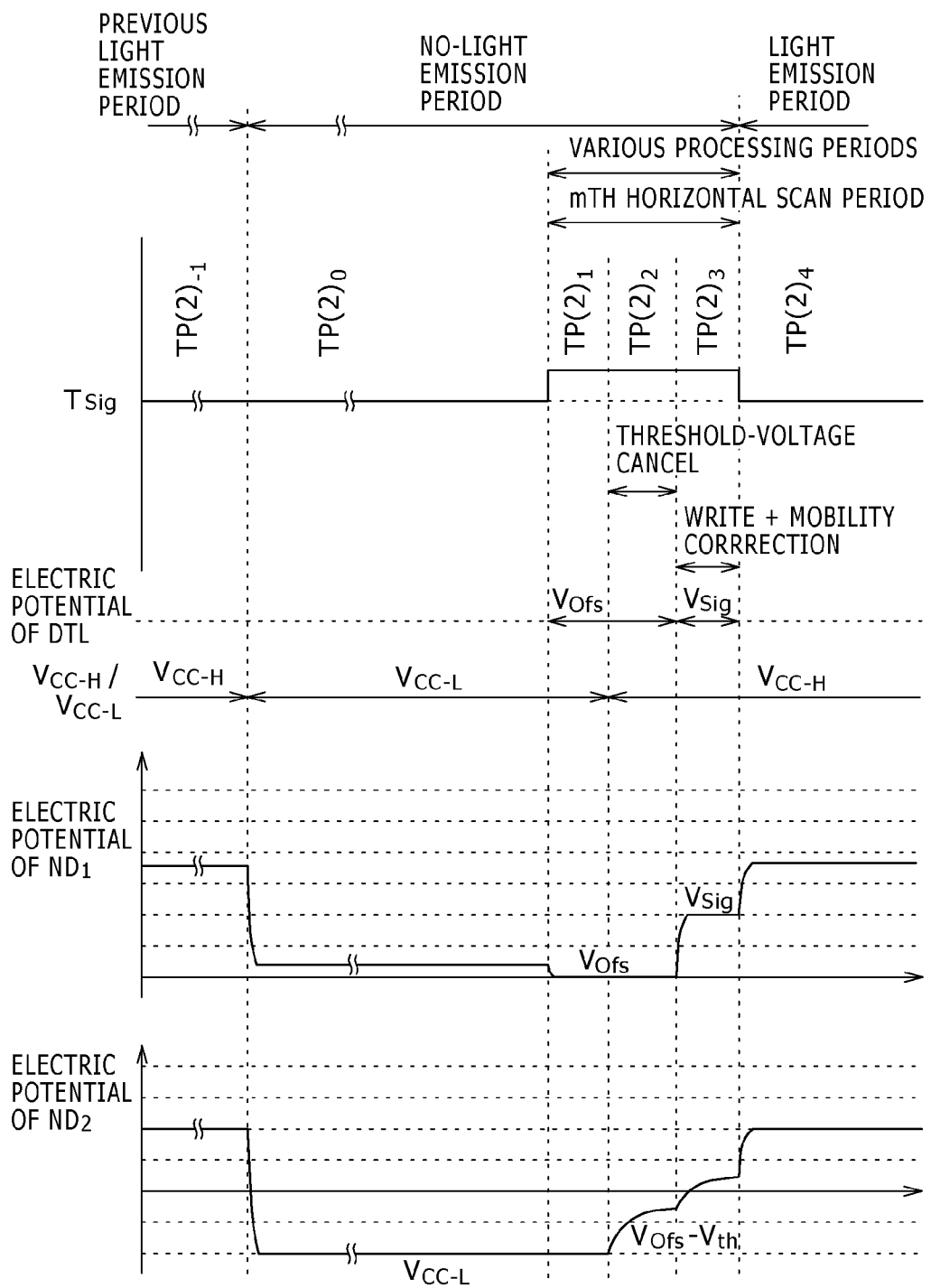
Figure 30:
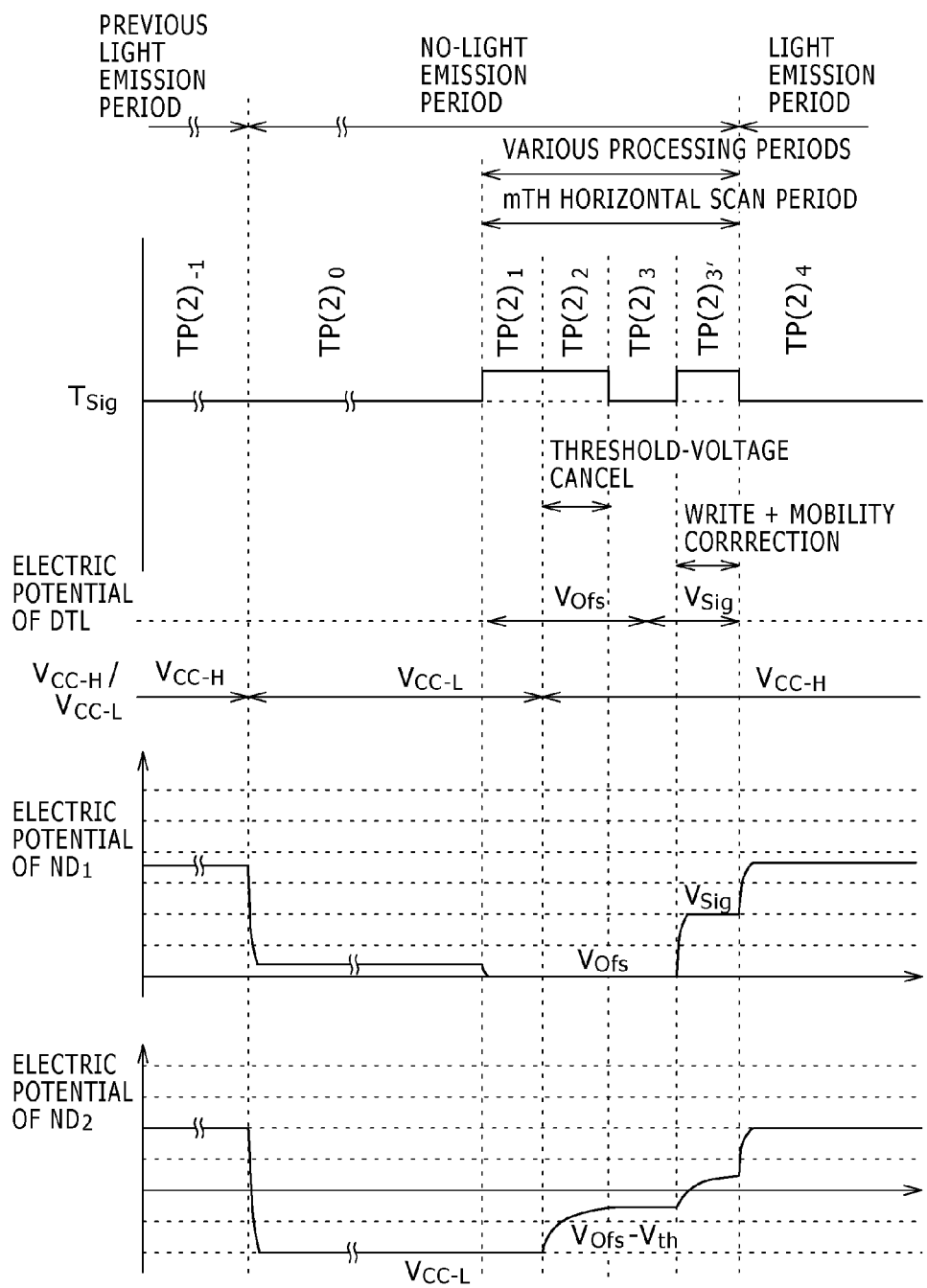
Figure 31:
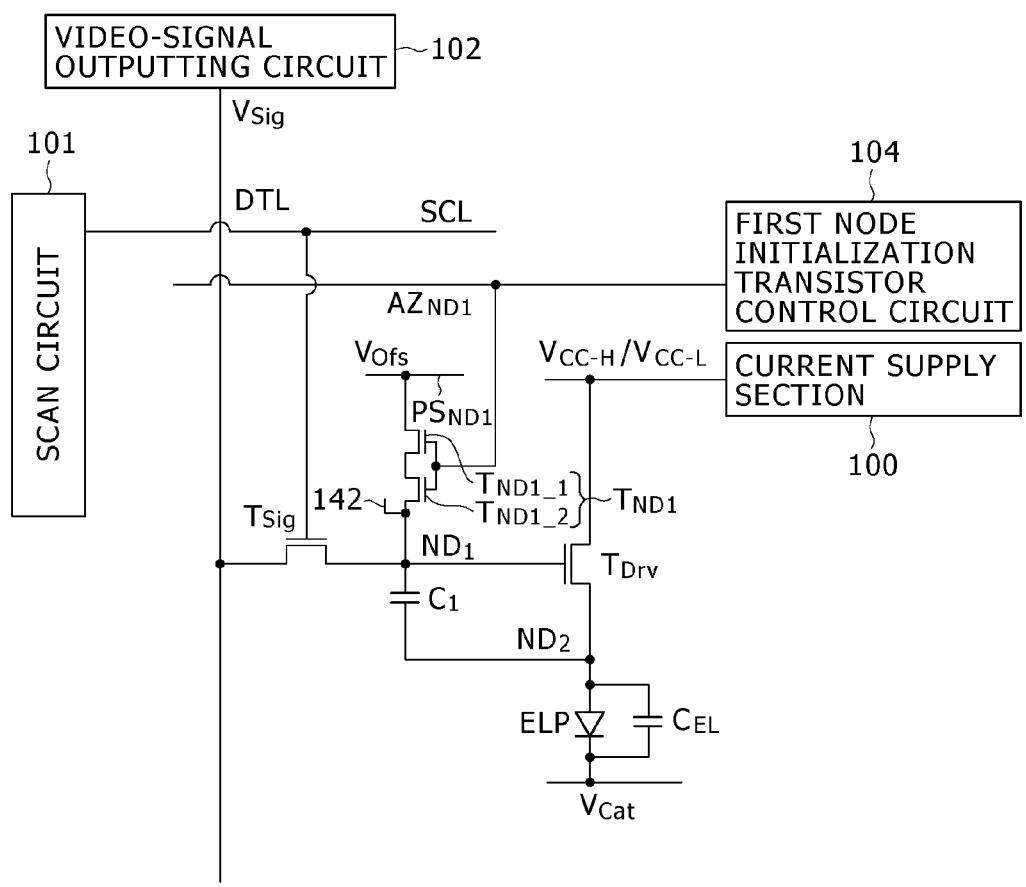
Figure 32:
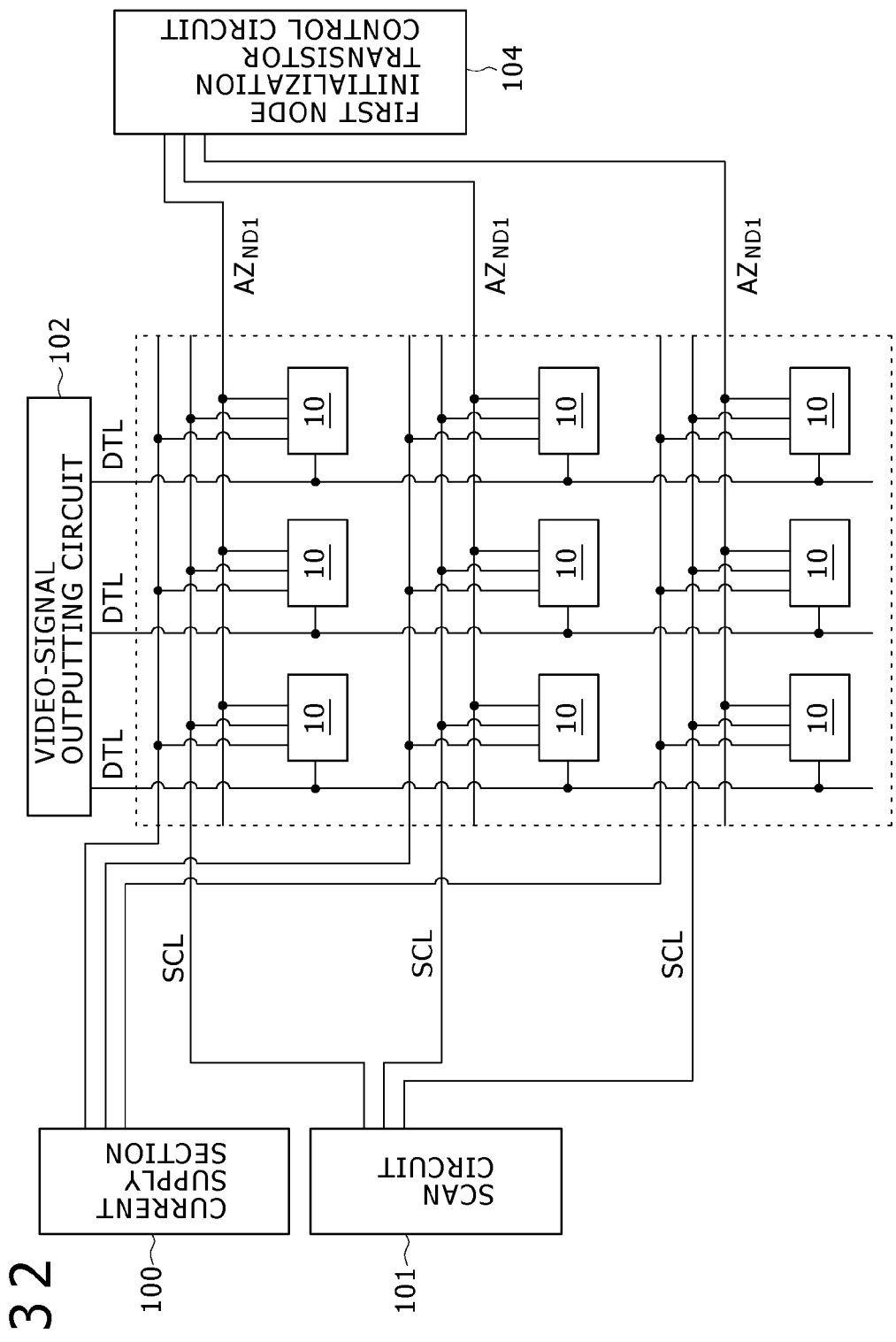
Figure 33:
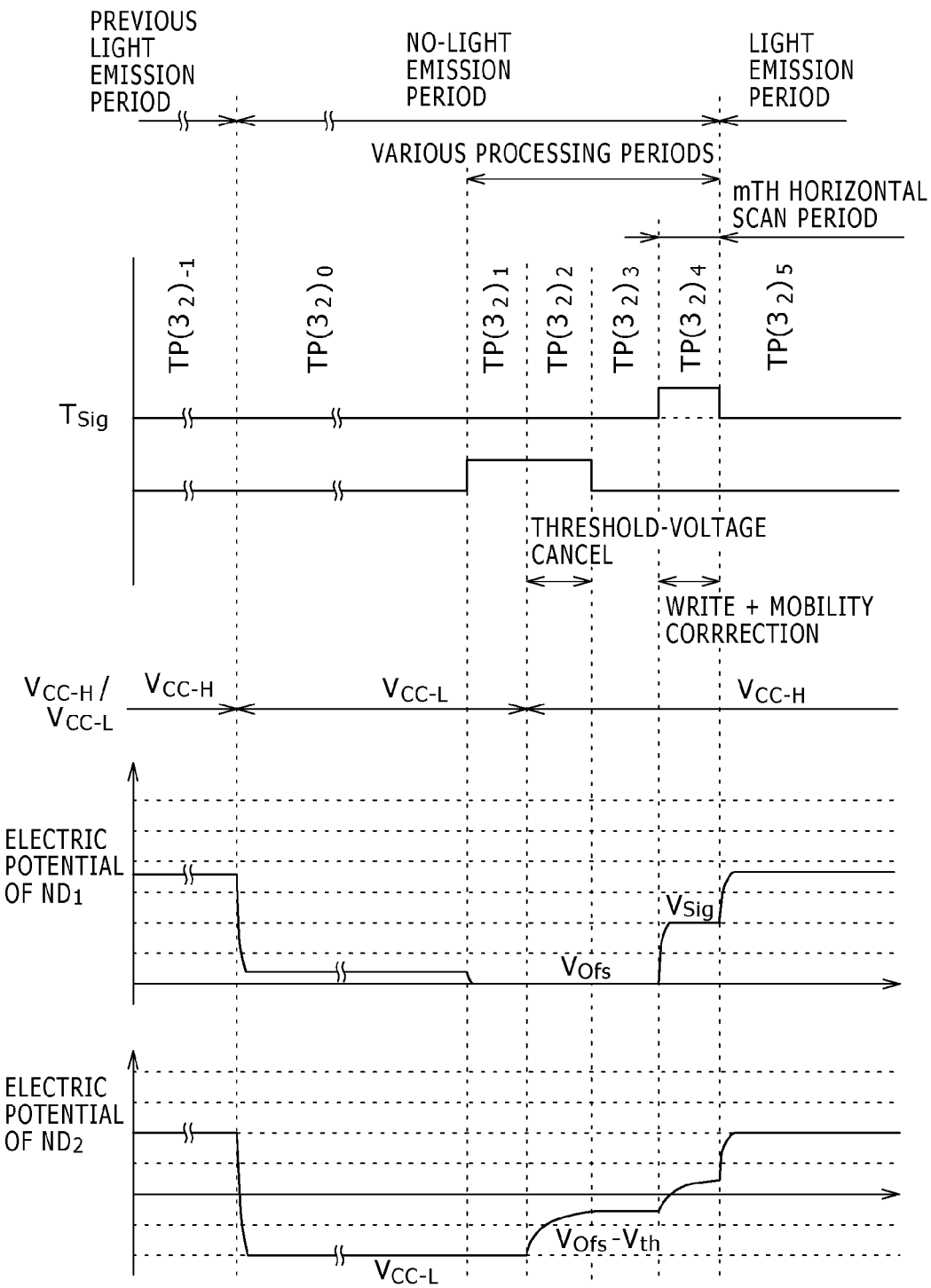
Figure 36:
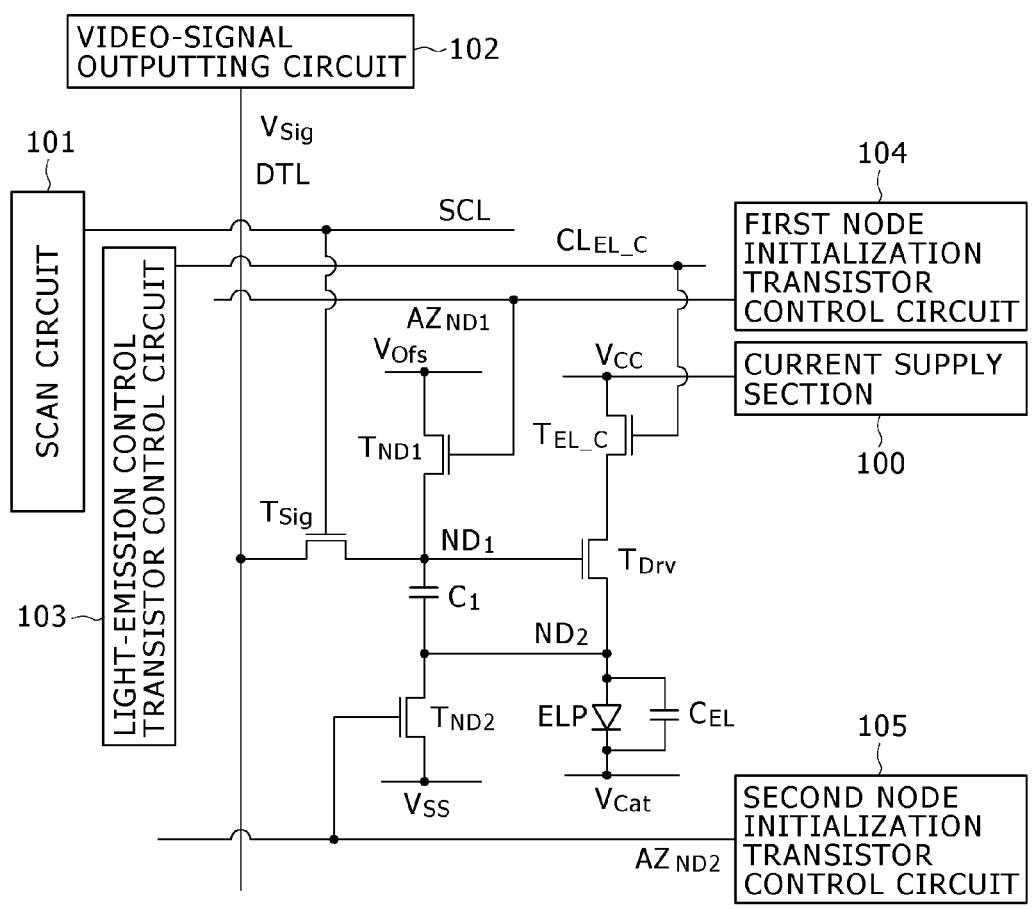
Figure 37:
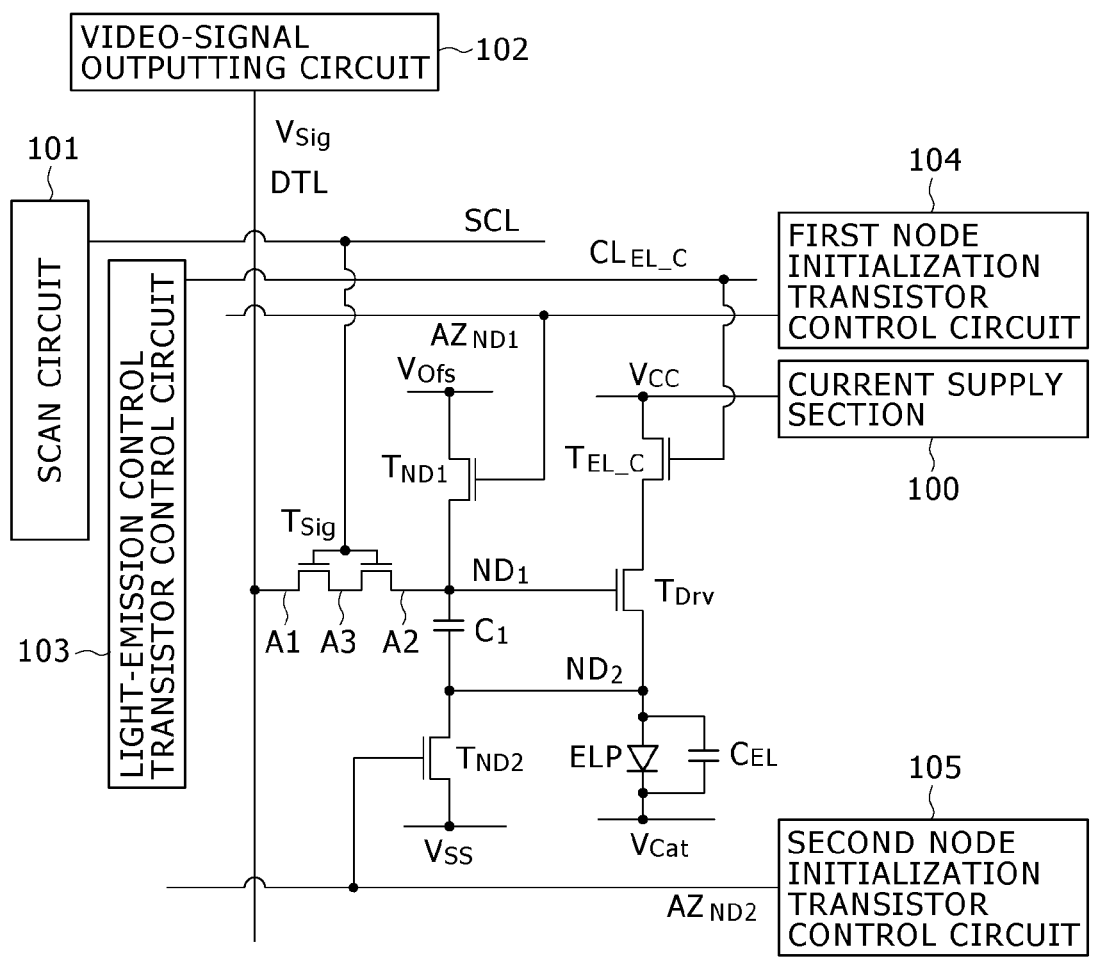
Figure 38A:
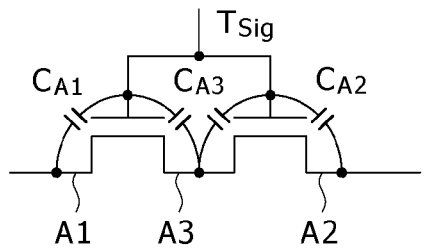
Figure 38B:
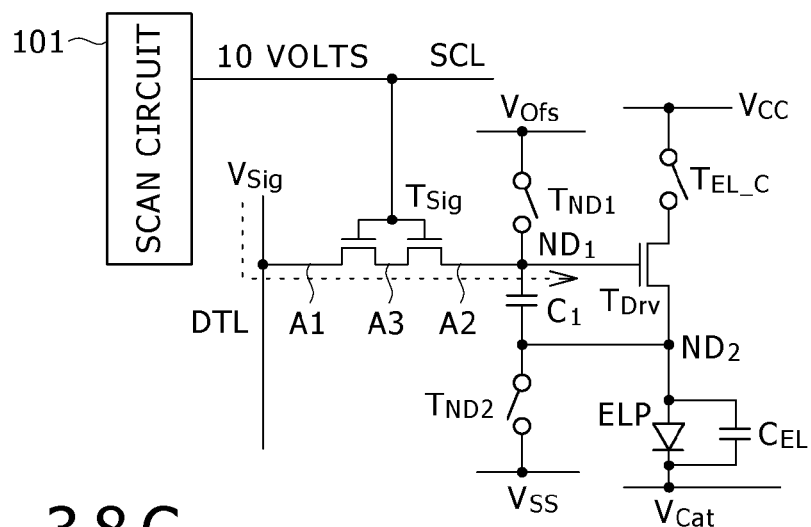
Figure 38C:
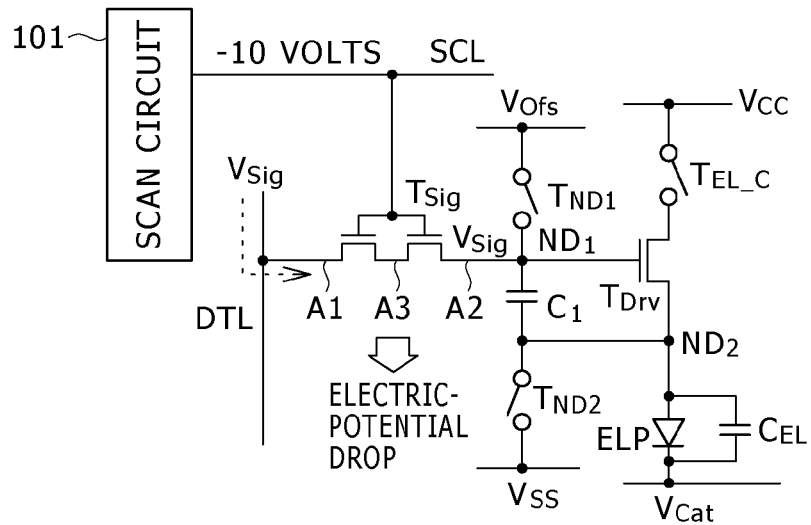

Serving as a continuation of FIG. 5D, FIGS. 6A to 6E are diagrams each showing a model of the organic EL device according to the first embodiment as a model representing turned-on and turned-off states of the transistors employed in the driving circuit of the organic EL device according to the first embodiment;

FIG. 7A is a diagram showing a model of states developed in vicinities of a second channel creation area when a video-signal write transistor $T_{Sig}$ is put in a turned-off state during the period $TP(5)_7$;

FIG. 7B is a diagram showing a model of a change caused by adding the shield electrode as a typical change of a current-voltage characteristic;

FIG. 8 is a diagram showing an equivalent circuit of a driving circuit employed in an organic EL device according to a second embodiment;

FIG. 9A is a diagram showing a model representing a partial cross section of a portion of the organic EL device according to the second embodiment;

Serving as a figure corresponding to FIG. 7A, FIG. 9B is a diagram showing a model of states developed in vicinities of the second channel creation area when the video-signal write transistor $T_{Sig}$ in the second embodiment is put in a turned-off state during a period $TP(5)_7$;

FIG. 10A is a diagram showing an equivalent circuit of a driving circuit employed in the organic EL device according to the third embodiment;

FIG. 10B is a diagram showing a model representing a partial cross section of a portion of the organic EL device according to the third embodiment;

FIG. 11A is a diagram showing an equivalent circuit of a driving circuit employed in the organic EL device according to the fourth embodiment;

FIG. 11B is a diagram showing a model representing a partial cross section of a portion of the organic EL device according to the fourth embodiment;

FIG. 12A is a diagram showing an equivalent circuit of a driving circuit employed in the organic EL device according to the fifth embodiment;

FIG. 12B is a diagram showing a model representing a partial cross section of a portion of the organic EL device according to the fifth embodiment;

FIG. 13A is a diagram showing an equivalent circuit of a driving circuit employed in the organic EL device according to the sixth embodiment;

FIG. 13B is a diagram showing a model representing a partial cross section of a portion of the organic EL device according to the sixth embodiment;

FIG. 14A is a diagram showing an equivalent circuit of a driving circuit employed in the organic EL device according to the seventh embodiment;

FIG. 14B is a diagram showing a model representing a partial cross section of a portion of the organic EL device according to the seventh embodiment;

FIG. 15A is a diagram showing an equivalent circuit of a driving circuit employed in the organic EL device according to the eighth embodiment;

FIG. 15B is a diagram showing a model representing a partial cross section of a portion of the organic EL device according to the eighth embodiment;

FIG. 16 is a diagram showing an equivalent circuit of a first modified version implementing the basic configuration of a 4Tr/1C driving circuit employed in an organic EL device according to a ninth embodiment;

FIG. 17 is a conceptual diagram showing an organic EL display apparatus employing the organic EL device having the 4Tr/1C driving circuit;

FIG. 18 shows a model of timing charts of the 4Tr/1C driving circuit which basically employs four transistors and one capacitor;

FIGS. 19A to 19D are diagrams each showing a model of the organic EL device employing the 4Tr/1C driving circuit as a model representing turned-on and turned-off states of the transistors employed in the 4Tr/1C driving circuit;

Serving as a continuation of FIG. 19D, FIGS. 20A to 20D are diagrams each showing a model of the organic EL device employing the 4Tr/1C driving circuit as a model representing turned-on and turned-off states of transistors employed in the 4Tr/1C driving circuit;

FIG. 21 is a diagram showing an equivalent circuit of a second modified version implementing the basic configuration of a 3Tr/1C driving circuit employed in an organic EL device according to the ninth embodiment;

FIG. 22 is a conceptual diagram showing an organic EL display apparatus employing the organic EL device having the 3Tr/1C driving circuit;

FIG. 23 shows a model of timing charts of the 3Tr/1C driving circuit which basically employs three transistors and one capacitor;

FIGS. 24A to 24D are diagrams each showing a model of the organic EL device employing the 3Tr/1C driving circuit as a model representing turned-on and turned-off states of the transistors employed in the 3Tr/1C driving circuit;

Serving as a continuation of FIG. 24D, FIGS. 25A to 25E are diagrams each showing a model of the organic EL device employing the 3Tr/1C driving circuit as a model representing turned-on and turned-off states of transistors employed in the 3Tr/1C driving circuit;

FIG. 26 is a diagram showing an equivalent circuit of a third modified version implementing the basic configuration of a 2Tr/1C driving circuit employed in an organic EL device according to the ninth embodiment;

FIG. 27 is a conceptual diagram showing an organic EL display apparatus employing the organic EL device having the 2Tr/1C driving circuit;

FIG. 28 shows a model of timing charts of the 2Tr/1C driving circuit which basically employs two transistors and one capacitor;

FIGS. 29A to 29F are diagrams each showing a model of the organic EL device employing the 2Tr/1C driving circuit as a model representing turned-on and turned-off states of the transistors employed in the 2Tr/1C driving circuit;

FIG. 30 shows a model representing timing charts of the 2Tr/1C driving circuit as timing charts other than those shown in FIG. 28;

FIG. 31 is a diagram showing an equivalent circuit of a second 3Tr/1C driving circuit employed in an organic EL device according to a tenth embodiment;

FIG. 32 is a conceptual diagram showing an organic EL display apparatus employing the organic EL device having the second 3Tr/1C driving circuit;

FIG. 33 shows a model of timing charts of the second 3Tr/1C driving circuit which basically employs three transistors and one capacitor;

FIGS. 34A to 34D are diagrams each showing a model of the organic EL device employing the second 3Tr/1C driving circuit as a model representing turned-on and turned-off states of the transistors employed in the second 3Tr/1C driving circuit;

Serving as a continuation of FIG. 34D, FIGS. 35A to 35C are diagrams each showing a model of the organic EL device employing the second 3Tr/1C driving circuit as a model representing turned-on and turned-off states of transistors employed in the second 3Tr/1C driving circuit;

FIG. 36 is a diagram showing an equivalent circuit of a 5Tr/1C driving circuit employed in an organic EL device;

FIG. 37 is a diagram showing a typical equivalent circuit of the above 5Tr/1C driving circuit in which a video-signal write transistor $T_{Sig}$ is designed into a dual-gate structure; and FIGS. 38A to 38C are diagrams each showing a more detailed configuration of the above 5Tr/1C driving circuit.

DETAILED DESCRIPTION OF THE PREFERRED EMBODIMENTS

Embodiments of the present invention are explained by referring to diagrams as follows. The first to fourth embodiments and the ninth embodiment relate to an organic EL display apparatus according to a first embodiment of the present invention as well as an organic EL device 10 employed in the organic EL display apparatus as an organic EL device 10 according to the first embodiment of the present invention. On the other hand, the fifth to eighth embodiments and the tenth embodiment relate to an organic EL display apparatus according to a second embodiment of the present invention as well as an organic EL device 10 employed in the organic EL display apparatus as an organic EL device 10 according to the second embodiment of the present invention.

To put it more concretely, in accordance with the first embodiment, the video-signal write transistor is provided with a first shield electrode. In accordance with the second embodiment, the video-signal write transistor is provided with the first shied electrode as well as a second shield electrode. In accordance with the third embodiment, the video-signal write transistor is provided with the first shied electrode as well as a third shield electrode. In accordance with the fourth embodiment, the video-signal write transistor is provided with the first to third shied electrodes as well as a fourth shield electrode. The ninth embodiment represents first to third modified versions each having fewer transistors than the driving circuits according to the first to fourth embodiments.

In addition, in accordance with the fifth embodiment, the first-node initialization transistor is provided with a first shield electrode. In accordance with the sixth embodiment, the first-node initialization transistor is provided with the first shied electrode as well as a second shield electrode. In accordance with the seventh embodiment, the first-node initialization transistor is provided with the first shied electrode as well as a third shield electrode. In accordance with the eighth embodiment, the first-node initialization transistor is provided with the first to third shied electrodes as well as a fourth shield electrode. The tenth embodiment represents modified versions each having fewer transistors than the driving circuits according to the fifth to eighth embodiments.

First Embodiment

The first embodiment as well as the second to fourth embodiments and the ninth embodiment relate to an organic EL display apparatus according to the first embodiment of the present invention as well as an organic EL device 10 according to the first embodiment of the present invention. The second to fourth embodiments and the ninth embodiment will be described later. It is to be noted that, in order to make the driving circuits according to the first embodiment and the second to fourth embodiments easy to compare with the driving circuits based on the technologies described earlier as the technologies of the art related to the present invention, each of the first embodiment and the second to fourth embodiments is explained by assuming that each of the driving circuits according to the first embodiment and the second to fourth embodiments employs five transistors and one capacitor.

Figure 1:
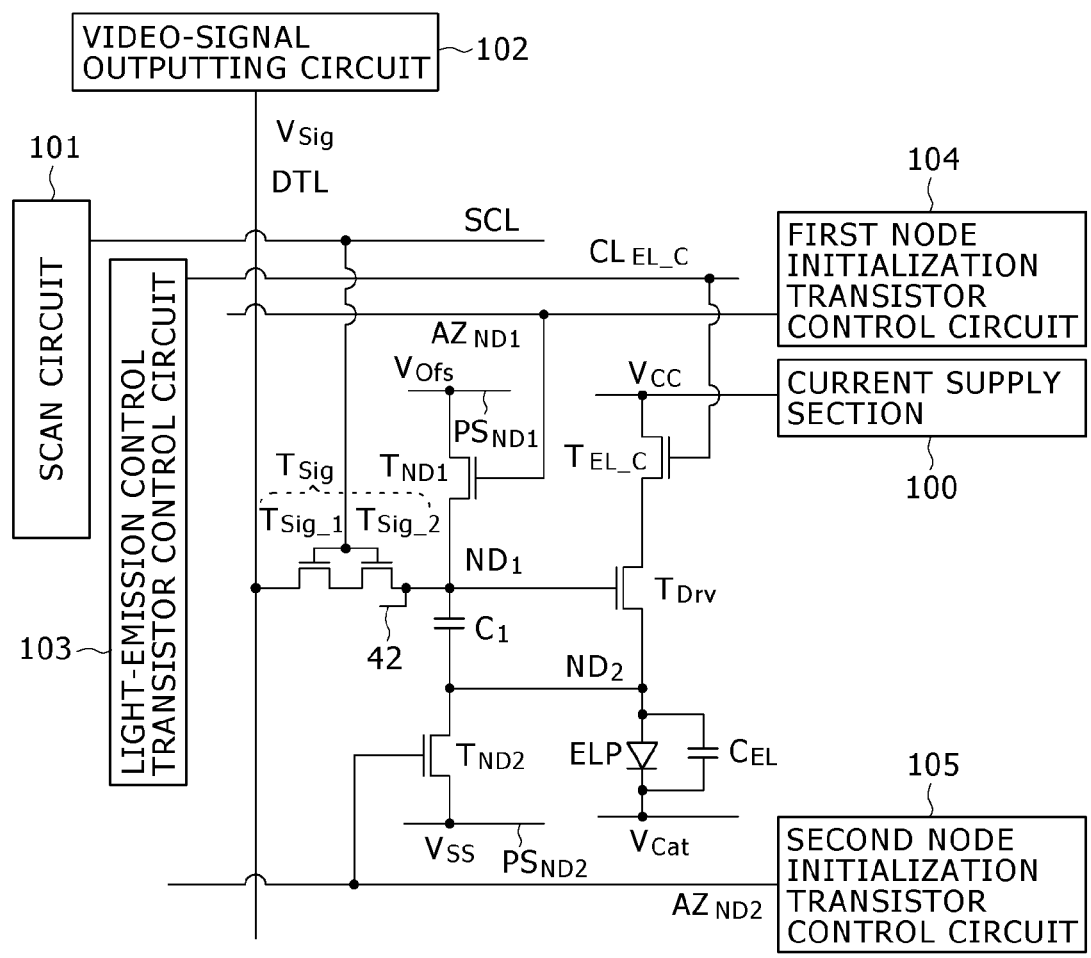
FIG. 1 is a diagram showing an equivalent circuit of a driving circuit employed in an organic EL device according to a first embodiment.
Figure 2:
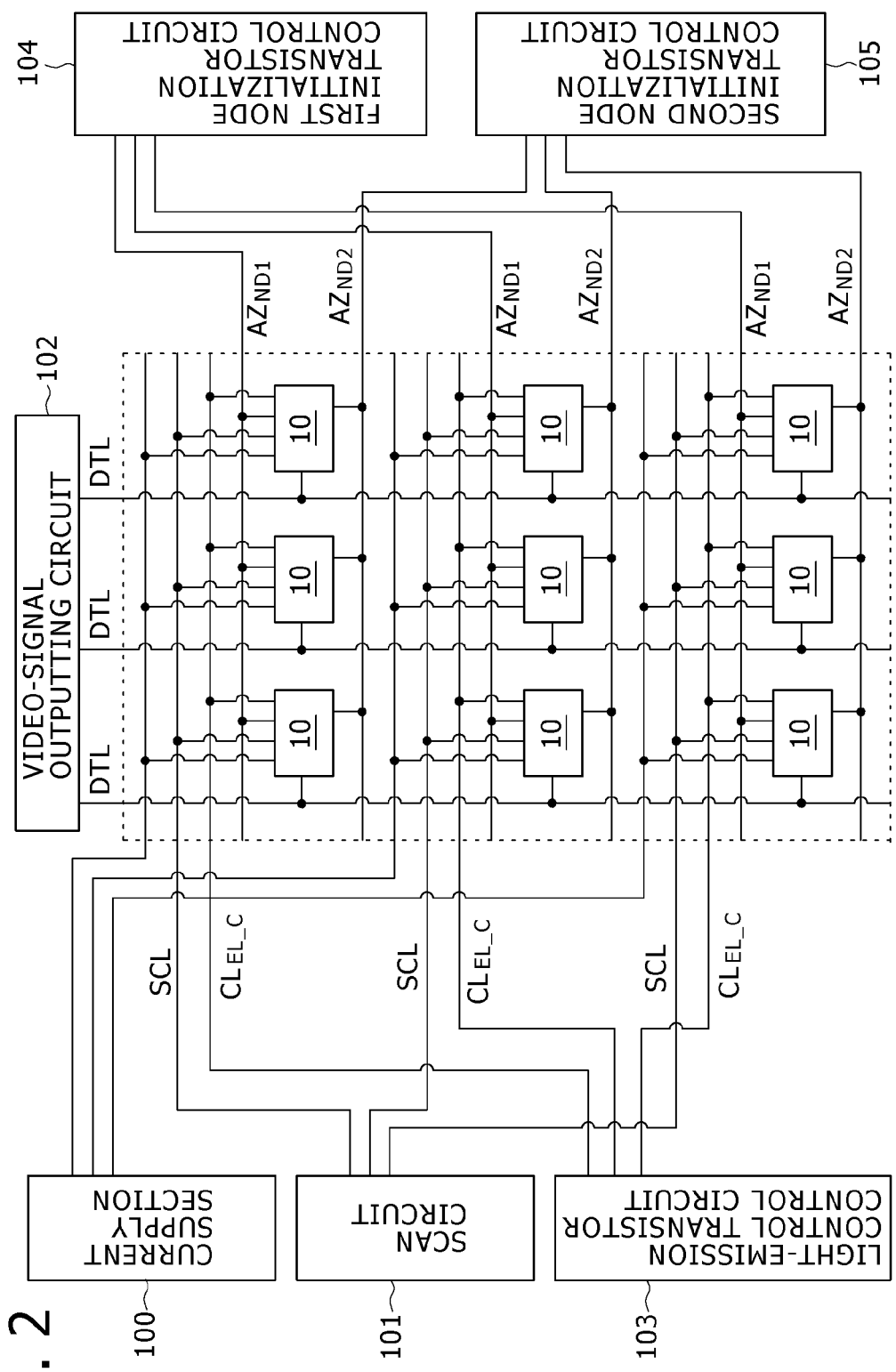
FIG. 2 is a conceptual diagram showing an organic EL display apparatus according to the first embodiment.
Figure 3:
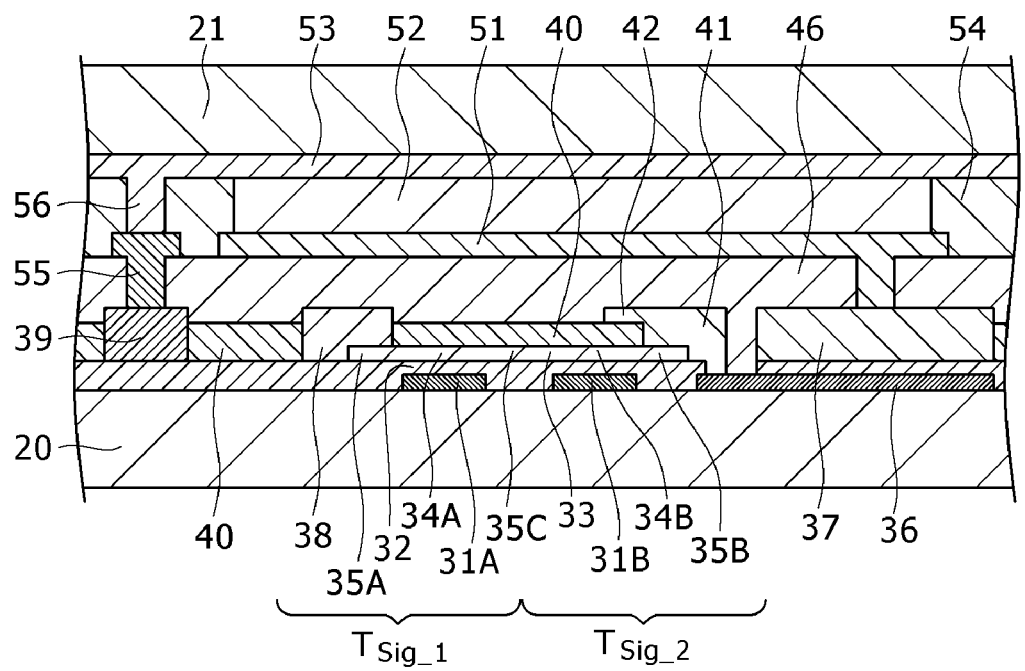
FIG. 3 is a diagram showing a model representing a partial cross section of a portion of the organic EL device according to the first embodiment.
Figure 4:
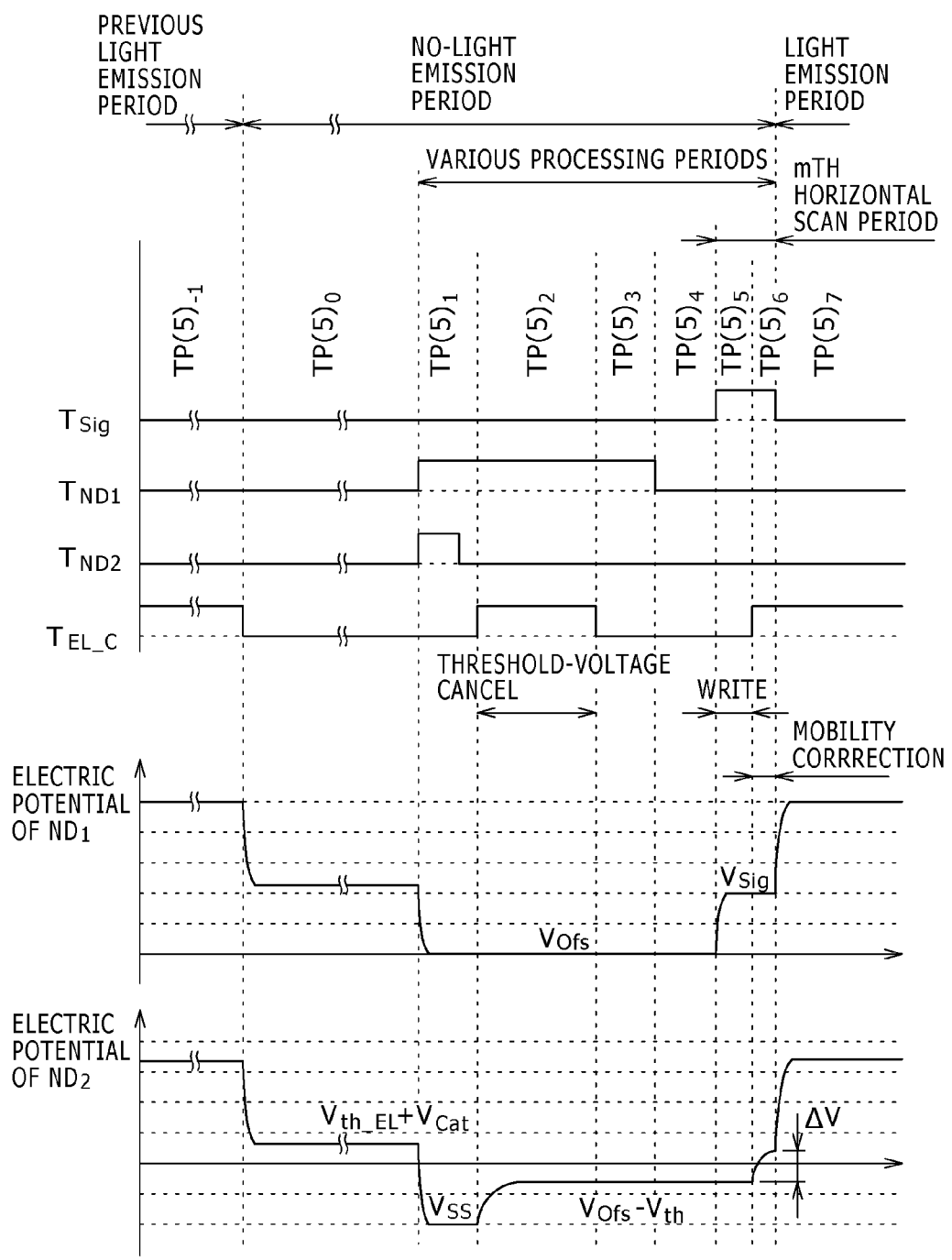
FIG. 4 shows a model of timing charts of the driving circuit employed in the organic EL device according to the first embodiment.

FIG. 1 is a diagram showing an equivalent circuit of a driving circuit employed in an organic EL device 10 according to the first embodiment whereas FIG. 2 is a conceptual diagram showing an organic EL display apparatus according to the first embodiment. FIG. 3 is a diagram showing a model representing a partial cross section of a portion of the organic EL device 10 according to the first embodiment whereas FIG. 4 shows timing charts of the driving circuit. Each of FIGS. 5A to 5D and FIGS. 6A to 6E shows a model of turned-on and turned-off states of transistors employed in the driving circuit. It is to be noted that, in FIGS. 5A to 5D and FIGS. 6A to 6E, for the sake of convenience, all transistors except an element driving transistor are each shown as a single switch without regard to whether each of the transistors is designed as a transistor having a single-gate structure or a dual-gate structure.

First of all, the organic EL display apparatus according to the first embodiment is explained. As shown in FIG. 2, the organic EL display apparatus according to the first embodiment employs:

(1) a scan circuit 101;

(2) a video-signal outputting circuit 102;

(3) M×N organic EL devices 10 laid out to form a two-dimensional matrix of N aforementioned organic EL devices 10 arranged in a first direction and M aforementioned organic EL devices 10 arranged in a second direction different from the first direction;

(4) M scan lines SCL each connected to the scan circuit 101 and each stretched in the first direction;

(5) N data lines DTL each connected to the video-signal outputting circuit 102 and each stretched in the second direction; and (6) a current supply section 100.

The organic EL display apparatus employed in each of the second to tenth embodiments to be described later has a configuration identical with the configuration of the organic EL display apparatus explained above as the organic EL display apparatus according to the first embodiment.

The organic EL display apparatus shown in each of FIG. 2 as well as FIGS. 17, 22, 27 and 32 to be described later employs 3×3 aforementioned organic EL devices 10. It is to be noted, however, that the number of aforementioned organic EL devices 10 in these figures is a typical number to the bitter end.

Each of the organic EL devices 10 employs an organic EL light emitting element ELP and a driving circuit for driving the organic EL light emitting element ELP. The light emitting element ELP can be designed into a configuration and/or a structure which are already generally known. To put it more concretely, for example, the organic EL light emitting element ELP can be designed into a configuration including, for example, an anode electrode, a hole transport layer, a light emitting layer, an electron transport layer and a cathode electrode. In addition, the configuration and structure of each of the scan circuit 101, the video-signal outputting circuit 102, the scan line SCL, the data line DTL and the current supply section 100 can be designed into respectively a configuration and/or a structure which are already generally known. An organic EL device according to each of the second to tenth embodiments to be described later has a configuration identical with the configuration of the organic EL device according to the first embodiment. In addition, an organic EL light emitting element ELP employed in an organic EL device according to each of the second to tenth embodiments to be described later has a configuration identical with the configuration of the organic EL light emitting element ELP employed in the organic EL device according to the first embodiment.

The driving circuit shown in FIG. 1 as a driving circuit according to the first embodiment has a configuration including five transistors and one capacitor much like the driving circuits based on the technologies described earlier as the technologies of the art related to the present invention. To put it more concretely, as shown in FIG. 1, the driving circuit according to the first embodiment employs:

(A) an element driving transistor $T_{Drv}$;

(B) a video-signal write transistor $T_{Sig}$; and (C) a capacitor $C_1$ having a pair of particular and other electrodes.

In addition, the driving circuit according to the first embodiment also includes:

(D) a first-node initialization transistor $T_{ND1}$;

(E) a second-node initialization transistor $T_{ND2}$; and (F) a light-emission control transistor $T_{EL\_C}$.

A driving circuit employed in an organic EL device according to each of the second to eighth embodiments to be described later has a configuration identical with the configuration of the driving circuit employed in the organic EL device according to the first embodiment.

Each of the element driving transistor $T_{Drv}$, the video-signal write transistor $T_{Sig}$, the first-node initialization transistor $T_{ND1}$, the second-node initialization transistor $T_{ND2}$ and the light-emission control transistor $T_{EL\_C}$ is an n-channel TFT having source/drain areas, a channel creation area and a gate electrode. Every transistor employed in an organic EL device according to each of the second to tenth embodiments to be described later has a configuration identical with the configuration of every transistor employed in the organic EL device according to the first embodiment. It is to be noted that, for example, the light-emission control transistor $T_{EL\_C}$ can also be designed as a TFT of a p-channel type.

In the element driving transistor $T_{Drv}$:

(A-1) a source/drain area provided on a particular side of the element driving transistor $T_{Drv}$ to serve as the particular source/drain area of the element driving transistor $T_{Drv}$ is connected to the current supply section 100; and (A-2) a source/drain area provided on the other side of the element driving transistor $T_{Drv}$ to serve as the other source/drain area of the element driving transistor $T_{Drv}$ is connected to the anode electrode of the organic EL light emitting element ELP and the particular electrode of the capacitor $C_1$, forming a second node $ND_2$. An element driving transistor $T_{Drv}$ employed in an organic EL device according to each of the second to tenth embodiments to be described later is connected to other components in the same way as the element driving transistor $T_{Drv}$ employed in the organic EL device according to the first embodiment.

In the light emission state of the organic EL device 10, the element driving transistor $T_{Drv}$ is driven to flow a drain current $I_{ds}$ according to Eq. (1) given below. In the light emission state of the organic EL device 10, the particular source/drain area of the element driving transistor $T_{Drv}$ functions as a drain whereas the other source/drain area of the element driving transistor $T_{Drv}$ functions as a source. Thus, in order to make the explanation simple, in the following description, the particular source/drain area of the element driving transistor $T_{Drv}$ is also referred to simply as the drain of the element driving transistor $T_{Drv}$ whereas the other source/drain area of the element driving transistor $T_{Drv}$ is also referred to simply as the source of the element driving transistor $T_{Drv}$. Notations used in Eq. (1) are explained as follows:

μ: effective mobility

L: channel length

W: channel width $V_{gs}$: difference in electric potential between the gate electrode and the source area $V_{th}$: threshold voltage $C_{OX}$: (specific permittivity of the gate insulation layer)* (permittivity of the vacuum)/(thickness of the gate insulation layer)

$$k=(1/2)*(W/L)*C_{OX}$$

The above description of the notations also holds true of the second to tenth embodiments to be described later.

$$I_{ds}=k*\mu*(V_{gs}-V_{th})^2 \quad (1)$$

The drain current $I_{ds}$ flows through an organic EL light emitting element ELP employed in the organic EL device 10, causing the organic EL light emitting element ELP to emit light. In addition, the magnitude of the drain current $I_{ds}$ controls the light emission state of the organic EL light emitting element ELP employed in the organic EL device 10. The light emission state of the organic EL light emitting element ELP employed in the organic EL device 10 is also referred to as the luminance of the organic EL light emitting element ELP. A drain current $I_{ds}$ in the second to tenth embodiments to be described later plays the same role as the drain current $I_{ds}$ in the first embodiment.

As shown in FIG. 3, the transistors and a capacitor $C_1$ which compose the driving circuit in the first embodiment are created on a support body 20 whereas the organic EL light emitting element ELP is created over the transistors and the capacitor $C_1$, which are employed in the driving circuit, being separated from the transistors and the capacitor $C_1$ by an inter-layer insulation layer 46 or the like. With regard to the creation of the transistors, the capacitor $C_1$ and the organic EL light emitting element ELP, the second to fourth embodiments and the ninth embodiment, which are to be described later, are the same as the first embodiment. It is to be noted that each of the cross section of FIG. 3 as well as cross sections of FIGS. 9A, 10B and 11B to be described later shows only the video-signal write transistor $T_{Sig}$. This is because the transistors other than the video-signal write transistor $T_{Sig}$ are provided at hidden locations so that these other transistors are invisible.

In the first embodiment, the video-signal write transistor $T_{Sig}$ has a semiconductor layer 33, source/drain areas on the semiconductor layer 33 and a channel creation area between the source/drain areas. As shown in FIGS. 1 and 3, in the first embodiment, the video-signal write transistor $T_{Sig}$ has a dual-gate structure having a first sub-transistor $T_{Sig\_1}$ including a first gate electrode 31A, a source/drain area 35A as well as a first channel creation area 34A and having a second sub-transistor $T_{Sig\_2}$ including a second gate electrode 31B, a second source/drain area 35B as well as a second channel creation area 34B. A video-signal write transistor $T_{Sig}$ employed in each of the second, third, fourth and ninth embodiments to be described later has the same configuration as the video-signal write transistor $T_{Sig}$ explained above as a transistor for the first embodiment.

Each of the source/drain area 35A, the second source/drain area 35B and a common source/drain area 35C, which are shown in FIG. 3, is created on the semiconductor layer 33. The common source/drain area 35C is an area in which the other source/drain area of the first sub-transistor $T_{Sig\_1}$ and the particular source/drain area of the second sub-transistor $T_{Sig\_2}$ overlap each other. The first (particular) source/drain area 35A of the first sub-transistor $T_{Sig\_1}$ is connected to a data line DTL which corresponds to a wire 38 shown in FIG. 3. The second (other) source/drain area 35B of the second sub-transistor $T_{Sig\_2}$ is connected to the gate electrode of the element driving transistor $T_{Drv}$ and the other electrode 36 of the capacitor $C_1$, forming the first node $ND_1$. The first gate electrode 31A of the first sub-transistor $T_{Sig\_1}$ and the second gate electrode 31B of the second sub-transistor $T_{Sig\_2}$ are connected to a scan line SCL. The first gate electrode 31A of the first sub-transistor $T_{Sig\_1}$ faces a particular face of the first channel creation area 34A of the first sub-transistor $T_{Sig\_1}$ through a gate insulation layer 32 sandwiched by the first gate electrode 31A and the particular face of the first channel creation area 34A. The second gate electrode 31B of the second sub-transistor $T_{Sig\_2}$ faces a particular face of the second channel creation area 34B of the second sub-transistor $T_{Sig\_2}$ through the gate insulation layer 32 sandwiched by the second gate electrode 31B and the particular face of the second channel creation area 34B. A video-signal write transistor $T_{Sig}$ is connected to other components in each of the second, third, fourth and ninth embodiments to be described later in the same way as the video-signal write transistor $T_{Sig}$ explained above as a transistor for the first embodiment.

In addition, the second sub-transistor $T_{Sig\_2}$ has a shield electrode 42 facing the other face of the second channel creation area 34B of the second sub-transistor $T_{Sig\_2}$ through a shield insulation layer 40 sandwiched by the shield electrode 42 and the other face of the second channel creation area 34B. The shield electrode 42 is connected to the other source/drain area 35B of the second sub-transistor $T_{Sig\_2}$. To put it more concretely, in the first embodiment, an extension from a line 41 connected to the other source/drain area 35B of the second sub-transistor $T_{Sig\_2}$ forms the shield electrode 42. The above description for the first embodiment also holds true of the second, third, fourth and ninth embodiments to be described later.

It is to be noted that each of the other transistors also has a configuration including a semiconductor layer, a gate insulation film and a gate electrode in the same way as what is described above. In addition, each of the other transistors in the second, third, fourth and ninth embodiments to be described later has the same configuration as each of the other transistors in the first embodiment.

The capacitor $C_1$ has a dielectric layer composed of an extension of the gate insulation layer 32, the so-called other electrode 36 and the so-called particular electrode 37 which corresponds to the second node $ND_2$. The first gate electrode 31A, the second gate electrode 31B, a portion of the gate insulation layer 32 and the other electrode 36 are created on the support body 20. As described above, the first (particular) source/drain area 35A of the first sub-transistor $T_{Sig\_1}$, of the video-signal write transistor $T_{Sig}$ is connected to the wire 38 whereas the second (other) source/drain area 35B of the second sub-transistor $T_{Sig\_2}$ of the video-signal write transistor $T_{Sig}$ is connected to the other electrode 36. The video-signal write transistor $T_{Sig}$, the capacitor $C_1$ and other components are covered by a inter-layer insulation layer 46 and, on the inter-layer insulation layer 46, the organic EL light emitting element ELP is created. Also as explained above, the organic EL light emitting element ELP has an anode electrode 51, a hole transport layer, a light emitting layer, an electron transport layer and a cathode electrode 53. It is to be noted that, in the figure, the hole transport layer, the light emitting layer and the electron transport layer are represented by a first layer 52. On a portion included in the inter-layer insulation layer 46 as a portion with no light emitting element ELP, a second inter-layer insulation layer 54 is provided. A transparent substrate 21 is provided on the second inter-layer insulation layer 54 and the cathode electrode 53. A light beam generated by the light emitting layer is output to the external space through the substrate 21. It is to be noted that the particular electrode 37 of the capacitor $C_1$ and the anode electrode 51 of the organic EL light emitting element ELP are connected to each other by a contact hole created by boring the inter-layer insulation layer 46. In addition, the cathode electrode 53 of the organic EL light emitting element ELP is connected to a wire 39 by contact holes 56 and 55 created by boring the second inter-layer insulation layer 54 and the inter-layer insulation layer 46 respectively. The wire 39 is a line provided on an extension of the gate insulation layer 32. The above description also holds true of the second to tenth embodiments to be described later.

The transistors, the capacitor $C_1$, a variety of wires including the wire 38, a variety of electrodes including the shield electrode 42 and other components can be created by adopting a variety of generally known methods. Transistors, a capacitor $C_1$, a variety of wires including a wire 38, a variety of electrodes including a shield electrode 42 and other components in the second to tenth embodiments to be described later can be created by adopting a variety of generally known methods identical with those of the first embodiment.

As described above, the first (particular) source/drain area 35A serving as the particular source/drain area 35A of the first sub-transistor $T_{Sig\_1}$ employed in the video-signal write transistor $T_{Sig}$ is connected to a data line DTL. The video-signal outputting circuit 102 supplies a voltage $V_{Sig}$ for controlling the luminance of the organic EL light emitting element ELP to the first (particular) source/drain area 35A through the data line DTL. It is to be noted that the data line DTL can also be used for supplying a variety of signals and voltages other than the voltage $V_{Sig}$ to the first (particular) source/drain area 35A. The signals and voltages other than the voltage $V_{Sig}$ include a signal for pre-charge driving and a reference voltage. In addition, operations to turn on and off the video-signal write transistor $T_{Sig}$ are controlled by a signal appearing on a scan line SCL connected to the gate electrodes 31A and 31B of the video-signal write transistor $T_{Sig}$. The above description also holds true of the second, third, fourth and ninth embodiments to be described later. In addition, except that the video-signal write transistor $T_{Sig}$ has a single-gate electrode configuration, the above description also holds true of the fifth, sixth, seventh, eighth and tenth embodiments to be described later.

The particular source/drain area of the first-node initialization transistor $T_{ND1}$ is connected to a first-node initialization voltage supply line $PS_{ND1}$ whereas the other source/drain area of the first-node initialization transistor $T_{ND1}$ is connected to the first node $ND_1$. The gate electrode of the first-node initialization transistor $T_{ND1}$ is connected to a first-node initialization transistor control line $AZ_{ND1}$ which is connected to a first-node initialization transistor control circuit 104. The connections of the first-node initialization transistor $T_{ND1}$ to other components in the second to fourth embodiments to be described later are the same as the connections of the first-node initialization transistor $T_{ND1}$ to other components in the first embodiment described above.

Operations to turn on and off the first-node initialization transistor $T_{ND1}$ are controlled by a signal appearing on the first-node initialization transistor control line $AZ_{ND1}$ connected to the gate electrode of the first-node initialization transistor $T_{ND1}$. A voltage $V_{Ofs}$ for initializing the first node $ND_1$ is asserted on the first-node initialization voltage supply line $PS_{ND1}$. This description also holds true of the second to fourth embodiments to be described later.

The particular source/drain area of the second-node initialization transistor $T_{ND2}$ is connected to a second-node initialization voltage supply line $PS_{ND2}$ whereas the other source/drain area of the second-node initialization transistor $T_{ND2}$ is connected to the second node $ND_2$. The gate electrode of the second-node initialization transistor $T_{ND2}$ is connected to a second-node initialization transistor control line $AZ_{ND2}$ which is connected to a second-node initialization transistor control circuit 105. The connections of the second-node initialization transistor $T_{ND2}$ to other components in the second to eighth embodiments to be described later, in a 4Tr/1C driving circuit serving as a first modified version of the driving circuit in accordance with the ninth embodiment also to be described later and in the tenth embodiment also to be described later are the same as the connections of the second-node initialization transistor $T_{ND2}$ to other components in the first embodiment described above.

Operations to turn on and off the second-node initialization transistor $T_{ND2}$ are controlled by a signal appearing on the second-node initialization transistor control line $AZ_{ND2}$ connected to the gate electrode of the second-node initialization transistor $T_{ND2}$. A voltage $V_{SS}$ for initializing the second node $ND_2$ is asserted on the second-node initialization voltage supply line $PS_{ND2}$. This description also holds true of the second to eighth embodiments to be described later, the 4Tr/1C driving circuit serving as the first modified version of the driving circuit in accordance with the ninth embodiment also to be described later and the tenth embodiment also to be described later.

The drain area of the element driving transistor $T_{Drv}$ and the current supply section 100 are connected to each other by the light-emission control transistor $T_{EL\_C}$. The gate electrode of the light-emission control transistor $T_{EL\_C}$ is connected to a light-emission control transistor control line $CL_{EL\_C}$ which is connected to a light-emission control transistor control circuit 103. This description of the connections also holds true of the second to eighth embodiments to be described later, the 4Tr/1C driving circuit serving as the first modified version of the driving circuit in accordance with the ninth embodiment also to be described later and the tenth embodiment also to be described later.

To put it more concretely, the particular source/drain area of the light-emission control transistor $T_{EL\_C}$ is connected to the current supply section 100 generating the voltage $V_{CC}$ whereas the other source/drain area of the light-emission control transistor $T_{EL\_C}$ is connected to the drain area of the element driving transistor $T_{Drv}$. In addition, operations to turn on and off the light-emission control transistor $T_{EL\_C}$ are controlled by a signal appearing on the light-emission control transistor control line $CL_{EL\_C}$ connected to the gate electrode of the light-emission control transistor $T_{EL\_C}$. It is to be noted that the current supply section 100 is a section provided for supplying a current to the organic EL light emitting element ELP employed in the organic EL device 10 through the light-emission control transistor $T_{EL\_C}$ and the element driving transistor $T_{Drv}$ in order to control the light emission of the organic EL light emitting element ELP. This description also holds true of the second to eighth embodiments to be described later, the 4Tr/1C driving circuit serving as the first modified version of the driving circuit in accordance with the ninth embodiment also to be described later and the tenth embodiment also to be described later.

As described earlier, the anode electrode of the organic EL light emitting element ELP is connected to the source area of the element driving transistor $T_{Drv}$. A voltage $V_{Cat}$ is applied to the cathode area of the organic EL light emitting element ELP. In the figure, notation $C_{EL}$ denotes the parasitic capacitance of the organic EL light emitting element ELP. Let us assume that a voltage $V_{th-EL}$ is required for light emission of the organic EL light emitting element ELP. That is to say, if a voltage at least as high as the voltage $V_{th-EL}$ is applied between the anode and cathode electrodes of the organic EL light emitting element ELP, the organic EL light emitting element ELP emits light. This description also holds true of the second to tenth embodiments to be described later. The voltage $V_{th-EL}$ is the threshold voltage of the organic EL light emitting element ELP.

It is to be noted that the 5Tr/1C driving circuit explained before by referring to FIG. 36 has the same configuration as the first embodiment except that the video-signal write transistor $T_{Sig}$ employed in the 5Tr/1C driving circuit shown in FIG. 36 has a single-gate structure.

The description given so far has explained the organic EL display apparatus according to the first embodiment, the organic EL device 10 employed in the organic EL display apparatus as the organic EL device according to the first embodiment and the 5Tr/1C driving circuit serving as the driving circuit, which is employed in the organic EL device as a circuit for driving the organic EL light emitting element ELP.

By referring to diagrams, the following description explains an effect exhibited by the shield electrode 42. FIG. 7A is a diagram showing a model of states developed in vicinities of the second channel creation area 34B when the video-signal write transistor $T_{Sig}$ is put in a turned-off state during a period $TP(5)_7$ to be described later. In this embodiment, the second channel creation area 34B between the common source/drain area 35C and the second (other) source/drain area 35B is set in a region having a width about equal to that of the second gate electrode 31B and, by the same token, the first channel creation area 34A between the common source/drain area 35C and the first (particular) source/drain area 35A is set in a region having a width about equal to that of the first gate electrode 31A.

Immediately prior to the period TP(5)$_7$ to be described later, an electric potential appearing on the data line DTL is the voltage $V_{Sig}$ of 15 volts, for example, whereas an electric potential appearing on the scan line SCL is a voltage at a high level such as 10 volts. The electric potential appearing on the data line DTL is an electric potential appearing on the wire 38 shown in FIG. 3. A voltage of 10 volts is applied to the gate electrodes 31A and 31B through the scan line SCL in order to put the video-signal write transistor $T_{Sig}$ in turned-on state. Thus, electric potential appearing on each of the first (particular) source/drain area 35A, the first channel creation area 34A, the common source/drain area 35C, the second channel creation area 34B, the second (other) source/drain area 35B, a wire 41, the shield electrode 42 and the other electrode 36 is the voltage $V_{Sig}$ of 15 volts, for example.

Then, in the period TP(5)$_7$, a voltage of −10 volts is applied to the gate electrodes 31A and 31B through the scan line SCL in order to put the video-signal write transistor $T_{Sig}$ in a turned-off state. As explained before by referring to FIGS. 38A to 38C in the description of the art related to the present invention, in this state, an electric potential appearing on the common source/drain area 35C changes to a potential on the minus side relative to the particular source/drain area 35A and other source/drain area 35B of the video-signal write transistor $T_{Sig}$. An example of the potential on the minus side relative to the particular source/drain area 35A and other source/drain area 35B of the video-signal write transistor $T_{Sig}$ is 0 volts. Thus, in this state, the common source/drain area 35C serves as a source area common to the first sub-transistor $T_{Sig\_1}$ and the second sub-transistor $T_{Sig\_2}$ whereas the first (particular) source/drain area 35A functions as the drain area of the first sub-transistor $T_{Sig\_1}$ while the second (other) source/drain area 35B functions as the drain area of the second sub-transistor $T_{Sig\_2}$.

The shield electrode 42 covers a portion included in the second channel creation area 34B as a portion close to the second (other) source/drain area 35B. In this state, an electric potential appearing on the shield electrode 42 is higher than an electric potential appearing on the common source/drain area 35C. Thus, as shown in FIG. 7A, the shield electrode 42 attracts carriers, which are each an electron in this case, in the second channel creation area 34B. As a result, a depletion layer is created in a portion included in the second channel creation area 34B as a portion close to the common source/drain area 35C so that it becomes more difficult for a leak current to flow between the second channel creation area 34B and the common source/drain area 35C. As described above, the second channel creation area 34B is a channel creation area on the side close to the second (other) source/drain area 35B forming the first node ND$_1$. Thus, electric-potential variations appearing on the first node ND$_1$ as the variations of the amount of electric charge accumulated in the capacitor C$_1$ can be effectively suppressed.

FIG. 7B is a diagram showing a model of a change caused by adding the shield electrode 42 as a typical change of a current-voltage characteristic to be described below. A solid line represents the current-voltage characteristic for a configuration including the added shield electrode 42 whereas a dashed line represents the current-voltage characteristic for a configuration including no added shield electrode 42. The horizontal axis in FIG. 7B represents a voltage $V_{31B-35C}$ applied between the second gate electrode 31B and the common source/drain area 35C. As described above, in a turned-off state, the common source/drain area 35C serves as the source area. On the other hand, the vertical axis in FIG. 7B represents a current $I_{35B-35C}$ flowing between the second (other) source/drain area 35B and the common source/drain area 35C. As described above, in a turned-off state, the second (other) source/drain area 35B serves as the drain area. Due to an electric-field effect of the shield electrode 42, which is created on the drain-area side, on the second channel creation area 34B, the threshold voltage of the second sub-transistor $T_{Sig\_2}$ formed by the second channel creation area 34B is shifted toward the minus side. Notation $V_1$ shown in FIG. 7B denotes a voltage in a turned-off state of the second sub-transistor $T_{Sig\_2}$ formed by the second channel creation area 34B with a configuration including no shield electrode 42. On the other hand, notation $V_2$ shown in FIG. 7B denotes a voltage in a turned-off state of the second sub-transistor $T_{Sig\_2}$ formed by the second channel creation area 34B with a configuration including the shield electrode 42. In the case of a configuration including the shield electrode 42, if the voltage $V_{31B-35C}$ is on the minus side relative to the voltage $V_2$ shown in FIG. 7B, the transistor is put in a turned-off state. In this turned-off state, the creation of the depletion layer described before has an effect of lowering the current $I_{35B-35C}$ represented by the solid-line graph in comparison with the current $I_{35B-35C}$ represented by the dashed-line graph. That is to say, the magnitude of the leak current in this turned-off state is reduced.

The above description explains the effect exhibited by the shield electrode 42. The following description explains a method of driving the organic EL light emitting element ELP by making use of the driving circuit according to the first embodiment. It is to be noted that a driving method making use of the 5Tr/1C driving circuit shown in FIG. 36 is the same as the driving method explained below as the driving method according to the first embodiment. It is also worth noting that a driving method according to each of the second to eighth embodiments to be described later is also the same as the driving method explained below as the driving method according to the first embodiment.

In the following description, it is assumed that a state of light emission starts immediately after completion of all various processes such as the threshold-voltage cancel process, the signal write process and the mobility correction process. It is to be noted, however, that the state of light emission may also start after the lapse of a predetermined period of time since completion of all the various processes as explained previously.

In the following description which also holds true of the second to tenth embodiments to be described later, the magnitudes of voltages and/or currents are set at values given below. However, the values are typical values merely determined for explanation purposes to the bitter end. That is to say, the magnitudes of voltages and/or currents are by no means limited to set the typical values.

$V_{Sig}$ is a video signal for controlling the luminance of the organic EL light emitting element ELP. This signal is a voltage in the range 0 to 15 volts.

$V_{CC}$ is a voltage generated by the current supply section as a voltage for controlling the light emission of the organic EL light emitting element ELP. This voltage is set at 20 volts.

$V_{Ofs}$ is a voltage for initializing an electric potential appearing on the gate electrode of the element driving transistor $T_{Drv}$, that is, for initializing an electric potential appearing on the first node $ND_1$. This voltage is set at 0 volts.

$V_{SS}$ is a voltage for initializing an electric potential appearing in the source area of the element driving transistor $T_{Drv}$, that is, for initializing an electric potential appearing on the second node $ND_2$. This voltage is set at −10 volts.

$V_{th}$ is the threshold voltage of the element driving transistor $T_{Drv}$. This voltage is 3 volts.

$V_{Cat}$ is a voltage applied to the cathode electrode of the organic EL light emitting element ELP. This voltage is 0 volts.

$V_{th-EL}$ is the threshold voltage of the organic EL light emitting element ELP. This voltage is 3 volts.

Figure 5A:
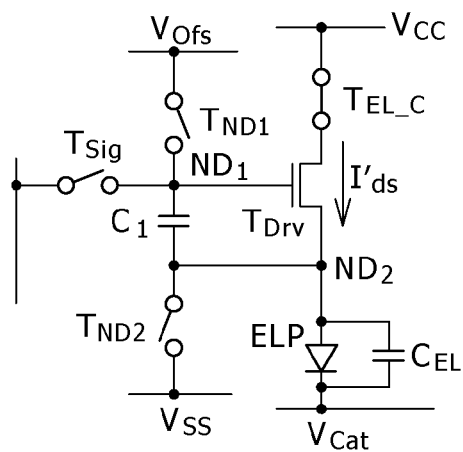
FIGS. 5A to 5D are diagrams each showing a model of the organic EL device according to the first embodiment as a model representing turned-on and turned-off states of transistors employed in the driving circuit of the organic EL device according to the first embodiment.

Period $TP(5)_{-1}$ (With Reference to FIGS. 4 and 5A)

In a period $TP(5)_{-1}$, for example, operations for the immediately preceding display frame are carried out and, after a variety of previous processes have been completed, an (n, m)th organic EL device 10 is put in a state of light emission. That is to say, a drain current $I'_{ds}$ expressed by Eq. (5) to be described later flows to the organic EL light emitting element ELP employed in the organic EL device 10 serving as an (n, m)th sub-pixel and determines the luminance of the organic EL device 10. In this period $TP(5)_{-1}$, each of the video-signal write transistor $T_{Sig}$, the first-node initialization transistor $T_{ND1}$ and the second-node initialization transistor $T_{ND2}$ is in a turned-off state whereas each of the light-emission control transistor $T_{EL\_C}$ and the element driving transistor $T_{Drv}$ is in a turned-on state. The light-emission state of the (n, m)th organic EL device 10 is continuously sustained till a time immediately prior to the start of the horizontal scan period of the organic EL device 10 located at the position of the (m+m')th row of the matrix.

Periods $TP(5)_0$ to $TP(5)_4$ shown in FIG. 4 are operation periods from completion of the light emission state following completion of the various previous processes to a time immediately prior to execution of the next signal write process. The periods $TP(5)_0$ to $TP(5)_4$ form a sequence of periods having a duration stretched for example from the beginning of the (m+m')th horizontal scan period of the immediately preceding display frame to the end of the (m−1)th horizontal scan period of the current display frame. In addition, it is also possible to provide a configuration in which the periods $TP(5)_1$ to $TP(5)_4$ are included in the mth horizontal scan period of the current display frame.

On top of that, in the periods $TP(5)_0$ to $TP(5)_4$, as a rule, the (n, m)th organic EL device 10 is in a state of no-light emission. That is to say, in the periods $TP(5)_0$ and $TP(5)_1$ and the periods $TP(5)_3$ to $TP(5)_4$, the light-emission control transistor $T_{EL\_C}$ is in a turned-off state. Thus, the organic EL device 10 does not emit light. It is to be noted that, in the period $TP(5)_2$, the light-emission control transistor $T_{EL\_C}$ is in a turned-on state. In this period, however, a threshold-voltage cancel process to be described later is carried out. As will be described later in detail in the explanation of the threshold-voltage cancel process, the organic EL device 10 does not emit light provided that, as a prerequisite, Eq. (2) to be described later is satisfied.

The following description begins with explanations of the periods $TP(5)_0$ to $TP(5)_4$. It is to be noted that the start of the period $TP(5)_1$ and the length of each of the periods $TP(5)_1$ to $TP(5)_4$ can be properly set in accordance with the design of the organic EL display apparatus.

Period $TP(5)_0$

As described before, in the period $TP(5)_0$, the (n, m)th organic EL device 10 is in a state of no-light emission. In this state, each of the video-signal write transistor $T_{Sig}$, the first-node initialization transistor $T_{ND1}$ and the second-node initialization transistor $T_{ND2}$ is in a turned-off state. In addition, at the time of a transition from the period $TP(5)_{-1}$ to the period $TP(5)_0$, the light-emission control transistor $T_{EL\_C}$ is in a turned-off state so that an electric potential appearing on the second node $ND_2$ drops to a voltage of $(V_{th-EL}+V_{Cat})$, putting the organic EL light emitting element ELP in a state of no-light emission. As explained before, the second node $ND_2$ is the source area of the element driving transistor $T_{Drv}$ or the anode electrode of the organic EL light emitting element ELP. In addition, an electric potential appearing on the first node $ND_1$, which is in a floating state, also drops to follow the electric-potential drop of the second node $ND_2$. As explained before, the first node $ND_1$ is the gate electrode of the element driving transistor $T_{Drv}$.

Figure 5B:
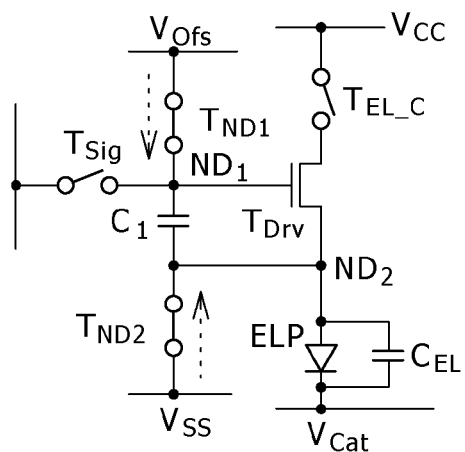
Figure 5C:
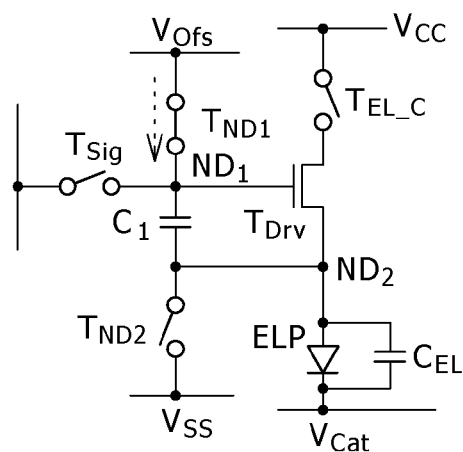

Period $TP(5)_1$ (With Reference to FIGS. 4, 5B and 5C)

In the next period $TP(5)_1$, pre-processing for execution of a threshold-voltage cancel process to be described later is carried out. That is to say, at the start of the period $TP(5)_1$, the first-node initialization transistor control circuit 104 and the second-node initialization transistor control circuit 105 operate to set the first-node initialization transistor control line $AZ_{ND1}$ and the second-node initialization transistor control line $AZ_{ND2}$ respectively at high levels putting the first-node initialization transistor $T_{ND1}$ and the second-node initialization transistor $T_{ND2}$ respectively in a turned-on state. As a result, an electric potential appearing on the first node $ND_1$ becomes the voltage $V_{Ofs}$ of 0 volts, for example, and an electric potential appearing on the second node $ND_2$ becomes the voltage $V_{SS}$ which is −10 volts, for example. In addition, prior to the end of the period $TP(5)_1$, the second-node initialization transistor control circuit 105 is driven in order to set the second-node initialization transistor control line $AZ_{ND2}$ at a low level putting the second-node initialization transistor $T_{ND2}$ in a turned-off state. It is to be noted that the first-node initialization transistor $T_{ND1}$ and the second-node initialization transistor $T_{ND2}$ can be put in a turned-on state at the same time, the first-node initialization transistor $T_{ND1}$ can be put in a turned-on state before the second-node initialization transistor $T_{ND2}$ or the second-node initialization transistor $T_{ND2}$ can be put in a turned-on state before the first-node initialization transistor $T_{ND1}$.

By carrying out the processing described above, a difference in electric potential between the gate electrode of the element driving transistor $T_{Drv}$ and the source area of the element driving transistor $T_{Drv}$ reaches a voltage at least equal to the threshold voltage $V_{th}$ of the element driving transistor $T_{Drv}$, putting the element driving transistor $T_{Drv}$ in a turned-on state.

Figure 5D:
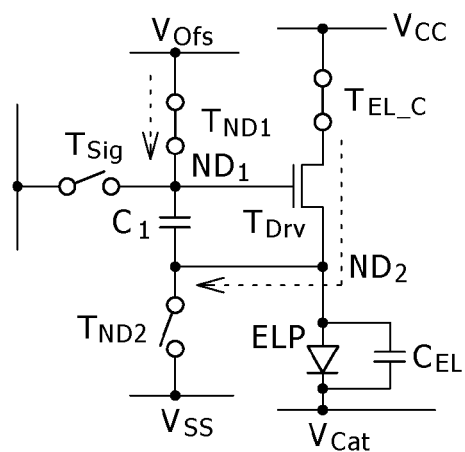

Period $TP(5)_2$ (With Reference to FIGS. 4 and 5D)

Then, during the following period $TP(5)_2$ shown in FIG. 4, a threshold-voltage cancel process is carried out. As shown in FIG. 5D, with the turned-on state of the first-node initialization transistor $T_{ND1}$ sustained as it is, at the beginning of the period $TP(5)_2$, the light-emission control transistor control circuit 103 is driven in order to raise a light-emission control transistor control line $CL_{EL\_C}$ to a high level. The light-emission control transistor control line $CL_{EL\_C}$ raised to a high level puts the light-emission control transistor $T_{EL\_C}$ in a turned-on state. As a result, an electric potential appearing on the second node $ND_2$ changes in a direction to a voltage equal to a difference obtained as a result of subtracting the threshold voltage $V_{th}$ of the element driving transistor $T_{Drv}$ from an electric potential appearing on the first node $ND_1$ even though an electric potential appearing on the first node $ND_1$ does not change. That is to say, an electric potential appearing on the second node $ND_2$, which is in a floating state, rises. Then, as the difference in electric potential between the gate electrode of the element driving transistor $T_{Drv}$ and the source area of the element driving transistor $T_{Drv}$ reaches the threshold voltage $V_{th}$ of the element driving transistor $T_{Drv}$, the element driving transistor $T_{Drv}$ is put in a turned-off state. To put it more concretely, the electric potential appearing on the second node $ND_2$, which is in a floating state, approaches a voltage difference of $(V_{Ofs}-V_{th})=-3$ volts ($>V_{SS}$) and eventually becomes equal to the voltage difference of $(V_{Ofs}-V_{th})$. In this case, if the validity of Eq. (2) given below is assured or, in other words, if an electric potential satisfying Eq. (2) is selected and determined in advance, the organic EL light emitting element ELP never emits light.

$$(V_{Ofs}-V_{th})<(V_{th-EL}+V_{Cat}) \qquad (2)$$

In the period $TP(5)_2$, the electric potential appearing on the second node $ND_2$ eventually becomes equal to the voltage difference of $(V_{Ofs}-V_{th})$. That is to say, the electric potential appearing on the second node $ND_2$ is determined, depending on only the threshold voltage $V_{th}$ of the element driving transistor $T_{Drv}$ and the voltage $V_{Ofs}$ used for initializing the gate electrode of the element driving transistor $T_{Drv}$. In other words, the electric potential appearing on the second node $ND_2$ is not dependent on the threshold voltage $V_{th-EL}$ of the organic EL light emitting element ELP.

Period $TP(5)_3$ (With Reference to FIGS. 4 and 6A)

In the following period $TP(5)_3$, with the turned-on state of the first-node initialization transistor $T_{ND1}$ sustained as it is, the light-emission control transistor control circuit 103 is driven in order to set the light-emission control transistor control line $CL_{EL\_C}$ at a low level so as to put the light-emission control transistor $T_{EL\_C}$ in a turned-off state. As a result, the electric potential appearing on the first node $ND_1$ does not change but is sustained at the voltage $V_{Ofs}$ of 0 volts and the electric potential appearing on the second node $ND_2$ in a floating state also does not change but is sustained at the voltage difference of $(V_{Ofs}-V_{th})$ which is $-3$ volts.

Period $TP(5)_4$ (With Reference to FIGS. 4 and 6B)

In the following period $TP(5)_4$, the first-node initialization transistor control circuit 104 is driven in order to set the first-node initialization transistor control line $AZ_{ND1}$ at a low level so as to put the first-node initialization transistor $T_{ND1}$ in a turned-off state. The electric potential appearing on the first node $ND_1$ and the electric potential appearing on the second node $ND_2$ virtually do not change. In actuality, the electric potential appearing on the first node $ND_1$ and the electric potential appearing on the second node $ND_2$ may change due to the effect of coupling by the parasitic capacitance $C_{gs}$ between the gate electrode of the element driving transistor $T_{Drv}$ and the source area of the element driving transistor $T_{Drv}$, and the like. However, the changes of the electric potential appearing on the first node $ND_1$ and the electric potential appearing on the second node $ND_2$ can be normally ignored.

Next, a period $TP(5)_5$ to a period $TP(5)_7$, which are shown in FIG. 4, are explained. It is to be noted that, as will be described later, in the period $TP(5)_5$, a signal write process is carried out whereas, in the period $TP(5)_6$, a mobility correction process is carried out. As described before, it is necessary to carry out the signal write process and the mobility correction process during the mth horizontal scan period. In order to make the explanation simple, in the following description, the start of the period $TP(5)_5$ and the end of period $TP(5)_6$ coincide with respectively the start and the end of the mth horizontal scan period.

Period $TP(5)_5$ (With Reference to FIGS. 4 and 6C)

In the following period $TP(5)_5$, a signal write process for the element driving transistor $T_{Drv}$ is carried out. To put it more concretely, as shown in FIG. 6C, with the turned-off states of the first-node initialization transistor $T_{ND1}$, the second-node initialization transistor $T_{ND2}$ and the light-emission control transistor $T_{EL\_C}$ sustained as they are, the video-signal outputting circuit 102 is driven in order to set an electric potential appearing on a data line DTL at a voltage corresponding to the video signal $V_{Sig}$. This voltage is thus a video signal (also referred to as a driving signal or a luminance signal) $V_{Sig}$ for controlling the luminance on the organic EL light emitting element ELP. Then, the scan circuit 101 is driven in order to put a scan line SCL at a high level so as to put a video-signal write transistor $T_{Sig}$ in a turned-on state. It is to be noted that the video-signal write transistor $T_{Sig}$ put in a turned-on state means that both the first sub-transistor $T_{Sig\_1}$ and the second sub-transistor $T_{Sig\_2}$ are in a turned-on state whereas the video-signal write transistor $T_{Sig}$ put in a turned-off state means that at least one of the first sub-transistor $T_{Sig\_1}$ and the second sub-transistor $T_{Sig\_2}$ is in a turned-off state. As a result, an electric potential appearing on the first node $ND_1$ rises to the voltage $V_{Sig}$.

Let notation $c_1$ denote the magnitude of the capacitance $c_1$ of the capacitor $C_1$, notation $C_{EL}$ denote the magnitude of the parasitic capacitance $C_{EL}$ of the organic EL light emitting element ELP and notation $c_{gs}$ denote the magnitude of a parasitic capacitance $C_{gs}$ between the gate electrode of the element driving transistor $T_{Drv}$ and a source area located on the side close to the organic EL light emitting element ELP to function as the source area of the element driving transistor $T_{Drv}$. When an electric potential appearing on the gate electrode of the element driving transistor $T_{Drv}$ rises from the voltage $V_{Ofs}$ to the voltage $V_{Sig}$ ($>V_{Ofs}$), as a rule, electric potentials appearing on both the terminals of the capacitor $C_1$ also change. The electric potentials appearing on both the terminals of the capacitor $C_1$ are an electric potential appearing on the first node $ND_1$ and an electric potential appearing on the second node $ND_2$, and the electric potential appearing on the first node $ND_1$ is an electric potential appearing on the gate electrode of the element driving transistor $T_{Drv}$. An electric charge based on a voltage change ($V_{Sig}-V_{Ofs}$) of the electric potential appearing on the gate electrode of the element driving transistor $T_{Drv}$ is distributed to the capacitance $c_1$ of the capacitor $C_1$, the parasitic capacitance $C_{EL}$ of the organic EL light emitting element ELP and the parasitic capacitance $C_{gs}$ between the gate electrode of the element driving transistor $T_{Drv}$ and the source area of the element driving transistor $T_{Drv}$. In addition, if the magnitude $C_{EL}$ of the parasitic capacitance $C_{EL}$ is sufficiently large in comparison with the capacitance $c_1$ of the capacitor $C_1$ and magnitude $c_{gs}$ of the parasitic capacitance $C_{gs}$, an electric-potential change based on the voltage change ($V_{Sig}-V_{Ofs}$) of the electric potential appearing on the gate electrode of the element driving transistor $T_{Drv}$ as a change of an electric potential appearing on the second node $ND_2$ serving as the source area of the element driving transistor $T_{Drv}$ is small. However, the magnitude $C_{EL}$ of the parasitic capacitance $C_{EL}$ of the organic EL light emitting element ELP is generally greater than the capacitance $c_1$ of the capacitor $C_1$ and the magnitude $c_{gs}$ of the parasitic capacitance $C_{gs}$ between the gate electrode of the element driving transistor $T_{Drv}$ and the source area of the element driving transistor $T_{Drv}$. Thus, in order to make the explanation simple, except for the case of a required particular configuration, the following description is given by not considering an electric-potential change caused by a change of an electric potential appearing on the first node $ND_1$ as a change of an electric potential appearing on the second node $ND_2$. This statement also holds true of other driving circuits except a 3Tr/1C driving circuit explained later as a second modified version in the ninth embodiment. Let notation $V_g$ denote an electric potential appearing on the first node $ND_1$ also serving as the gate electrode of the element driving transistor $T_{Drv}$ whereas notation $V_s$ denote an electric potential appearing on the second node $ND_2$ also serving as the source area of the element driving transistor $T_{Drv}$. The electric potentials $V_g$ and $V_s$ have values shown below. Thus, an electric potential difference $V_{gs}$ between the gate electrode of the element driving transistor $T_{Drv}$ of the element driving transistor $T_{Drv}$ and source area of the element driving transistor $T_{Drv}$ is expressed in accordance with Eq. (3). It is needless to say that the electric-potential difference $V_{gs}$ is also a difference in electric potential between the first node $ND_1$ and the second node $ND_2$.

$$V_g = V_{Sig}$$

$$V_s \approx V_{Ofs} - V_{th}$$

$$V_{gs} \approx V_{Sig} - (V_{Ofs} - V_{th}) \quad (3)$$

The electric-potential difference $V_{gs}$ obtained as a result of the signal write process carried out for the element driving transistor $T_{Drv}$ is dependent on only the voltage $V_{Sig}$ for controlling the luminance of the organic EL light emitting element ELP, the threshold voltage $V_{th}$ of the element driving transistor $T_{Drv}$ and the voltage $V_{Ofs}$ for initializing the gate electrode of the element driving transistor $T_{Drv}$. In addition, the electric-potential difference $V_{gs}$ is not dependent on the threshold voltage $V_{th-EL}$ of the organic EL light emitting element ELP.

Period $TP(5)_6$ (With Reference to FIGS. 4 and 6D)

In the following period $TP(5)_6$, a mobility correction process is carried out. The mobility correction process is a process for correcting the electric potential appearing on the second node $ND_2$ serving as the source area of the element driving transistor $T_{Drv}$ on the basis of the magnitude of the mobility $\mu$ of the element driving transistor $T_{Drv}$.

In general, the element driving transistor $T_{Drv}$ is, for example, a thin film transistor made of polysilicon. In this case, it is difficult to prevent the driving-transistor mobility $\mu$ from varying from transistor to transistor. Thus, even if the same voltage $V_{Sig}$ is applied to the gate electrodes of a plurality of element driving transistors $T_{Drv}$ having mobilities $\mu$ different from each other, an element driving transistor $T_{Drv}$ with a large mobility $\mu$ flows a large drain current $I_{ds}$ while an element driving transistor $T_{Drv}$ with a small mobility $\mu$ flows a small drain current $I_{ds}$ different from the large drain current $I_{ds}$. Such a difference in drain current $I_{ds}$ causes the screen appearing on the organic EL display apparatus to inevitably lose uniformity.

In order to solve the problem of losing screen uniformity, with the turned-on state of the element driving transistor $T_{Drv}$ sustained as it is, the light-emission control transistor control circuit 103 is driven in order to set the light-emission control transistor control line $CL_{EL\_C}$ to a high level so as to put the light-emission control transistor $T_{EL\_C}$ in a turned-on state. Then, after a time period $t_0$ determined in advance has lapsed, the scan circuit 101 is driven in order to set the scan line SCL at a low level so as to put the video-signal write transistor $T_{Sig}$ in a turned-off state and the first node $ND_1$ serving as the gate electrode of the element driving transistor $T_{Drv}$ in a floating state. As a result of these operations, the raise $\Delta V$ of the electric potential appearing in the source area of the element driving transistor $T_{Drv}$ increases if the mobility $\mu$ of the element driving transistor $T_{Drv}$ is large, or the raise $\Delta V$ of the electric potential appearing in the source area of the element driving transistor $T_{Drv}$ decreases if the mobility $\mu$ of the element driving transistor $T_{Drv}$ is small. The raise $\Delta V$ of the electric potential appearing in the source area of the element driving transistor $T_{Drv}$ is referred to as an electric-potential correction value. The expression of the electric-potential difference $V_{gs}$ between the gate electrode of the element driving transistor $T_{Drv}$ and source area of the element driving transistor $T_{Drv}$ is changed from Eq. (3) to Eq. (4) given as follows:

$$V_{gs} \approx V_{Sig} - (V_{Ofs} - V_{th}) - \Delta V \quad (4)$$

In addition, it is nice to determine the entire length to of the period $TP(5)_6$, which is the period of time it takes to carry out the mobility correction process, as a design value in advance when designing the organic EL display apparatus. In addition, the entire length to of the period $TP(5)_6$ is determined so that the electric potential of $(V_{Ofs} - V_{th} + \Delta V)$ appearing in the source area of the element driving transistor $T_{Drv}$ at that time satisfies Eq. (2') given below. In addition, the organic EL light emitting element ELP thus never emits light during the period $TP(5)_6$. On top of that, variations of a coefficient k ($\equiv (\frac{1}{2}) * (W/L) * C_{OX}$) is also corrected as well at the same time as the mobility correction process.

$$(V_{Ofs} - V_{th} + \Delta V) < (V_{th-EL} + V_{Cat}) \quad (2')$$

Period $TP(5)_7$ (With Reference to FIGS. 4 and 6E)

At the end of the execution of the operations described above, the threshold-voltage cancel process, the signal write process and the mobility correction process are completed. By the way, as a result of the operation carried out by the scan circuit 101 to set the scan line SCL at a low level, the video-signal write transistor $T_{Sig}$ is put in a turned-off state whereas the first node $ND_1$ serving as the gate electrode of the element driving transistor $T_{Drv}$ is put in a floating state. On the other hand, the turned-on state of the light-emission control transistor $T_{EL\_C}$ is sustained in order to keep the drain area of the light-emission control transistor $T_{EL\_C}$ in a state of being connected to the current supply section 100 for controlling the light emission of the organic EL light emitting element ELP by generating the voltage $V_{CC}$ of 20 volts, for example. Thus, as a result, an electric potential appearing on the second node $ND_2$ rises.

As described above, the gate electrode of the element driving transistor $T_{Drv}$ is put in a floating state and, on top of that, the capacitor $C_1$ exists. Thus, the same phenomenon as that of the so-called bootstrap circuit occurs at the gate electrode of the element driving transistor $T_{Drv}$, also raising an electric potential appearing on the first node $ND_1$ as well. As a result, the electric-potential difference $V_{gs}$ between the gate electrode of the element driving transistor $T_{Drv}$ and source area of the element driving transistor $T_{Drv}$ is kept at a value expressed by Eq. (4).

In addition, as the electric potential appearing on the second node $ND_2$ increases, exceeding a level represented by an expression of $(V_{th-EL} + V_{Cat})$, the organic EL light emitting element ELP starts emission of light. At that time, the drain current $I_{ds}$ flowing from the drain area of the element driving transistor $T_{Drv}$ to the source area of the element driving transistor $T_{Drv}$ is flowing through the organic EL light emitting element ELP. Thus, the drain current $I_{ds}$ flowing through the organic EL light emitting element ELP can be expressed by Eq. (1). On the basis of Eqs. (1) to (4), Eq. (1) can be modified to Eq. (5) given as follows:

$$I_{ds} = k * \mu * (V_{Sig} - V_{Ofs} - \Delta V)^2 \quad (5)$$

Thus, if the voltage $V_{Ofs}$ is set at 0 volts for example, the drain current $I_{ds}$ flowing through the organic EL light emitting element ELP is proportional to the square of a difference obtained as a result of subtracting the electric-potential correction value $\Delta V$ based on the mobility $\mu$ of the element driving transistor $T_{Drv}$ from the value of the video signal $V_{Sig}$ for controlling the luminance of the organic EL light emitting element ELP. As described earlier, the electric-potential correction value ΔV is a value for correcting the electric potential appearing on the second node $ND_2$ serving as the source area of the element driving transistor $T_{Drv}$. In other words, the drain current $I_{ds}$ flowing through the organic EL light emitting element ELP does not depend on the threshold voltage $V_{th-EL}$ of the organic EL light emitting element ELP and the threshold voltage $V_{th}$ of the element driving transistor $T_{Drv}$. That is to say, the luminance exhibited by the organic EL light emitting element ELP as a quantity representing the amount of light emitted by the organic EL light emitting element ELP is not affected by the threshold voltage $V_{th-EL}$ of the organic EL light emitting element ELP and the threshold voltage $V_{th}$ of the element driving transistor $T_{Drv}$. Thus, the luminance of the (n, m)th organic EL device 10 is a quantity determined by the drain current $I_{ds}$.

In addition, the larger the mobility μ of the element driving transistor $T_{Drv}$, the larger the electric-potential correction value ΔV and, hence, the smaller the quantity described on the left-hand side of Eq. (4) as a quantity representing the electric-potential difference $V_{gs}$. Thus, even if the mobility μ of the element driving transistor $T_{Drv}$ increases, the value of an expression of $(V_{Sig}-V_{Ofs}-\Delta V)^2$ decreases. As a result, the drain current $I_{ds}$ can be corrected. That is to say, even for the organic EL devices 10 employing element driving transistors $T_{Drv}$ with mobilities μ different from each other, if the same voltage $V_{Sig}$ is supplied to the organic EL devices 10, the drain currents $I_{ds}$ flowing through the element driving transistors $T_{Drv}$ will be equal to each other. As a result, the drain currents $I_{ds}$ flowing through the organic EL light emitting elements ELP employed in the organic EL devices 10 as currents each used for controlling the luminance of the organic EL light emitting element ELP can be made uniform. That is to say, it is possible to eliminate variations caused by variations of the mobility μ and also caused by variations of the coefficient k as variations of the luminance of the organic EL light emitting element ELP.

The light-emission state of the organic EL light emitting element ELP is sustained continuously till the (m+m'−1)th horizontal scan period. That is to say, the light-emission state of the organic EL light emitting element ELP is terminated at the end of the period $TP(5)_{-1}$.

At the end of the period $TP(5)_{-1}$, the (n, m)th sub-pixel serving as a organic EL device 10 completes the light emitting operation.

Second Embodiment

A second embodiment also implements an organic EL display apparatus according to the first embodiment of the present invention and an organic EL device 10 employed in the organic EL display apparatus as an organic EL device 10 according to the first embodiment of the present invention.

The second embodiment is obtained by modifying the first embodiment. The second embodiment is different from the first embodiment in that, in the case of the second embodiment, in addition to the shield electrode 42 explained before in the description of the first embodiment, the second sub-transistor $T_{Sig\_2}$ is further provided with a second shield electrode 43.

FIG. 2 can also be referred to as a conceptual diagram showing the organic EL display apparatus according to the second embodiment. FIG. 8 is a diagram showing an equivalent circuit of a driving circuit employed in the organic EL device 10 according to the second embodiment. FIG. 9A is a diagram showing a model representing a partial cross section of a portion of the organic EL device 10 according to the second embodiment whereas FIG. 9B is a diagram corresponding to the diagram of FIG. 7A. That is to say, FIG. 9B is a diagram showing a model of states developed in vicinities of the second channel creation area 34B when the video-signal write transistor $T_{Sig}$ is put in a turned-off state during a period $TP(5)_7$.

Timing charts of driving operations carried out by the driving circuit according to the second embodiment are identical with the timing charts shown in FIG. 4. In addition, models of turned-on and turned-off states of the transistors are identical with those shown in FIGS. 5A to 5D and 6A to 6E. These statements also hold true of the third to eighth embodiments to be described later.

As shown in FIGS. 8 and 9A, in the case of the second embodiment, the second sub-transistor $T_{Sig\_2}$ is provided with the shield electrode 42 of the first embodiment described earlier as well as the second shield electrode 43 facing the other face of the second channel creation area 34B of the second sub-transistor $T_{Sig\_2}$ through the shield insulation layer 40 sandwiched by the second shield electrode 43 and the other face of the second channel creation area 34B. In order to distinguish the shield electrode 42 and the second shield electrode 43 from each other, in the following description, the shield electrode 42 is also referred to as a first shield electrode 42. The second shield electrode 43 is connected to the common source/drain area 35C through a contact hole created by boring the shield insulation layer 40. As explained before, the common source/drain area 35C is an area in which the other source/drain area of the first sub-transistor $T_{Sig\_1}$ and the particular source/drain area of the second sub-transistor $T_{Sig\_2}$ overlap each other. Much like the first shield electrode 42, the second shield electrode 43 can also be created by adopting any one of a variety of generally known methods.

Except for the addition of the second shield electrode 43 described above, the component structures/configurations of the organic EL display apparatus according to the second embodiment, the organic EL device 10 employed in the organic EL display apparatus as the organic EL device according to the second embodiment and the driving circuit employed in the organic EL device are the same as those of the first embodiment. In addition, operations carried out by the driving circuit employed in the organic EL device according to the second embodiment and a method to operate the driving circuit are identical with those of the first embodiment. It is thus unnecessary to repeat the description of the operations and the method so as to avoid duplication.

In the case of the second embodiment, in addition to the effect of the first shield electrode 42 also included in the first embodiment, the second shield electrode 43 connected to the common source/drain area 35C also has an effect on the second channel creation area 34B. As described above, in a turned-off state, an electric potential appearing on the common source/drain area 35C is lower than an electric potential appearing on the first shield electrode 42. Thus, in comparison with the first embodiment, the degree to which the threshold voltage of the second sub-transistor $T_{Sig\_2}$ is shifted in a direction toward the minus side is relatively low. As a result, the voltage $V_2$ shown in FIG. 7B explained previously is shifted in a direction to the voltage $V_1$. Therefore, the absolute value of a voltage to be applied to the second gate electrode 31B in order to put the second sub-transistor $T_{Sig\_2}$ in a turned-off state is smaller than that of the first embodiment. That is to say, it is possible to reduce the amplitude of a signal applied to the gate electrode of the video-signal write transistor $T_{Sig}$ to a value smaller than the amplitude for the first embodiment. In this case, the amplitude is a difference between the so-called on voltage and the so-called off voltage.

Third Embodiment

A third embodiment also implements an organic EL display apparatus according to the first embodiment of the present invention and an organic EL device 10 employed in the organic EL display apparatus as an organic EL device 10 according to the first embodiment of the present invention.

The third embodiment is also obtained by modifying the first embodiment. The third embodiment is different from the first embodiment in that, in the case of the third embodiment, the first sub-transistor $T_{Sig\_1}$ is further provided with a third shield electrode 44.

FIG. 2 can also be referred to as a conceptual diagram showing the organic EL display apparatus according to the third embodiment. FIG. 10A is a diagram showing an equivalent circuit of a driving circuit employed in the organic EL device 10 according to the third embodiment. FIG. 10B is a diagram showing a model representing a partial cross section of a portion of the organic EL device 10 according to the third embodiment.

As shown in FIGS. 10A and 10B, the third embodiment is different from the first embodiment in that, in the case of the third embodiment, in addition to the first shield electrode 42 explained before in the description of the first embodiment, the first sub-transistor $T_{Sig\_1}$ is further provided with a third shield electrode 44 facing the other face of the first (particular) channel creation area 34A of the first sub-transistor $T_{Sig\_1}$ through the shield insulation layer 40 sandwiched by the third shield electrode 44 and the other face of the first channel creation area 34A. The third shield electrode 44 is connected to the first (particular) source/drain area 35A of the first sub-transistor $T_{Sig\_1}$. To put it more concretely, in the third embodiment, an extension from the wire 38 connected to the first (particular) source/drain area 35A is the third shield electrode 44. Much like the first shield electrode 42, the third shield electrode 44 can also be created by adopting any one of a variety of generally known methods.

Except for the addition of the third shield electrode 44 described above, the component structures/configurations of the organic EL display apparatus according to the third embodiment, the organic EL device 10 employed in the organic EL display apparatus as the organic EL device according to the third embodiment and the driving circuit employed in the organic EL device are the same as those of the first embodiment. In addition, operations carried out by the driving circuit employed in the organic EL device according to the third embodiment and a method to operate the driving circuit are identical with those of the first embodiment. It is thus unnecessary to repeat the description of the operations and the method so as to avoid duplications.

In addition to the effect exhibited by the first embodiment as explained previously, in the case of the third embodiment, the third shield electrode 44 also has the same effect on the first channel creation area 34A as the effect described before by referring to FIGS. 7A and 7B as the effect demonstrated by the first embodiment. To put it more concretely, a model of states developed in vicinities of the first channel creation area 34A with the video-signal write transistor $T_{Sig}$ put in a turned-off state can be obtained from the model shown in FIG. 7A by replacing notations 31B, 34B and 35B with notations 31A, 34A and 35A respectively. In this model of states developed in vicinities of the first channel creation area 34A, a depletion layer is created also in a portion included in the first channel creation area 34A as a portion close to the common source/drain area 35C so that it becomes more difficult for a leak current to flow between the first channel creation area 34A and the common source/drain area 35C.

If an electric potential appearing in the common source/drain area 35C changes due to, among others, a leak current flowing through the first channel creation area 34A, the effect of the change in electric potential will become eventually an effect on an electric potential appearing on the first node $ND_1$. In the case of the third embodiment, the magnitude of the leak current is decreased. Thus, the effect can also be suppressed as well.

Fourth Embodiment

A fourth embodiment also implements an organic EL display apparatus according to the first embodiment of the present invention and an organic EL device 10 employed in the organic EL display apparatus as an organic EL device 10 according to the first embodiment of the present invention.

The fourth embodiment is also obtained by modifying the first embodiment. The fourth embodiment is different from the first embodiment in that, in the case of the fourth embodiment, the first sub-transistor $T_{Sig\_1}$ is further provided with a third shield electrode 44 and a fourth shield electrode 45 whereas the second sub-transistor $T_{Sig\_2}$ is further provided with a second shield electrode 43.

FIG. 2 can also be referred to as a conceptual diagram showing the organic EL display apparatus according to the fourth embodiment. FIG. 11A is a diagram showing an equivalent circuit of a driving circuit employed in the organic EL device 10 according to the fourth embodiment. FIG. 11B is a diagram showing a model representing a partial cross section of a portion of the organic EL device 10 according to the fourth embodiment.

As shown in FIGS. 11A and 11B, in the case of the fourth embodiment, the second sub-transistor $T_{Sig\_2}$ is provided with the first shield electrode 42 in the same way as the first embodiment described earlier as well as a second shield electrode 43 also facing the other face of the second channel creation area 34B of the second sub-transistor $T_{Sig\_2}$ through the shield insulation layer 40 sandwiched by the second shield electrode 43 and the other face of the second channel creation area 34B. In addition, the first sub-transistor $T_{Sig\_1}$ is provided with the third shield electrode 44 in the same way as the third embodiment and a fourth shield electrode 45 also facing the other face of the first channel creation area 34A of the first sub-transistor $T_{Sig\_1}$ through the shield insulation layer 40 sandwiched by the fourth shield electrode 45 and the other face of the first channel creation area 34A. The second shield electrode 43 and the fourth shield electrode 45 are connected to the common source/drain area 35C which is, as explained before, an area in which the other source/drain area of the first sub-transistor $T_{Sig\_1}$ and the particular source/drain area of the second sub-transistor $T_{Sig\_2}$ overlap each other. The third shield electrode 44 is connected to the first (particular) source/drain area 35A of the first sub-transistor $T_{Sig\_1}$.

The connections and structure of the second shield electrode 43 are the same as those in the second embodiment. On the other hand, the connections and structure of the third shield electrode 44 are the same as those in the third embodiment.

The fourth shield electrode 45 is connected to the common source/drain area 35C of the video-signal write transistor $T_{Sig}$ in the same way as the second shield electrode 43. Much like the first shield electrode 42, the fourth shield electrode 45 can also be created by adopting any one of a variety of generally known methods.

Except for the addition of the second shield electrode 43, the third shield electrode 44 and the fourth shield electrode 45 which are described above, the component structures/configurations of the organic EL display apparatus according to the fourth embodiment, the organic EL device 10 employed in the organic EL display apparatus as the organic EL device according to the fourth embodiment and the driving circuit employed in the organic EL device are the same as those of the first embodiment. In addition, operations carried out by the driving circuit employed in the organic EL device according to the fourth embodiment and a method to operate the driving circuit are identical with those of the first embodiment. It is thus unnecessary to repeat the description of the operations and the method.

The configuration of the second sub-transistor $T_{Sig\_2}$ in the fourth embodiment is identical with the second sub-transistor $T_{Sig\_2}$ in the second embodiment explained before. In addition, the configuration of the first sub-transistor $T_{Sig\_1}$ in the fourth embodiment is also identical with the second sub-transistor $T_{Sig\_2}$ in the second embodiment. Thus, the degree to which the threshold voltage of the first sub-transistor $T_{Sig\_1}$ is shifted in a direction toward the minus side is relatively low. Therefore, much like the second embodiment described earlier, it is possible to reduce the amplitude of a signal applied to the gate electrode of the video-signal write transistor $T_{Sig}$ to a value smaller than the amplitude for the first embodiment.

Fifth Embodiment

Each of a fifth embodiment, sixth to eighth embodiments to be described later and a tenth embodiment also to be described later implements an organic EL display apparatus according to the second embodiment of the present invention and an organic EL device 10 employed in the organic EL display apparatus as an organic EL device 10 according to the second embodiment of the present invention. It is to be noted that, in order to make it easy to compare the fifth to eighth embodiments with the first to fourth embodiments respectively, each of the fifth to eighth embodiments is explained by assuming that each of the driving circuits in these embodiments employs five transistors and one capacitor.

FIG. 2 can also be referred to as a conceptual diagram showing the organic EL display apparatus according to the fifth embodiment. FIG. 12A is a diagram showing an equivalent circuit of a driving circuit employed in the organic EL device 10 according to the fifth embodiment. FIG. 12B is a diagram showing a model representing a partial cross section of a portion including the first-node initialization transistor $T_{ND1}$ employed in the organic EL device 10 according to the fifth embodiment. The first-node initialization transistor $T_{ND1}$ included in the driving circuit employed in the organic EL device 10 according to the fifth embodiment has the same structure as the video-signal write transistor $T_{Sig}$ of the first embodiment explained before.

As shown in FIG. 12A, in the video-signal write transistor $T_{Sig}$, (B-1) a source/drain area provided on a particular side of the video-signal write transistor $T_{Sig}$ as the particular source/drain area of the transistor $T_{Sig}$ is connected to one of the data lines DTL;

(B-2) a source/drain area provided on the other side of the video-signal write transistor $T_{Sig}$ as the other source/drain area of the transistor $T_{Sig}$ is connected to the gate electrode of the element driving transistor $T_{Drv}$ and the other electrode of the capacitor $C_1$, forming a first node $ND_1$; and (B-3) the gate electrode of the video-signal write transistor $T_{Sig}$ is connected to one of the scan lines SCL.

Connections of the video-signal write transistor $T_{Sig}$ in the sixth to eighth embodiments and the tenth embodiment, which are to be described later, are the same as the above connections in the fifth embodiment.

As shown in FIG. 12B, the transistors and the capacitor $C_1$ which compose the driving circuit in the fifth embodiment are created on a support body 20 whereas the organic EL light emitting element ELP is created over the transistors and the capacitor, which are employed in the driving circuit, being separated from the transistors and the capacitor by an inter-layer insulation layer 46 or the like. With regard to the creation of the transistors, the capacitor $C_1$ and the organic EL light emitting element ELP, the sixth to eighth embodiments and the tenth embodiment, which are to be described later, are the same as the fifth embodiment. It is to be noted that each of the cross section of FIG. 12B as well as cross sections of FIGS. 13B, 14B and 15B to be described later shows only the first-node initialization transistor $T_{ND1}$. This is because the transistors other than the first-node initialization transistor $T_{ND1}$ are provided at hidden locations so that these other transistors are invisible.

As shown in FIG. 12A, the driving circuit employs the first-node initialization transistor $T_{ND1}$. The first-node initialization transistor $T_{ND1}$ includes a semiconductor layer 133 as well as source/drain areas and a channel creation area between the source/drain areas. The source/drain areas and the channel creation area are created on the semiconductor layer 133. As shown in FIGS. 12A and 12B, in the fifth embodiment, the first-node initialization transistor $T_{ND1}$ has a dual-gate structure which includes a first sub-transistor $T_{ND1\_1}$ and a second sub-transistor $T_{ND1\_2}$. The first sub-transistor $T_{ND1\_1}$ includes a first gate electrode 131A, a first source/drain area 135A and a first channel creation area 134A. By the same token, the second sub-transistor $T_{ND1\_2}$ includes a second gate electrode 131B, a second source/drain area 135B and a second channel creation area 134B. In addition, the first sub-transistor $T_{ND1\_1}$ and the second sub-transistor $T_{ND1\_2}$ share a common source/drain area 135C to be used as a source/drain area common to the first sub-transistor $T_{ND1\_1}$ and the second sub-transistor $T_{ND1\_2}$. As shown in FIG. 12B, the first channel creation area 134A is provided between the first source/drain area 135A and the common source/drain area 135C whereas the second channel creation area 134B is provided between the common source/drain area 135C and the second source/drain area 135B. The configurations of the sixth to eighth embodiments to be described later are identical with the configuration described above as the configuration of the fifth embodiment.

As shown in FIG. 12B, each of the first source/drain area 135A, the second source/drain area 135B and the common source/drain area 135C is an area provided on the semiconductor layer 133. The common source/drain area 35C is an area in which the other source/drain area of the first-node initialization transistor $T_{ND1}$ and the particular source/drain area of the second-node initialization transistor $T_{ND2}$ overlap each other. The first (particular) source/drain area 135A of the first sub-transistor $T_{ND1\_1}$ is connected to a first-node initialization voltage supply line $PS_{ND1}$ which is shown as a wire 138 in FIG. 12B. The second (other) source/drain area 135B of the second sub-transistor $T_{ND1\_2}$ is connected to the first node $ND_1$. To put it more concretely, the second (other) source/drain area 135B of the second sub-transistor $T_{ND1\_2}$ is connected to the first node $ND_1$ which is the other electrode 36 of the capacitor $C_1$ as shown in FIG. 12B. Thus, the second (other) source/drain area 135B of the second sub-transistor $T_{ND1\_2}$ is also virtually the first node $ND_1$. The first gate electrode 131A of the first sub-transistor $T_{ND1\_1}$ and the second gate electrode 131B of the second sub-transistor $T_{ND1\_2}$ are connected a first-node initialization transistor control line $AZ_{ND1}$. The first gate electrode 131A of the first sub-transistor $T_{ND1\_1}$ faces a particular face of the first channel creation area 134A of the first sub-transistor $T_{ND1\_1}$ through a gate insulation layer 132 sandwiched by the first gate electrode 131A and the particular face of the first channel creation area 134A. By the same token, the second gate electrode 131B of the second sub-transistor $T_{ND1\_2}$ faces the particular face of the second channel creation area 134B of the second sub-transistor $T_{ND1\_2}$ through the gate insulation layer 132 sandwiched by the second gate electrode 131B and the particular face of the second channel creation area 134B. The description given above as description of the fifth embodiment also holds true of the sixth to eighth embodiments and the tenth embodiment, which are to be described later.

The second sub-transistor $T_{ND1\_2}$ is provided with a shield electrode 142 facing the other face of the second channel creation area 134B of the second sub-transistor $T_{ND1\_2}$ through a shield insulation layer 140 sandwiched by the shield electrode 142 and the other face of the second channel creation area 134B. The shield electrode 142 is connected to the second (other) source/drain area 135B of the second sub-transistor $T_{ND1\_2}$. To put it more concretely, in the fifth embodiment, an extension from a wire 141 connected to the second (other) source/drain area 135B is the shield electrode 142. The configurations of the sixth to eighth embodiments to be described later are identical with the configuration described above as the configuration of the fifth embodiment.

It is to be noted that that each of the other transistors including the element driving transistor $T_{Drv}$ also has a configuration including a semiconductor layer, a gate insulation film and a gate electrode in the same way as what is described above. In addition, each of the other transistors in the sixth to eighth embodiments and the tenth embodiment, which are to be described later, has the same configuration as each of the other transistors in the fifth embodiment.

The capacitor $C_1$ employed in the fifth embodiment can be explained in the same description as the explanation of the capacitor $C_1$ explained before in the description of the first embodiment except that the gate insulation layer 32 in the explanation is replaced with a gate insulation layer 132. Thus, no description of the capacitor $C_1$ employed in the fifth embodiment is given in order to avoid duplications. With regard to the capacitor $C_1$, each of the sixth to eighth embodiments and the tenth embodiment, which are to be described later, is the same as the fifth embodiment.

Operations to turn on and off the first-node initialization transistor $T_{ND1}$ are controlled by a signal appearing on the first-node initialization transistor control line $AZ_{ND1}$ connected to the gate electrodes 131A and 131B of the first-node initialization transistor $T_{ND1}$. A voltage $V_{Ofs}$ for initializing the first node $ND_1$ is applied to the first-node initialization voltage supply line $PS_{ND1}$. This description also holds true of each of the sixth to eighth embodiments and the tenth embodiment, which are to be described later.

The component structures/configurations of the organic EL display apparatus according to the fifth embodiment, the organic EL device 10 employed in the organic EL display apparatus as the organic EL device according to the fifth embodiment and the driving circuit employed in the organic EL device are the same as those of the first embodiment. In addition, operations carried out by the driving circuit employed in the organic EL device according to the fifth embodiment and a method to operate the driving circuit are identical with those of the first embodiment. It is thus unnecessary to repeat the description of the driving operations and the driving method in order to avoid duplications. This description of the fifth embodiment also holds true of each of the sixth to eighth embodiments and the tenth embodiment, which are to be described later.

When the first-node initialization transistor $T_{ND1}$ employed in the driving circuit of the organic EL device according to the fifth embodiment makes a transition from a turned-on state to a turned-off state, a phenomenon occurs. This phenomenon is virtually identical with the phenomenon described earlier for the video-signal write transistor $T_{Sig}$ in the first embodiment. It is to be noted that the first-node initialization transistor $T_{ND1}$ put in a turned-on state means that both the first sub-transistor $T_{ND1\_1}$ and the second sub-transistor $T_{ND1\_2}$ are in a turned-on state whereas the first-node initialization transistor $T_{ND1}$ put in a turned-off state means that at least one of the first sub-transistor $T_{ND1\_1}$ and the second sub-transistor $T_{ND1\_2}$ is in a turned-off state. That is to say, an electric potential appearing in the common source/drain area 135C changes to a potential on the minus side relative to an electric potential appearing in the first (particular) source/drain area 135A of the first sub-transistor $T_{ND1\_1}$ and an electric potential appearing in the other second (other) source/drain area 135B of the second sub-transistor $T_{ND1\_2}$. Thus, in this state, the common source/drain area 135C becomes the source area common to the first sub-transistor $T_{ND1\_1}$ and the second sub-transistor $T_{ND1\_2}$ whereas the first (particular) source/drain area 135A becomes the drain area of the first sub-transistor $T_{ND1\_1}$ while the second (other) source/drain area 135B becomes the drain area of the second sub-transistor $T_{ND1\_2}$.

Therefore, as explained previously in the description of the first embodiment, the shield electrode 142 attracts carriers, which are electrons in this case, in the second channel creation area 134B. As a result, a depletion layer is created in a portion included in the second channel creation area 134B as a portion close to the common source/drain area 135C so that it becomes more difficult for a leak current to flow between the second channel creation area 134B and the common source/drain area 135C. As described above, the second channel creation area 134B is a channel creation area on the side close to the second (other) source/drain area 135B virtually forming the first node $ND_1$. Thus, electric-potential variations appearing on the first node $ND_1$ as the variations of the amount of electric charge accumulated in the capacitor $C_1$ can be effectively suppressed.

Since a change caused by the addition of the shield electrode 142 as a change in current-voltage characteristic is the same as what has been described before by referring to FIG. 7B for the first embodiment, a description of such a change for the fifth embodiment is not given in order to avoid duplications.

The video-signal write transistor $T_{Sig}$ employed in the organic EL device shown in FIG. 12A is designed as a transistor having a single-gate structure. It is to be noted, however, that the video-signal write transistor $T_{Sig}$ does not have to be designed as a transistor having a single-gate structure. That is to say, the video-signal write transistor $T_{Sig}$ employed in the organic EL device according to the fifth embodiment can also be designed as a transistor having a dual-gate structure much like the first to fourth embodiments. The video-signal write transistor $T_{Sig}$ employed in the organic EL device according to each of the sixth, seventh, eighth and tenth embodiments to be explained later by referring to FIGS. 13A to 15B and 31 respectively can also be designed as a transistor having a dual-gate structure much like the first to fourth embodiments.

Sixth Embodiment

The sixth embodiment also implements an organic EL display apparatus according to the second embodiment of the present invention and an organic EL device 10 employed in the organic EL display apparatus as an organic EL device 10 according to the second embodiment of the present invention.

FIG. 2 can also be referred to as a conceptual diagram showing the organic EL display apparatus according to the sixth embodiment. FIG. 13A is a diagram showing an equivalent circuit of a driving circuit employed in the organic EL device 10 according to the sixth embodiment. FIG. 13B is a diagram showing a model representing a partial cross section of a portion including the first-node initialization transistor $T_{ND1}$ employed in the organic EL device 10 according to the sixth embodiment. The first-node initialization transistor $T_{ND1}$ included in the driving circuit employed in the organic EL device 10 according to the sixth embodiment has the same structure as the video-signal write transistor $T_{Sig}$ of the second embodiment explained before.

As shown in FIGS. 13A and 13B, in the case of the sixth embodiment, the second sub-transistor $T_{ND1\_2}$ is provided with the shield electrode 142 of the fifth embodiment described earlier as well as a second shield electrode 143 facing the other face of the second channel creation area 134B of the second sub-transistor $T_{ND1\_2}$ through the shield insulation layer 140 sandwiched by the second shield electrode 143 and the other face of the second channel creation area 134B. In order to distinguish the shield electrode 142 and the second shield electrode 143 from each other, in the following description, the shield electrode 142 is also referred to as a first shield electrode 142. The second shield electrode 143 is connected to the common source/drain area 135C through a contact hole created by boring the shield insulation layer 140. As explained before, the common source/drain area 135C is an area in which the other source/drain area of the first sub-transistor $T_{ND1\_1}$ and the particular source/drain area of the second sub-transistor $T_{ND1\_2}$ overlap each other. Much like the first shield electrode 142, the second shield electrode 143 can also be created by adopting any one of a variety of generally known methods.

In the case of the sixth embodiment, in addition to the effect of the first shield electrode 142 also included in the fifth embodiment, the second shield electrode 143 connected to the common source/drain area 135C also has an effect on the second channel creation area 134B. As described above, in a turned-off state, an electric potential appearing on the common source/drain area 135C is lower than an electric potential appearing on the first shield electrode 142. Thus, in comparison with the fifth embodiment, the degree to which the threshold voltage of the second sub-transistor $T_{ND1\_2}$ is shifted in a direction toward the minus side is relatively low much like the second embodiment. As a result, much like the second embodiment, the absolute value of a voltage to be applied to the second gate electrode 131B in order to put the second sub-transistor $T_{ND1\_2}$ in a turned-off state is smaller than that of the fifth embodiment. That is to say, it is possible to reduce the amplitude of a signal applied to the gate electrode of the first-node initialization transistor $T_{ND1}$ to a value smaller than the amplitude for the fifth embodiment.

Seventh Embodiment

A seventh embodiment also implements an organic EL display apparatus according to the second embodiment of the present invention and an organic EL device 10 employed in the organic EL display apparatus as an organic EL device 10 according to the second embodiment of the present invention.

FIG. 2 can also be referred to as a conceptual diagram showing the organic EL display apparatus according to the seventh embodiment. FIG. 14A is a diagram showing an equivalent circuit of a driving circuit employed in the organic EL device 10 according to the seventh embodiment. FIG. 14B is a diagram showing a model representing a partial cross section of a portion including the first-node initialization transistor $T_{ND1}$ employed in the organic EL device 10 according to the seventh embodiment. The first-node initialization transistor $T_{ND1}$ included in the driving circuit employed in the organic EL device 10 according to the seventh embodiment has the same structure as the video-signal write transistor $T_{Sig}$ of the third embodiment explained before.

As shown in FIGS. 14A and 14B, the seventh embodiment is different from the fifth embodiment in that, in the case of the seventh embodiment, in addition to the first shield electrode 142 employed in the fifth embodiment, the first sub-transistor $T_{ND1\_1}$ is further provided with a third shield electrode 144 facing the other face of the first channel creation area 134A of the first sub-transistor $T_{ND1\_1}$ through the shield insulation layer 140 sandwiched by the third shield electrode 144 and the other face of the first channel creation area 134A. The third shield electrode 144 is connected to the first (particular) source/drain area 135A of the first sub-transistor $T_{ND1\_1}$. To put it more concretely, in the seventh embodiment, an extension from the wire 138 connected to the first (particular) source/drain area 135A is the third shield electrode 144. Much like the first shield electrode 142, the third shield electrode 144 can also be created by adopting any one of a variety of generally known methods.

In addition to the effect exhibited by the fifth embodiment as explained previously, much like the third embodiment described above, in the case of the seventh embodiment, the third shield electrode 144 also has the same effect on the first channel creation area 134A as the effect described before by referring to FIGS. 7A and 7B as the effect demonstrated by the first embodiment. Thus, a depletion layer is created also in a portion included in the first channel creation area 134A as a portion close to the common source/drain area 135C so that it becomes more difficult for a leak current to flow between the first channel creation area 134A and the common source/drain area 135C.

If an electric potential appearing in the common source/drain area 135C changes due to, among others, a leak current flowing through the first channel creation area 134A as is the case of the third embodiment, the effect of the change in electric potential will become eventually an effect on an electric potential appearing on the first node $ND_1$. In the case of the seventh embodiment, however, the magnitude of the leak current is decreased. Thus, the effect can also be suppressed as well.

Eighth Embodiment

An eighth embodiment also implements an organic EL display apparatus according to the second embodiment of the present invention and an organic EL device 10 employed in the organic EL display apparatus as an organic EL device 10 according to the second embodiment of the present invention.

FIG. 2 can also be referred to as a conceptual diagram showing the organic EL display apparatus according to the eighth embodiment. FIG. 15A is a diagram showing an equivalent circuit of a driving circuit employed in the organic EL device 10 according to the eighth embodiment. FIG. 15B is a diagram showing a model representing a partial cross section of a portion including the first-node initialization transistor $T_{ND1}$ employed in the organic EL device 10 according to the eighth embodiment. The first-node initialization transistor $T_{ND1}$ included in the driving circuit employed in the organic EL device 10 according to the eighth embodiment has the same structure as the video-signal write transistor $T_{Sig}$ of the fourth embodiment explained before.

As shown in FIGS. 15A and 15B, in the case of the eighth embodiment, the second sub-transistor $T_{ND1\_2}$ is provided with the first shield electrode 142 in the same way as the fifth embodiment described earlier as well as a second shield electrode 143 also facing the other face of the second channel creation area 134B of the second sub-transistor $T_{ND1\_2}$ through the shield insulation layer 140 sandwiched by the second shield electrode 143 and the other face of the second channel creation area 134B. In addition, the first sub-transistor $T_{ND1\_1}$ is provided with the third shield electrode 144 of the seventh embodiment and a fourth shield electrode 145 also facing the other face of the first channel creation area 134A of the first sub-transistor $T_{ND1\_1}$ through the shield insulation layer 140 sandwiched by the fourth shield electrode 145 and the other face of the first channel creation area 134A. The second shield electrode 143 and the fourth shield electrode 145 are connected to the common source/drain area 135C which is, as explained before, an area in which the other source/drain area of the first sub-transistor $T_{ND1\_1}$ and the particular source/drain area of the second sub-transistor $T_{ND1\_2}$ overlap each other. The third shield electrode 144 is connected to the first (particular) source/drain area 135A of the first sub-transistor $T_{ND1\_1}$.

The connections and structure of the second shield electrode 143 are the same as those in the sixth embodiment. On the other hand, the connections and structure of the third shield electrode 144 are the same as those in the seventh embodiment.

The fourth shield electrode 145 is connected to the common source/drain area 135C of the first-node initialization transistor $T_{ND1}$ in the same way as the second shield electrode 143. Much like the first shield electrode 142, the fourth shield electrode 145 can also be created by adopting any one of a variety of generally known methods.

The configuration of the second sub-transistor $T_{ND1\_2}$ in the eighth embodiment is identical with the second sub-transistor $T_{ND1\_2}$ in the sixth embodiment explained before. In addition, the configuration of the first sub-transistor $T_{ND1\_1}$ in the eighth embodiment is also identical with the second sub-transistor $T_{ND1\_2}$ in the sixth embodiment. Thus, the degree to which the threshold voltage of the first sub-transistor $T_{ND1\_1}$ is shifted in a direction toward the minus side is relatively low. Therefore, much like the second embodiment described earlier, it is possible to reduce the amplitude of a signal applied to the gate electrode of the first-node initialization transistor $T_{ND1}$ to a value smaller than the amplitude for the fifth embodiment.

Ninth Embodiment

The ninth embodiment implements a variety of modified versions of the organic EL display apparatus according to the first embodiment of the present invention and a variety of modified versions of the organic EL device 10 employed in the organic EL display apparatus as an organic EL device 10 according to the first embodiment of the present invention.

As explained previously, the driving circuit employed in the organic EL device according to each of the first to fourth embodiments has five transistors and one capacitor. FIG. 16 is a diagram showing a typical configuration of an equivalent circuit of a first modified version of the driving circuit. As shown in the figure, the first modified version employs four transistors and one capacitor. FIG. 21 is a diagram showing a typical configuration of an equivalent circuit of a second modified version employing three transistors and one capacitor. FIG. 26 is a diagram showing a typical configuration of an equivalent circuit of a third modified version employing two transistors and one capacitor.

In the driving circuit employed in each of these modified versions, the video-signal write transistor $T_{Sig}$ can be designed into the same structure as the structure of the video-signal write transistor $T_{Sig}$ in each of the first to fourth embodiments. In order to make the explanation simple, however, in the equivalent circuit of each of the first, second and third modified versions shown in FIGS. 16, 21 and 26, the video-signal write transistor $T_{Sig}$ is designed into the same structure as the structure of the video-signal write transistor $T_{Sig}$ in the first embodiment. Nevertheless, the video-signal write transistor $T_{Sig}$ in each of the modified versions does not have to be designed into the same structure as the structure of the video-signal write transistor $T_{Sig}$ in the first embodiment. As described before, the video-signal write transistor $T_{Sig}$ in the first embodiment has a shield electrode on a side close to the first node $ND_1$.

First Modified Version Implementing a 4Tr/1C Driving Circuit

FIG. 16 is a diagram showing a typical configuration of an equivalent circuit of the first modified version, which is a 4Tr/1C driving circuit employing four transistors and one capacitor. FIG. 17 is a conceptual diagram showing an organic EL display apparatus employing the 4Tr/1C driving circuits whereas FIG. 18 shows timing charts of the 4Tr/1C driving circuit. Each of FIGS. 19A to 19D and 20A to 20D shows a model of turned-on and turned-off states of the transistors employed in the 4Tr/1C driving circuit. It is to be noted that, in FIGS. 19A to 19D and FIGS. 20A to 20D, for the sake of convenience, all the transistors except the element driving transistor $T_{Drv}$ are each shown as a single switch without regard to whether each of the transistors is designed as a transistor having a single-gate structure or a dual-gate structure.

The 4Tr/1C driving circuit does not include the first-node initialization transistor $T_{ND1}$. That is to say, in addition to a capacitor $C_1$, the configuration of the 4Tr/1C driving circuit includes four transistors, i.e., a video-signal write transistor $T_{Sig}$, the element driving transistor $T_{Drv}$, a light-emission control transistor $T_{EL\_C}$ and a second-node initialization transistor $T_{ND2}$.

Light-Emission Control Transistor $T_{EL\_C}$

Since the configuration of the light-emission control transistor $T_{EL\_C}$ employed in the 4Tr/1C driving circuit is the same as the light-emission control transistor $T_{EL\_C}$ explained before in the description of the first embodiment, no detailed description of the light-emission control transistor $T_{EL\_C}$ employed in the 4Tr/1C driving circuit is given in order to avoid duplications.

Element Driving Transistor $T_{Drv}$

Since the configuration of the element driving transistor $T_{Drv}$ employed in the 4Tr/1C driving circuit is the same as the element driving transistor $T_{Drv}$ explained before in the description of the first embodiment, no detailed description of the element driving transistor $T_{Drv}$ employed in the 4Tr/1C driving circuit is given in order to avoid duplications.

Second-Node Initialization Transistor $T_{ND2}$

Since the configuration of the second-node initialization transistor $T_{ND2}$ employed in the 4Tr/1C driving circuit is the same as the second-node initialization transistor $T_{ND2}$ explained before in the description of the first embodiment, no detailed description of the second-node initialization transistor $T_{ND2}$ employed in the 4Tr/1C driving circuit is given in order to avoid duplications.

Video-Signal Write Transistor $T_{Sig}$

Since the configuration of the video-signal write transistor $T_{Sig}$ employed in the 4Tr/1C driving circuit is the same as the video-signal write transistor $T_{Sig}$ explained before in the description of the first embodiment, no detailed description of the video-signal write transistor $T_{Sig}$ employed in the 4Tr/1C driving circuit is given in order to avoid duplications. As explained previously in the description of the first embodiment, the particular source/drain area of the video-signal write transistor $T_{Sig}$ is connected to a data line DTL. In the case of the 4Tr/1C driving circuit, however, the video-signal outputting circuit 102 supplies not only the voltage $V_{Sig}$ for controlling the luminance of the organic EL light emitting element ELP, but also the voltage $V_{Ofs}$ for initializing the gate electrode of the element driving transistor $T_{Drv}$ to the particular source/drain area of the video-signal write transistor $T_{Sig}$ through the data line DTL. The fact that the video-signal outputting circuit 102 supplies two different signals to the video-signal write transistor $T_{Sig}$ causes the video-signal write transistor $T_{Sig}$ to operate differently from the video-signal write transistor $T_{Sig}$ explained before in the description of the first embodiment. It is to be noted that, in addition to the voltage $V_{Sig}$ and the voltage $V_{Ofs}$, the video-signal outputting circuit 102 may also supply a variety of signals and voltages to the particular source/drain area of the video-signal write transistor $T_{Sig}$ through the data line DTL. The signals and voltages other than the voltage $V_{Sig}$ include a signal for pre-charge driving.

Organic EL Light Emitting Element ELP

Since the configuration of the organic EL light emitting element ELP employed in the 4Tr/1C driving circuit is the same as the organic EL light emitting element ELP explained before in the description of the first embodiment, no detailed description of the organic EL light emitting element ELP employed in the 4Tr/1C driving circuit is given in order to avoid duplications.

Operations of the 4Tr/1C driving circuit are described as follows.

Figure 19A:
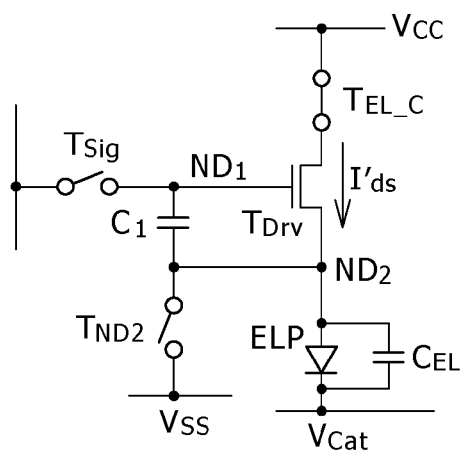

Period $TP(4)_{-1}$ (With Reference to FIGS. 18 and 19A)

An operation carried out in a period $TP(4)_{-1}$ is, for example, an operation performed in the immediately preceding display frame. The operation is the same as the operation carried out in the period $TP(5)_{-1}$ explained previously in the description of the first embodiment.

A period $TP(4)_0$ to a period $TP(4)_4$, which are shown in FIG. 18, correspond respectively to the period $TP(5)_0$ to the period $TP(5)_4$, which are shown in FIG. 4. These periods form a sequence of periods allocated to a sequence of operations ending with an operation to be carried out immediately prior to the next signal write process. The operations performed in the period $TP(4)_0$ to the period $TP(4)_4$ are identical with those carried out by the first embodiment. To put it concretely, in the period $TP(4)_4$, the (n, m)th organic EL device 10 is as a rule in a no-light emission state. However, the operations carried out by the first modified version are different from those performed by the first embodiment in that, in the case of the first modified version, in the operations carried out by the 4Tr/1C driving circuit, the period $TP(4)_5$ and the period $TP(4)_6$ as well as the period $TP(4)_2$ to the period $TP(4)_4$ are included in the mth horizontal scan period as shown in FIG. 18. It is to be noted that, in order to make the following explanation simple, the start of the period $TP(4)_2$ and the end of the period $TP(4)_6$ coincide with the start and end of the mth horizontal scan period respectively.

Each of the period $TP(4)_0$ to the period $TP(4)_4$ is explained as follows. It is to be noted that, as explained before in the description of the first embodiment, the start of the period $TP(4)_1$ and the length of each of the periods $TP(4)_1$ to $TP(4)_4$ can be properly set in accordance with the design of the organic EL display apparatus.

Period $TP(4)_0$

The period $TP(4)_0$ is a period allocated, for example, to an operation carried out for the current display frame. The operations are virtually identical with the operations carried out in the period $TP(5)_0$ explained before in the description of the first embodiment.

Figure 19B:
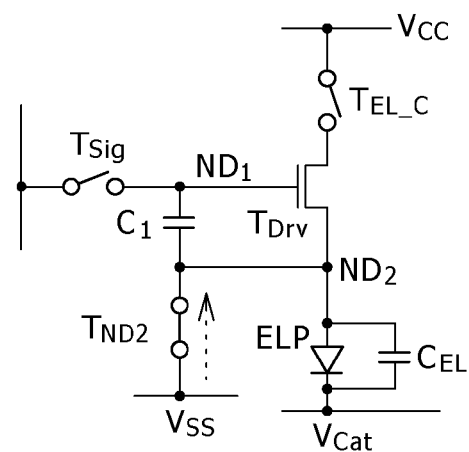

Period $TP(4)_1$ (With Reference to FIG. 19B)

The period $TP(4)_1$ corresponds to the period $TP(5)_1$ explained before in the description of the first embodiment. In the period $TP(4)_1$, pre-processing for execution of a threshold-voltage cancel process to be described later is carried out. That is to say, at the start of the period $TP(4)_1$, the second-node initialization transistor control circuit 105 is driven in order to set a second-node initialization transistor control line $AZ_{ND2}$ at a high level putting the second-node initialization transistor $T_{ND2}$ in a turned-on state. As a result, an electric potential appearing on the second node $ND_2$ becomes the voltage $V_{SS}$ which is −10 volts, for example. In addition, an electric potential appearing on the first node $ND_1$, which is in a floating state, serving as the gate electrode of the element driving transistor $T_{Drv}$ also goes down to follow a drop of an electric potential appearing on the second node $ND_2$. It is to be noted that the electric potential appearing on the first node $ND_1$ during the period $TP(4)_1$ is affected by the electric potential appearing on the first node $ND_1$ during the period $TP(4)_{-1}$ and the electric potential appearing on the first node $ND_1$ during the period $TP(4)_{-1}$ is determined by the magnitude of the voltage $V_{Sig}$ generated in the immediately preceding frame. Thus, the electric potential appearing on the first node $ND_1$ during the period $TP(4)_1$ is not a constant level.

Figure 19C:
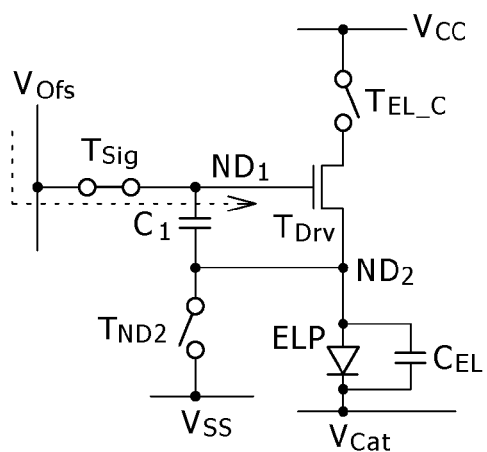

Period $TP(4)_2$ (With Reference to FIG. 19C)

Then, in the following period $TP(4)_2$, the video-signal outputting circuit 102 is driven in order to set an electric potential appearing on the data line DTL at the voltage $V_{Ofs}$ of 0 volts, for example, whereas the scan circuit 101 is driven in order to set an electric potential appearing on the scan line SCL at a high level so as to put the video-signal write transistor $T_{Sig}$ in a turned-on state. As a result, the electric potential appearing on the first node $ND_1$ becomes equal to the voltage $V_{Ofs}$ of 0 volts, for example. On the other hand, the electric potential appearing on the second node $ND_2$ is sustained at the voltage $V_{SS}$ of −10 volts, for example. Subsequently, the second-node initialization transistor control circuit 105 is driven in order to set a second-node initialization transistor control line $AZ_{ND2}$ at a low level so as to put the second-node initialization transistor $T_{ND2}$ in a turned-off state.

It is to be noted that, at the same time as the start of the period $TP(4)_1$ or at a point in the period $TP(4)_1$, the video-signal write transistor $T_{Sig}$ can be put in a turned-on state.

As a result of the operations described above, a difference in electric potential between the gate electrode of the element driving transistor $T_{Drv}$ and the source area of the element driving transistor $T_{Drv}$ is set at a voltage at least equal to the threshold voltage $V_{th}$ of the element driving transistor $T_{Drv}$, putting the element driving transistor $T_{Drv}$ in a turned-on state.

Figure 19D:
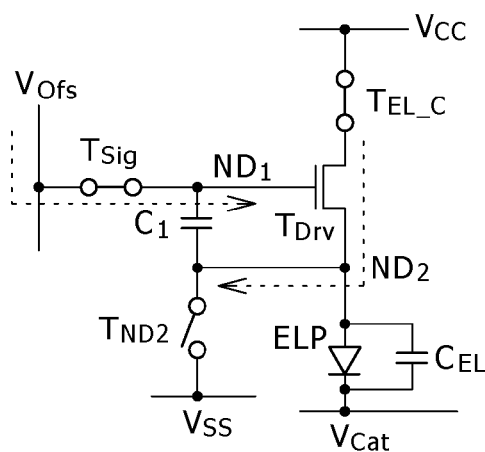

Period TP(4)$_3$ (With Reference to FIG. 19D)

Then, during the following period TP(4)$_3$, a threshold-voltage cancel process is carried out. That is to say, with the turned-on state of the video-signal write transistor T$_{Sig}$ sustained as it is, the light-emission control transistor control circuit 103 is driven in order to raise a light-emission control transistor control line CL$_{EL\_C}$ to a high level. The light-emission control transistor control line CL$_{EL\_C}$ raised to a high level puts the light-emission control transistor T$_{EL\_C}$ in a turned-on state. As a result, an electric potential appearing on the second node ND$_2$ changes in a direction to an electric potential equal to a difference obtained as a result of subtracting the threshold voltage V$_{th}$ of the element driving transistor T$_{Drv}$ from an electric potential appearing on the first node ND$_1$ even though an electric potential appearing on the first node ND$_1$ does not change, being sustained at the voltage V$_{Ofs}$ of 0 volts. That is to say, an electric potential appearing on the second node ND$_2$, which is in a floating state, rises. Then, as the difference in electric potential between the gate electrode of the element driving transistor T$_{Drv}$ and the source area of the element driving transistor T$_{Drv}$ reaches the threshold voltage V$_{th}$ of the element driving transistor T$_{Drv}$, the element driving transistor T$_{Drv}$ is put in a turned-off state. To put it more concretely, the electric potential appearing on the second node ND$_2$, which is in a floating state, approaches a voltage difference of (V$_{Ofs}$−V$_{th}$)=−3 volts and eventually becomes equal to the voltage difference of (V$_{Ofs}$−V$_{th}$). In this case, if the validity of Eq. (2) given earlier is assured or, in other words, if an electric potential satisfying Eq. (2) is selected and determined in advance, the organic EL light emitting element ELP never emits light.

In the period TP(4)$_3$, the electric potential appearing on the second node ND$_2$ eventually becomes equal to the voltage difference of (V$_{Ofs}$−V$_{th}$). That is to say, the electric potential appearing on the second node ND$_2$ is determined, depending on only the threshold voltage V$_{th}$ of the element driving transistor T$_{Drv}$ and the voltage V$_{Ofs}$ used for initializing the gate electrode of the element driving transistor T$_{Drv}$. In other words, the electric potential appearing on the second node ND$_2$ is not dependent on the threshold voltage V$_{th-EL}$ of the organic EL light emitting element ELP.

Figure 20A:
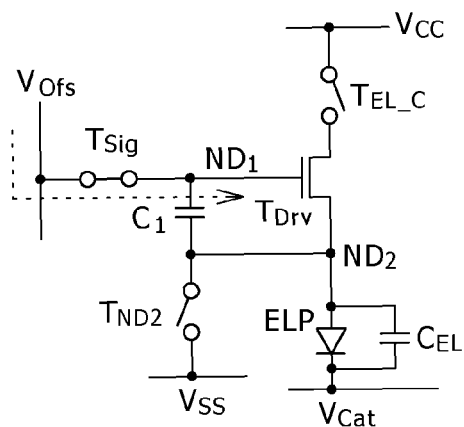

Period TP(4)$_4$ (With Reference to FIG. 20A)

In the following period TP(4)$_4$, with the turned-on state of the video-signal write transistor T$_{Sig}$ sustained as it is, the light-emission control transistor control circuit 103 is driven in order to set the light-emission control transistor control line CL$_{EL\_C}$ at a low level so as to put the light-emission control transistor T$_{EL\_C}$ in a turned-off state. As a result, the electric potential appearing on the first node ND$_1$ does not change but is sustained at the voltage V$_{Ofs}$ of 0 volts and the electric potential appearing on the second node ND$_2$ in a floating state also virtually does not change but is sustained at the voltage difference of (V$_{Ofs}$−V$_{th}$) which is −3 volts. In actuality, the electric potential appearing on the second node ND$_2$ in a floating state changes due to a coupling effect of the parasitic capacitance C$_{gs}$ between the gate electrode of the element driving transistor T$_{Drv}$ and the source area of the element driving transistor T$_{Drv}$ or the like. Nevertheless, the change of the electric potential appearing on the second node ND$_2$ can be normally ignored.

Next, each of a period TP(4)$_5$ to a period TP(4)$_7$ is described. Operations carried out in the period TP(4)$_5$ to a period TP(4)$_7$ are essentially identical with those performed in the period TP(5)$_5$ to the period TP(5)$_7$, which have been explained previously in the description of the first embodiment.

Figure 20B:
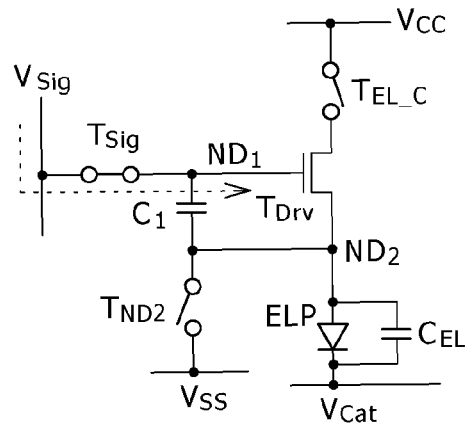

Period TP(4)$_5$ (With Reference to FIG. 20B)

In the following period TP(4)$_5$, a signal write operation for the element driving transistor T$_{Drv}$ is carried out. To put it more concretely, with the turned-on state of the video-signal write transistor T$_{Sig}$ as well the turned-off states of the second-node initialization transistor T$_{ND2}$ and the light-emission control transistor T$_{EL\_C}$ sustained as they are, the video-signal outputting circuit 102 is driven in order to change an electric potential appearing on the data line DTL from the voltage V$_{Ofs}$ to the video signal V$_{Sig}$ used for controlling the luminance of the organic EL light emitting element ELP. As a result, the electric potential appearing on the first node ND$_1$ rises to the voltage V$_{Sig}$. It is to be noted that the video-signal write transistor T$_{Sig}$ can also be turned off once. Then, with the turned-off states of the video-signal write transistor T$_{Sig}$, the second-node initialization transistor T$_{ND2}$ and the light-emission control transistor T$_{EL\_C}$ sustained as they are, the video-signal outputting circuit 102 is driven in order to change an electric potential appearing on the data line DTL to the video signal V$_{Sig}$ used for controlling the luminance of the organic EL light emitting element ELP. Subsequently, with the turned-off states of second-node initialization transistor T$_{ND2}$ and the light-emission control transistor T$_{EL\_C}$ sustained as they are, the scan line SCL is set at a high level in order to put the video-signal write transistor T$_{Sig}$ back in a turned-on state.

Thus, as explained before in the description of the first embodiment, a value expressed by Eq. (3) given before can be obtained as a difference V$_{gs}$ in electric potential between the first node ND$_1$ serving as the gate electrode of the element driving transistor T$_{Drv}$ and the second node ND$_2$ serving as the source area of the element driving transistor T$_{Drv}$.

That is to say, also in the case of the 4Tr/1C driving circuit, the electric-potential difference V$_{gs}$ obtained as a result of the signal write process carried out for the element driving transistor T$_{Drv}$ is dependent on only the voltage V$_{Sig}$ for controlling the luminance of the organic EL light emitting element ELP, the threshold voltage V$_{th}$ of the element driving transistor T$_{Drv}$ and the voltage V$_{Ofs}$ for initializing the gate electrode of the element driving transistor T$_{Drv}$. In addition, the electric-potential difference V$_{gs}$ is not dependent on the threshold voltage V$_{th-EL}$ of the organic EL light emitting element ELP.

Figure 20C:
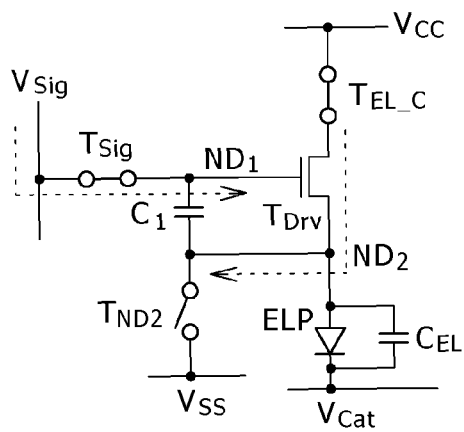

Period TP(4)$_6$ (With Reference to FIG. 20C)

In the following period TP(4)$_6$, a mobility correction process is carried out. The mobility correction process is a process for correcting the electric potential appearing on the second node ND$_2$ serving as the source area of the element driving transistor T$_{Drv}$ on the basis of the magnitude of the mobility μ of the element driving transistor T$_{Drv}$. To put it more concretely, the mobility correction process is identical with the process carried out in the period TP(5)$_6$ explained before in the description of the first embodiment. In addition, it is nice to determine the entire length to of the period TP(4)$_6$, which is the period of time it takes to carry out the mobility correction process, as a design value in advance when designing the organic EL display apparatus.

Figure 20D:
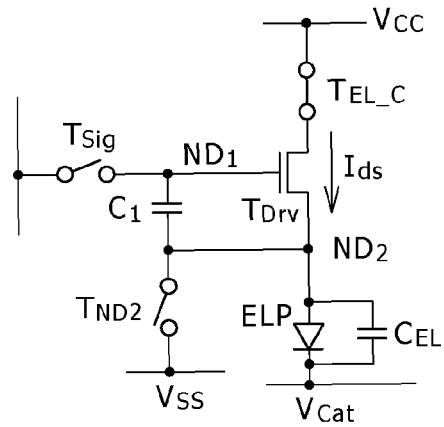

Period TP(4)$_7$ (With Reference to FIG. 20D)

At the end of the execution of the operations described above, the threshold-voltage cancel process, the signal write process and the mobility correction process are completed. Then, the same process as the process carried out in the period TP(5)$_7$ explained before in the description of the first embodiment is carried out. As a result, an electric potential appearing on the second node ND$_2$ rises, exceeding a level of (V$_{th-EL}$+V$_{cat}$) Thus, the organic EL light emitting element ELP starts emission of light. At that time, a drain current I$_{ds}$ flowing through the organic EL light emitting element ELP can be expressed by Eq. (5). Thus, the drain current $I_{ds}$ flowing through the organic EL light emitting element ELP does not depend on the threshold voltage $V_{th\text{-}EL}$ of the organic EL light emitting element ELP and the threshold voltage $V_{th}$ of the element driving transistor $T_{Drv}$. That is to say, the luminance exhibited by the organic EL light emitting element ELP as a quantity representing the amount of light emitted by the organic EL light emitting element ELP is not affected by the threshold voltage $V_{th\text{-}EL}$ of the organic EL light emitting element ELP and the threshold voltage $V_{th}$ of the element driving transistor $T_{Drv}$. On top of that, it is possible to avoid generation of current variations caused by variations of the mobility μ of the element driving transistor $T_{Drv}$ as variations of the drain current $I_{ds}$.

The light-emission state of the organic EL light emitting element ELP is sustained continuously till the (m+m'−1)th horizontal scan period. That is to say, the light-emission state of the organic EL light emitting element ELP is terminated at the end of the period $TP(4)_{-1}$.

At the end of the period $TP(4)_{-1}$, the (n, m)th sub-pixel serving as a organic EL device 10 completes the light emitting operation.

Next, a 3Tr/1C driving circuit is explained.

Second Modified Version Implementing a 3Tr/1C Driving Circuit

FIG. 21 is a diagram showing a typical configuration of an equivalent circuit of the second modified version, which is a 3Tr/1C driving circuit employing three transistors and one capacitor. FIG. 22 is a conceptual diagram showing an organic EL display apparatus employing the 3Tr/1C driving circuits whereas FIG. 23 shows timing charts of the 3Tr/1C driving circuit. Each of FIGS. 24A to 24D and 25A to 25E shows a model of turned-on and turned-off states of the transistors employed in the 3Tr/1C driving circuit. It is to be noted that, in FIGS. 24A to 24D and FIGS. 25A to 25E, for the sake of convenience, all the transistors except the element driving transistor $T_{Drv}$ are each shown as a single switch without regard to whether each of the transistors is designed as a transistor having a single-gate structure or a dual-gate structure.

The 3Tr/1C driving circuit does not include two transistors, i.e., the first-node initialization transistor $T_{ND1}$ and the second-node initialization transistor $T_{ND2}$. That is to say, in addition to a capacitor $C_1$, the configuration of the 3Tr/1C driving circuit includes three transistors, i.e., a video-signal write transistor $T_{Sig}$, the element driving transistor $T_{Drv}$ and a light-emission control transistor $T_{EL\_C}$.

Light-Emission Control Transistor $T_{EL\_C}$

Since the configuration of the light-emission control transistor $T_{EL\_C}$ employed in the 3Tr/1C driving circuit is the same as the light-emission control transistor $T_{EL\_C}$ explained before in the description of the first embodiment, no detailed description of the light-emission control transistor $T_{EL\_C}$ employed in the 3Tr/1C driving circuit is given in order to avoid duplications.

Element Driving Transistor $T_{Drv}$

Since the configuration of the element driving transistor $T_{Drv}$ employed in the 3Tr/1C driving circuit is the same as the element driving transistor $T_{Drv}$ explained before in the description of the first embodiment, no detailed description of the element driving transistor $T_{Drv}$ employed in the 3Tr/1C driving circuit is given in order to avoid duplications.

Video-Signal Write Transistor $T_{Sig}$

Since the configuration of the video-signal write transistor $T_{Sig}$ employed in the 3Tr/1C driving circuit is the same as the video-signal write transistor $T_{Sig}$ explained before in the description of the video-signal write transistor $T_{Sig}$ employed in the 3Tr/1C driving circuit is given in order to avoid duplications. As explained previously in the description of the first embodiment, the particular source/drain area of the video-signal write transistor $T_{Sig}$ is connected to a data line DTL. In the case of the 3Tr/1C driving circuit, however, the video-signal outputting circuit 102 supplies not only the voltage $V_{Sig}$ for controlling the luminance of the organic EL light emitting element ELP, but also voltages $V_{Ofs\text{-}L}$ and $V_{Ofs\text{-}H}$ for initializing the gate electrode of the element driving transistor $T_{Drv}$ to the particular source/drain area of the video-signal write transistor $T_{Sig}$ through the data line DTL. The fact that the video-signal outputting circuit 102 supplies three different signals to the video-signal write transistor $T_{Sig}$ causes the video-signal write transistor $T_{Sig}$ to operate differently from the video-signal write transistor $T_{Sig}$ explained before in the description of the first embodiment. It is to be noted that, in addition to the voltage $V_{Sig}$, the $V_{Ofs\text{-}L}$ and the voltage $V_{Ofs\text{-}H}$, the video-signal outputting circuit 102 may also supply a variety of signals and voltages to the particular source/drain area of the video-signal write transistor $T_{Sig}$ through the data line DTL. The signals and voltages other than the voltage $V_{Sig}$ include a signal for pre-charge driving. Typical magnitudes of the voltages $V_{Ofs\text{-}L}$ and $V_{Ofs\text{-}H}$ are given as follows:

$V_{Ofs\text{-}H}$=about 30 volts $V_{Ofs\text{-}L}$=about 0 volts

It is to be noted, however, that the magnitudes of the voltage $V_{Ofs\text{-}L}$ and the voltage $V_{Ofs\text{-}H}$ are by no means limited to the above typical values.

Relations Between the Parasitic Capacitance $C_{EL}$ and the Capacitance $c_1$ of the Capacitor $C_1$ As will be described later, in the 3Tr/1C driving circuit, it is necessary to change an electric potential appearing on the second node $ND_2$ by making use of the data line DTL. The driving circuit employed in the organic EL device according to the first embodiment and the 4Tr/1C driving circuit are described previously by assuming that the magnitude $C_{EL}$ of the parasitic capacitance $C_{EL}$ of the organic EL light emitting element ELP is adequately large in comparison with the capacitance $c_1$ of the capacitor $C_1$ as well as the magnitude $c_{gs}$ of the parasitic capacitance $C_{gs}$ between the gate electrode of the element driving transistor $T_{Drv}$ and source area of the element driving transistor $T_{Drv}$ and by not considering electric-potential changes caused by a change ($V_{Sig}$−$V_{Ofs}$) of an electric potential appearing on the first node $ND_1$ functioning as the gate electrode of the element driving transistor $T_{Drv}$ as changes of an electric potential appearing on the second node $ND_2$ which serves as the source area of the element driving transistor $T_{Drv}$. In the case of the 3Tr/1C driving circuit, on the other hand, the capacitance $c_1$ of the capacitor $C_1$ is set as a design value greater than those of the driving circuit employed in the organic EL device according to the first embodiment and the 4Tr/1C driving circuit. For example, the capacitance $c_1$ of the capacitor $C_1$ employed in the 3Tr/1C driving circuit is set at a value equal to about ¼ to ⅓ times the magnitude $C_{EL}$ of the parasitic capacitance $C_{EL}$. Thus, in comparison with the driving circuit employed in the organic EL device according to the first embodiment and the 4Tr/1C driving circuit, in the 3Tr/1C driving circuit, the electric potential appearing on the second node $ND_2$ serving as the source area of the element driving transistor $T_{Drv}$ changes to a high degree due to changes of the electric potential appearing on the first node $ND_1$ functioning as the gate electrode of the element driving transistor $T_{Drv}$. For this reason, the 3Tr/1C driving circuit is explained below by deliberately considering electric-potential changes caused by changes of the electric potential appearing on the first node $ND_1$ as changes of the electric potential appearing on the second node $ND_2$. It is to be noted that timing charts are shown in FIG. 23 by also deliberately considering electric-potential changes caused by changes of the electric potential appearing on the first node $ND_1$ as changes of the electric potential appearing on the second node $ND_2$.

Organic EL Light Emitting Element ELP

Since the configuration of the organic EL light emitting element ELP employed in the 3Tr/1C driving circuit is the same as the organic EL light emitting element ELP explained before in the description of the first embodiment, no detailed description of the organic EL light emitting element ELP employed in the 3Tr/1C driving circuit is given in order to avoid duplications.

Operations of the 3Tr/1C driving circuit are described as follows.

Figure 24A:
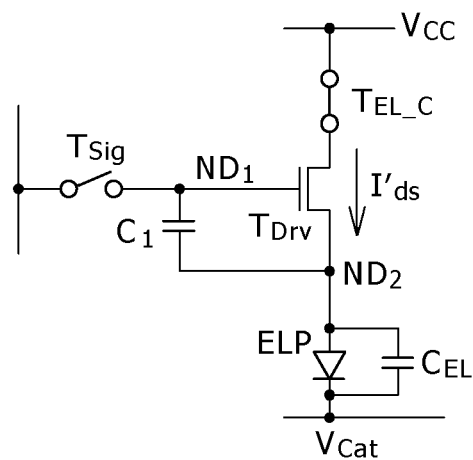

Period $TP(3)_{-1}$ (With Reference to FIGS. 23 and 24A)

An operation carried out in a period $TP(3)_{-1}$ is, for example, an operation performed in the immediately preceding display frame. Virtually, the operation is the same as the operation carried out in the period $TP(5)_{-1}$ explained previously in the description of the first embodiment.

A period $TP(3)_0$ to a period $TP(3)_4$, which are shown in FIG. 23, correspond respectively to the period $TP(5)_0$ to the period $TP(5)_4$, which are shown in FIG. 4. These periods form a sequence of periods allocated to a sequence of operations ending with an operation to be carried out immediately prior to the next signal write process. The operations performed in the period $TP(3)_0$ to the period $TP(3)_4$ are identical with those carried out by the first embodiment. To put it concretely, in the period $TP(3)_4$, the (n, m)th organic EL device 10 is as a rule in a no-light emission state. However, the operations carried out by the 3Tr/1C driving circuit serving as the second modified version are different from those performed by the first embodiment in that, in the case of the second modified version, in the operations carried out by the 3Tr/1C driving circuit, the period $TP(3)_5$ and the period $TP(3)_6$ as well as the period $TP(3)_1$ to the period $TP(3)_4$ are included in the mth horizontal scan period as shown in FIG. 23. It is to be noted that, in order to make the following explanation simple, the start of the period $TP(3)_1$ and the end of the period $TP(3)_6$ coincide with the start and end of the mth horizontal scan period respectively.

Each of the period $TP(3)_0$ to the period $TP(3)_4$ is explained as follows. It is to be noted that, as explained before in the description of the first embodiment, the length of each of the periods $TP(3)_1$ to $TP(3)_4$ can be properly set in accordance with the design of the organic EL display apparatus.

Figure 24B:
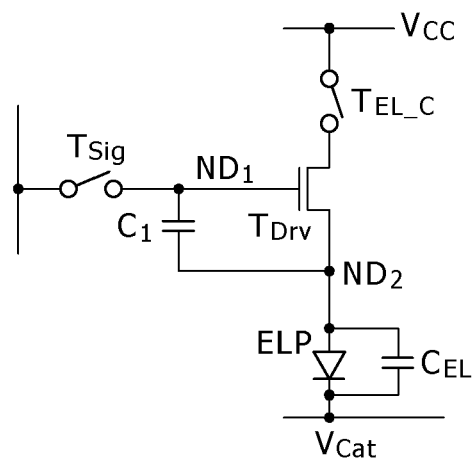

Period $TP(3)_0$ (With Reference to FIG. 24B)

The period $TP(3)_0$ is a period allocated to, for example, operations carried out for the immediately preceding display frame and the current display frame. The operations are virtually identical with the operations carried out in the period $TP(5)_0$ explained before in the description of the first embodiment.

Figure 24C:
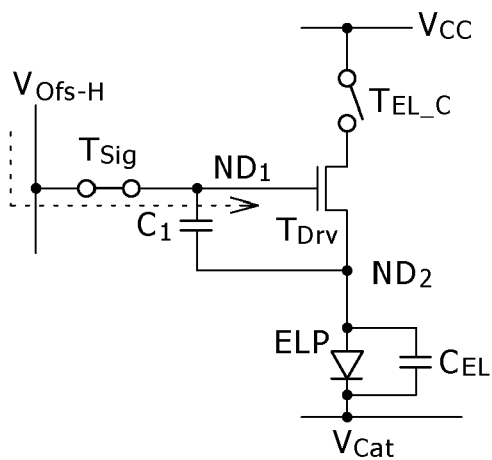

Period $TP(3)_1$ (With Reference to FIG. 24C)

Then, in the next period $TP(3)_1$, the horizontal scan period of the mth row on the current display frame is started. At the beginning of the period $TP(3)_1$, the video-signal outputting circuit 102 is driven in order to generate an electric potential on the data line DTL as a voltage $V_{Ofs-H}$ used for initializing the gate electrode of the element driving transistor $T_{Drv}$. Then, the scan circuit 101 is driven in order to set the scan line SCL at a high level so as to put the video-signal write transistor $T_{Sig}$ in a turned-on state. As a result, an electric potential appearing on the first node $ND_1$ becomes equal to the voltage $V_{Ofs-H}$. As explained previously, the capacitance $c_1$ of the capacitor $C_1$ is set as a design value greater than those of the other driving circuits. Thus, an electric potential appearing on the second node $ND_2$ serving as the source area of the element driving transistor $T_{Drv}$ rises. Then, a difference in electric potential between the terminals of the organic EL light emitting element ELP exceeds the threshold voltage $V_{th-EL}$ of the organic EL light emitting element ELP, putting the organic EL light emitting element ELP in a conductive state. However, the electric potential appearing on the second node $ND_2$ serving as the source area of the element driving transistor $T_{Drv}$ again drops immediately to a voltage of $(V_{th-EL}+V_{Cat})$. It is to be noted that, in this process, the organic EL light emitting element ELP may emit light but, since the light emission is instantaneous, no problem is raised. In the mean time, an electric potential appearing on the gate electrode of the element driving transistor $T_{Drv}$ is sustained at the voltage $V_{Ofs-H}$.

Figure 24D:
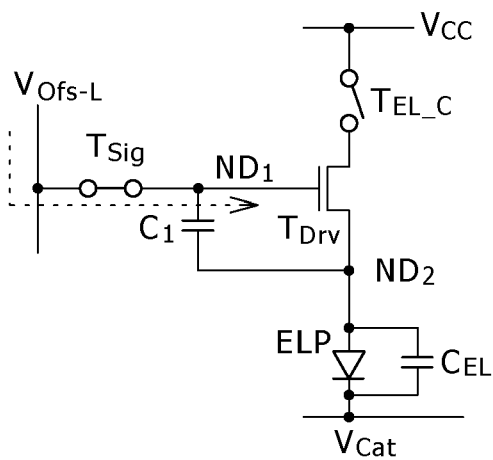

Period $TP(3)_2$ (With Reference to FIG. 24D)

Then, in the next period $TP(3)_2$, the video-signal outputting circuit 102 is driven in order to change an electric potential appearing on the data line DTL from the voltage $V_{Ofs-H}$ used for initializing the gate electrode of the element driving transistor $T_{Drv}$ to a voltage $V_{Ofs-L}$. Then, an electric potential appearing on the first node $ND_1$ becomes $V_{Ofs-L}$. As a result, an electric potential appearing on the first node $ND_1$ drops, causing an electric potential appearing on the second node $ND_2$ also to go down as well. That is to say, an electric charge based on the change $(V_{Ofs-L}-V_{Ofs-H})$ of the electric potential appearing on the gate electrode of the element driving transistor $T_{Drv}$ is distributed to the capacitance $c_1$ of the capacitor $C_1$, the parasitic capacitance $C_{EL}$ of the organic EL light emitting element ELP and the parasitic capacitance $C_{gs}$ between the gate electrode of the element driving transistor $T_{Drv}$ and the source area of the element driving transistor $T_{Drv}$. It is to be noted that, as a prerequisite of an operation to be carried out in a period $TP(3)_3$ to be described later, the electric potential appearing on the second node $ND_2$ shall be lower than the voltage difference $(V_{Ofs-L}-V_{th})$ at the end of the period $TP(3)_2$. The voltage $V_{Ofs-H}$ and the other voltages are set in advance at values that satisfy the condition set as this prerequisite. That is to say, by carrying out the operation described above, the difference in electric potential between the gate electrode of the element driving transistor $T_{Drv}$ and the source area of the element driving transistor $T_{Drv}$ becomes at least equal to the threshold voltage $V_{th}$ of the element driving transistor $T_{Drv}$, putting the element driving transistor $T_{Drv}$ in a turned-on state.

Figure 25A:
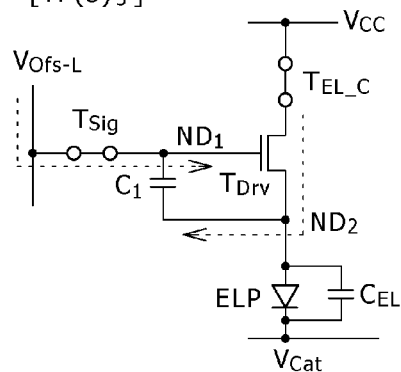

Period $TP(3)_3$ (With Reference to FIG. 25A)

Then, during the following period $TP(3)_3$, a threshold-voltage cancel process is carried out. That is to say, with the turned-on state of the video-signal write transistor $T_{Sig}$ sustained as it is, the light-emission control transistor control circuit 103 is driven in order to raise a light-emission control transistor control line $CL_{EL\_C}$ to a high level. The light-emission control transistor control line $CL_{EL\_C}$ raised to a high level puts the light-emission control transistor $T_{EL\_C}$ in a turned-on state. As a result, an electric potential appearing on the second node $ND_2$ changes in a direction to an electric potential equal to a difference obtained as a result of subtracting the threshold voltage $V_{th}$ of the element driving transistor $T_{Drv}$ from an electric potential appearing on the first node $ND_1$ even though an electric potential appearing on the first node $ND_1$ does not change, being sustained at the voltage $V_{Ofs-L}$ of 0 volts. That is to say, an electric potential appearing on the second node $ND_2$, which is in a floating state, rises.

Then, as the difference in electric potential between the gate electrode of the element driving transistor $T_{Drv}$ and the source area of the element driving transistor $T_{Drv}$ reaches the threshold voltage $V_{th}$ of the element driving transistor $T_{Drv}$, the element driving transistor $T_{Drv}$ is put in a turned-off state. To put it more concretely, the electric potential appearing on the second node $ND_2$, which is in a floating state, approaches a voltage difference of $(V_{Ofs}-V_{th})=-3$ volts and eventually becomes equal to the voltage difference of $(V_{Ofs}-V_{th})$. In this case, if the validity of Eq. (2) given earlier is assured or, in other words, if an electric potential satisfying Eq. (2) is selected and determined in advance, the organic EL light emitting element ELP never emits light.

In the period $TP(3)_3$, the electric potential appearing on the second node $ND_2$ eventually becomes equal to the voltage difference of $(V_{Ofs-L}-V_{th})$. That is to say, the electric potential appearing on the second node $ND_2$ is determined, depending on only the threshold voltage $V_{th}$ of the element driving transistor $T_{Drv}$ and the voltage $V_{Ofs-L}$ used for initializing the gate electrode of the element driving transistor $T_{Drv}$. In other words, the electric potential appearing on the second node $ND_2$ is not dependent on the threshold voltage $V_{th-EL}$ of the organic EL light emitting element ELP.

Figure 25B:
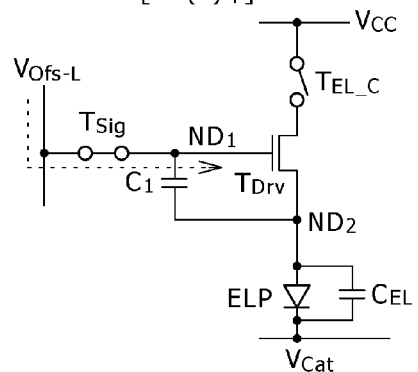

Period $TP(3)_4$ (With Reference to FIG. 25B)

In the following period $TP(3)_4$, with the turned-on state of the video-signal write transistor $T_{Sig}$ sustained as it is, the light-emission control transistor control circuit 103 is driven in order to set the light-emission control transistor control line $CL_{EL\_C}$ at a low level so as to put the light-emission control transistor $T_{EL\_C}$ in a turned-off state. As a result, the electric potential appearing on the first node $ND_1$ does not change but is sustained at the voltage $V_{Ofs-L}$ of 0 volts and the electric potential appearing on the second node $ND_2$ in a floating state also virtually does not change but is sustained at the voltage difference of $(V_{Ofs-L}-V_{th})$ which is -3 volts.

Next, each of a period $TP(3)_5$ to a period $TP(3)_7$ is described. Operations carried out in the period $TP(3)_5$ to a period $TP(3)_7$ are essentially identical with those performed in the period $TP(5)_5$ to the period $TP(5)_7$, which have been explained previously in the description of the first embodiment.

Figure 25C:
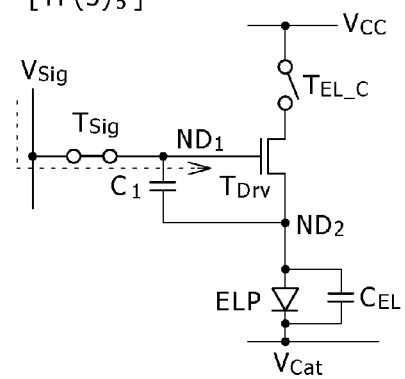

Period $TP(3)_5$ (With Reference to FIG. 25C)

In the following period $TP(3)_5$, a signal write operation for the element driving transistor $T_{Drv}$ is carried out. To put it more concretely, with the turned-on state of the video-signal write transistor $T_{Sig}$ as well the turned-off state of the light-emission control transistor $T_{EL\_C}$ sustained as they are, the video-signal outputting circuit 102 is driven in order to set an electric potential appearing on a data line DTL at the video signal $V_{Sig}$ used for controlling the luminance of the organic EL light emitting element ELP. As a result, the electric potential appearing on the first node $ND_1$ rises to the voltage $V_{Sig}$. It is to be noted that the video-signal write transistor $T_{Sig}$ can also be turned off once. Then, with the turned-off states of the video-signal write transistor $T_{Sig}$ and the light-emission control transistor $T_{EL\_C}$ sustained as they are, the video-signal outputting circuit 102 is driven in order to set the electric potential appearing on a data line DTL to the video signal $V_{Sig}$ used for controlling the luminance of the organic EL light emitting element ELP. Subsequently, with the turned-off state of the light-emission control transistor $T_{EL\_C}$ sustained as it is, the scan line SCL is set at a high level in order to put the video-signal write transistor $T_{Sig}$ back in a turned-on state.

As described above, in the period $TP(3)_5$, the electric potential appearing on the first node $ND_1$ rises from the voltage $V_{Ofs-L}$ to the voltage $V_{Sig}$. Thus, if an electric-potential change caused by the change of the electric potential appearing on the first node $ND_1$ as a change of an electric potential appearing on the second node $ND_2$ is taken into consideration, the change of the electric potential appearing on the second node $ND_2$ also rises a little bit. That is to say, the electric potential appearing on the second node $ND_2$ can be represented by an expression of $V_{Ofs-L}-V_{th}+\alpha*(V_{Sig}-V_{Ofs-L})$ where notation $\alpha$ represents a value in a range of $0<\alpha<1$. The value of $\alpha$ is determined from parameters including the capacitance $c_1$ of the capacitor $C_1$ and the parasitic capacitance $C_{EL}$ of the organic EL light emitting element ELP.

Thus, as explained previously in the description of the first embodiment, a difference in electric potential between the first node $ND_1$ and the second node $ND_2$ can be expressed by Eq. (3') given below. It is to be noted that the difference in electric potential between the first node $ND_1$ and the second node $ND_2$ is the electric-potential difference $V_{gs}$ between the gate electrode of the element driving transistor $T_{Drv}$ and the source area of the element driving transistor $T_{Drv}$.

$$V_{gs} \approx V_{Sig} - (V_{Ofs-L} - V_{th}) - \alpha*(V_{Sig} - V_{Ofs-L}) \quad (3')$$

That is to say, also in the case of the 3Tr/1C driving circuit, the electric-potential difference $V_{gs}$ obtained as a result of the signal write process carried out for the element driving transistor $T_{Drv}$ is dependent on only the voltage $V_{Sig}$ for controlling the luminance of the organic EL light emitting element ELP, the threshold voltage $V_{th}$ of the element driving transistor $T_{Drv}$ and the voltage $V_{Ofs-L}$ for initializing the gate electrode of the element driving transistor $T_{Drv}$. In addition, the electric-potential difference $V_{gs}$ is not dependent on the threshold voltage $V_{th-EL}$ of the organic EL light emitting element ELP.

Figure 25D:
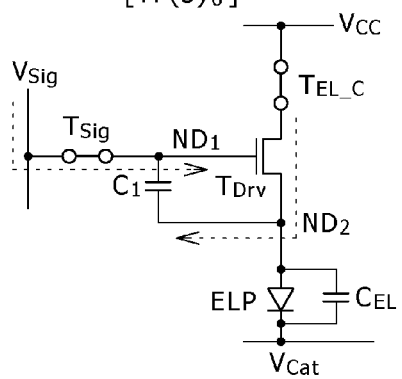

Period $TP(3)_6$ (With Reference to FIG. 25D)

In the following period $TP(3)_6$, a mobility correction process is carried out. The mobility correction process is a process for correcting the electric potential appearing on the second node $ND_2$ serving as the source area of the element driving transistor $T_{Drv}$ on the basis of the magnitude of the mobility $\mu$ of the element driving transistor $T_{Drv}$. To put it more concretely, the mobility correction process is identical with the process carried out in the period $TP(5)_6$ explained before in the description of the first embodiment. In addition, it is nice to determine the entire length to of the period $TP(3)_6$, which is the period of time it takes to carry out the mobility correction process, as a design value in advance when designing the organic EL display apparatus.

Figure 25E:
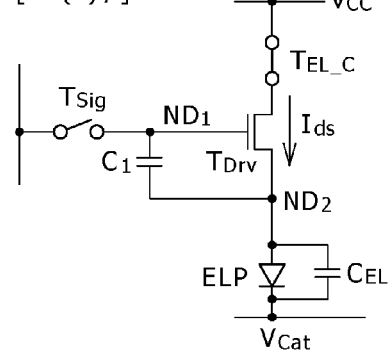

Period $TP(3)_7$ (With Reference to FIG. 25E)

At the end of the execution of the operations described above, the threshold-voltage cancel process, the signal write process and the mobility correction process are completed. Then, the same process as the process carried out in the period $TP(5)_7$ explained before in the description of the first embodiment is carried out. As a result, an electric potential appearing on the second node $ND_2$ rises, exceeding a level of $(V_{th-EL}+V_{Cat})$. Thus, the organic EL light emitting element ELP starts emission of light. At that time, a drain current $I_{ds}$ flowing through the organic EL light emitting element ELP can be expressed by Eq. (5). Thus, the drain current $I_{ds}$ flowing through the organic EL light emitting element ELP does not depend on the threshold voltage $V_{th-EL}$ of the organic EL light emitting element ELP and the threshold voltage $V_{th}$ of the element driving transistor $T_{Drv}$. That is to say, the luminance exhibited by the organic EL light emitting element ELP as a quantity representing the amount of light emitted by the organic EL light emitting element ELP is not affected by the threshold voltage $V_{th-EL}$ of the organic EL light emitting element ELP and the threshold voltage $V_{th}$ of the element driving transistor $T_{Drv}$. On top of that, it is possible to avoid generation of current variations caused by variations of the mobility μ of the element driving transistor $T_{Drv}$ as variations of the drain current $I_{ds}$.

The light-emission state of the organic EL light emitting element ELP is sustained continuously till the (m+m'−1)th horizontal scan period. That is to say, the light-emission state of the organic EL light emitting element ELP is terminated at the end of the period $TP(3)_{-1}$.

At the end of the period $TP(3)_{-1}$, the (n, m)th sub-pixel serving as a organic EL device 10 completes the light emitting operation.

Next, a 2Tr/1C driving circuit is explained.

Third Modified Version Implementing a 2Tr/1C Driving Circuit

FIG. 26 is a diagram showing a typical configuration of an equivalent circuit of the third modified version, which is a 2Tr/1C driving circuit employing two transistors and one capacitor. FIG. 27 is a conceptual diagram showing an organic EL display apparatus employing the 2Tr/1C driving circuits whereas FIG. 28 shows timing charts of the 2Tr/1C driving circuit. Each of FIGS. 29A to 29F shows a model of turned-on and turned-off states of the transistors employed in the 2Tr/1C driving circuit. It is to be noted that, in FIGS. 29A to 29F, for the sake of convenience, all the transistors except the element driving transistor $T_{Drv}$ are each shown as a single switch without regard to whether each of the transistors is designed as a transistor having a single-gate structure or a dual-gate structure.

The 2Tr/1C driving circuit does not include three transistors, i.e., the first-node initialization transistor $T_{ND1}$, the light-emission control transistor $T_{EL\_C}$ and the second-node initialization transistor $T_{ND2}$. That is to say, in addition to a capacitor $C_1$, the configuration of the 2Tr/1C driving circuit includes two transistors, i.e., the video-signal write transistor $T_{Sig}$ and the element driving transistor $T_{Drv}$.

Element Driving Transistor $T_{Drv}$

Since the configuration of the element driving transistor $T_{Drv}$ employed in the 2Tr/1C driving circuit is the same as the element driving transistor $T_{Drv}$ explained before in the description of the first embodiment, no detailed description of the element driving transistor $T_{Drv}$ employed in the 2Tr/1C driving circuit is given in order to avoid duplications. In the case of the 2Tr/1C driving circuit, however, the drain area of the element driving transistor $T_{Drv}$ is connected to the current supply section 100 which generates a voltage $V_{CC-H}$ used for controlling the luminance of the organic EL light emitting element ELP and a voltage $V_{CC-L}$ used for controlling an electric potential appearing in the source area of the element driving transistor $T_{Drv}$. Typical magnitudes of the voltages $V_{CC-L}$ and $V_{CC-H}$ are given as follows:

$V_{CC-H}$=20 volts $V_{CC-L}$=−10 volt

It is to be noted, however, that the magnitudes of the voltage $V_{CC-L}$ and the voltage $V_{CC-H}$ are by no means limited to the above typical values. It is also worth noting that the above description also holds true of a tenth embodiment to be described later.

Video-Signal Write Transistor $T_{Sig}$

Since the configuration of the video-signal write transistor $T_{Sig}$ employed in the 2Tr/1C driving circuit is the same as the video-signal write transistor $T_{Sig}$ explained before in the description of the first embodiment, no detailed description of the video-signal write transistor $T_{Sig}$ employed in the 2Tr/1C driving circuit is given in order to avoid duplications.

Organic EL Light Emitting Element ELP

Since the configuration of the organic EL light emitting element ELP employed in the 2Tr/1C driving circuit is the same as the organic EL light emitting element ELP explained before in the description of the first embodiment, no detailed description of the organic EL light emitting element ELP employed in the 2Tr/1C driving circuit is given in order to avoid duplications.

Operations of the 2Tr/1C driving circuit are described as follows.

Period $TP(2)_{-1}$ (With Reference to FIGS. 28 and 29A)

An operation carried out in a period $TP(2)_{-1}$ is, for example, an operation performed in the immediately preceding display frame. Virtually, the operation is the same as the operation carried out in the period $TP(5)_{-1}$ explained previously in the description of the first embodiment.

A period $TP(2)_0$ to a period $TP(2)_2$, which are shown in FIG. 28, correspond to the period $TP(5)_0$ to the period $TP(5)_4$, which are shown in FIG. 4. These periods form a sequence of periods allocated to a sequence of operations ending with an operation to be carried out immediately prior to the next signal write process. The operations performed in the period $TP(2)_0$ to the period $TP(2)_2$ are identical with those carried out by the first embodiment. To put it concretely, in the period $TP(2)_2$, the (n, m)th organic EL device 10 is as a rule in a no-light emission state. However, the operations carried out by the 2Tr/1C driving circuit serving as the third modified version are different from those performed by the first embodiment in that, in the case of the third modified version, in the operations carried out by the 2Tr/1C driving circuit, the period $TP(2)_3$ as well as the period $TP(2)_1$ and the period $TP(2)_2$ are included in the mth horizontal scan period as shown in FIG. 28. It is to be noted that, in order to make the following explanation simple, the start of the period $TP(2)_1$ and the end of the period $TP(2)_3$ coincide with the start and end of the mth horizontal scan period respectively.

Each of the period $TP(2)_0$ to the period $TP(2)_2$ is explained as follows. It is to be noted that, as explained before in the description of the first embodiment, the length of each of the periods $TP(2)_1$ to $TP(2)_3$ can be properly set in accordance with the design of the organic EL display apparatus.

Period $TP(2)_0$ (With Reference to FIG. 29B)

The period $TP(2)_0$ is a period allocated to, for example, operations carried out for the immediately preceding display frame and the current display frame. That is to say, this period $TP(2)_0$ is a period beginning with the (m+m')th horizontal scan period in the immediately preceding display frame and ending with the (m−1)th horizontal scan period in the current display frame. In this period $TP(2)_0$, the (n, m)th organic EL device 10 is in a no-light emission state. At a point a transition is made from the period $TP(2)_{-1}$ to the period $TP(2)_0$, a voltage generated by the current supply section 100 is switched from the level $V_{CC-H}$ to the level $V_{CC-L}$. As a result, an electric potential appearing on the second node $ND_2$ serving as the source area of the element driving transistor $T_{Drv}$ as well as the anode electrode of the organic EL light emitting element ELP falls to the voltage $V_{CC-L}$, putting the organic EL light emitting element ELP in a no-light transmission state. In addition, an electric potential appearing on the first node $ND_1$ in a floating state also falls to follow the drop of the electric potential appearing on the second node $ND_2$. As described before, the first node $ND_1$ serves as the gate electrode of the element driving transistor $T_{Drv}$.

Period $TP(2)_1$ (With Reference to FIG. 29C)

Then, in the next period $TP(2)_1$, the horizontal scan period of the mth row on the current display frame is started. At the beginning of the period $TP(2)_1$, the scan circuit 101 is driven in order to set the scan line SCL at a high level so as to put the video-signal write transistor $T_{Sig}$ in a turned-on state. As a result, an electric potential appearing on the first node $ND_1$ becomes equal to a voltage $V_{Ofs}$ of 0 volts, for example. The electric potential appearing on the second node $ND_2$ is sustained at the voltage $V_{CC-L}$ which is −10 volts, for example.

By carrying out the operations described above, the difference in electric potential between the gate electrode of the element driving transistor $T_{Drv}$ and the source area of the element driving transistor $T_{Drv}$ rises to a voltage at least equal to the threshold voltage $V_{th}$ of the element driving transistor $T_{Drv}$, putting the element driving transistor $T_{Drv}$ in a turned-on state.

Period $TP(2)_2$ (With Reference to FIG. 29D)

Then, during the following period $TP(2)_2$, a threshold-voltage cancel process is carried out. That is to say, with the turned-on state of the video-signal write transistor $T_{Sig}$ sustained as it is, a voltage generated by the current supply section 100 is switched from the voltage $V_{CC-L}$ to the voltage $V_{CC-H}$. As a result, an electric potential appearing on the second node $ND_2$ changes in a direction to an electric potential equal to a difference obtained as a result of subtracting the threshold voltage $V_{th}$ of the element driving transistor $T_{Drv}$ from an electric potential appearing on the first node $ND_1$ even though an electric potential appearing on the first node $ND_1$ does not change, being sustained at the voltage $V_{Ofs}$ of 0 volts. That is to say, an electric potential appearing on the second node $ND_2$, which is in a floating state, rises. Then, as the difference in electric potential between the gate electrode of the element driving transistor $T_{Drv}$ and the source area of the element driving transistor $T_{Drv}$ reaches the threshold voltage $V_{th}$ of the element driving transistor $T_{Drv}$, the element driving transistor $T_{Drv}$ is put in a turned-off state. To put it more concretely, the electric potential appearing on the second node $ND_2$, which is in a floating state, approaches a voltage difference of $(V_{Ofs}-V_{th})$=−3 volts and eventually becomes equal to the voltage difference of $(V_{Ofs}-V_{th})$. In this case, if the validity of Eq. (2) given earlier is assured or, in other words, if an electric potential satisfying Eq. (2) is selected and determined in advance, the organic EL light emitting element ELP never emits light.

In the period $TP(2)_2$, the electric potential appearing on the second node $ND_2$ eventually becomes equal to the voltage difference of $(V_{Ofs}-V_{th})$. That is to say, the electric potential appearing on the second node $ND_2$ is determined, depending on only the threshold voltage $V_{th}$ of the element driving transistor $T_{Drv}$ and the voltage $V_{Ofs}$ used for initializing the gate electrode of the element driving transistor $T_{Drv}$. In other words, the electric potential appearing on the second node $ND_2$ is not dependent on the threshold voltage $V_{th-EL}$ of the organic EL light emitting element ELP.

Period $TP(2)_3$ (With Reference to FIG. 29E)

In the following period $TP(2)_3$, a signal write operation for the element driving transistor $T_{Drv}$ and a mobility correction process are carried out. The mobility correction process is a process for correcting the electric potential appearing on the second node $ND_2$ serving as the source area of the element driving transistor $T_{Drv}$ on the basis of the magnitude of the mobility μ of the element driving transistor $T_{Drv}$. To put it more concretely, with the turned-on state of the video-signal write transistor $T_{Sig}$ sustained as it is, the video-signal outputting circuit 102 is driven in order to set an electric potential appearing on a data line DTL at the video signal $V_{Sig}$ used for controlling the luminance of the organic EL light emitting element ELP. As a result, the electric potential appearing on the first node $ND_1$ rises to the voltage $V_{Sig}$, putting the element driving transistor $T_{Drv}$ in a turned-on state. It is to be noted that the video-signal write transistor $T_{Sig}$ can also be turned off once. Then, the electric potential appearing on a data line DTL is changed to the video signal $V_{Sig}$ used for controlling the luminance of the organic EL light emitting element ELP. Subsequently, the scan line SCL is set at a high level in order to put the video-signal write transistor $T_{Sig}$ back in a turned-on state so as to put the element driving transistor $T_{Drv}$ in a turned-on state.

Unlike the first embodiment described previously, however, a voltage $V_{CC-H}$ generated by the current supply section 100 is applied to the drain area of the element driving transistor $T_{Drv}$. Thus, an electric potential appearing in the source area of the element driving transistor $T_{Drv}$ rises. After a time period to determined in advance has lapsed, an electric potential appearing on the scan line SCL is set at a low level in order to put the video-signal write transistor $T_{Sig}$ in a turned-off state and the first node $ND_1$ serving as the gate electrode of the element driving transistor $T_{Drv}$ in a floating state. In addition, it is nice to determine the entire length to of the period $TP(2)_3$ as a design value in advance when designing the organic EL display apparatus so that the electric potential appearing on the second node $ND_2$ becomes equal to a voltage of $(V_{Ofs}-V_{th}+\Delta V)$.

Even in the period $TP(2)_3$, if the mobility μ of the element driving transistor $T_{Drv}$ is large, the increase $\Delta V$ of the electric potential appearing in the source area of the element driving transistor $T_{Drv}$ is also large. If the mobility μ of the element driving transistor $T_{Drv}$ is small, on the other hand, the increase $\Delta V$ of the electric potential appearing in the source area of the element driving transistor $T_{Drv}$ is also small.

Period $TP(2)_4$ (With Reference to FIG. 29F)

At the end of the execution of the operations described above, the threshold-voltage cancel process, the signal write process and the mobility correction process are completed. Then, the same process as the process carried out in the period $TP(5)_7$ explained before in the description of the first embodiment is carried out. As a result, an electric potential appearing on the second node $ND_2$ rises, exceeding a level of $(V_{th-EL}+V_{Cat})$ Thus, the organic EL light emitting element ELP starts emission of light. At that time, a drain current $I_{ds}$ flowing through the organic EL light emitting element ELP can be expressed by Eq. (5). Thus, the drain current $I_{ds}$ flowing through the organic EL light emitting element ELP does not depend on the threshold voltage $V_{th-EL}$ of the organic EL light emitting element ELP and the threshold voltage $V_{th}$ of the element driving transistor $T_{Drv}$. That is to say, the luminance exhibited by the organic EL light emitting element ELP as a quantity representing the amount of light emitted by the organic EL light emitting element ELP is not affected by the threshold voltage $V_{th-EL}$ of the organic EL light emitting element ELP and the threshold voltage $V_{th}$ of the element driving transistor $T_{Drv}$. On top of that, it is possible to avoid generation of current variations caused by variations of the mobility μ of the element driving transistor $T_{Drv}$ as variations of the drain current $I_{ds}$.

The light-emission state of the organic EL light emitting element ELP is sustained continuously till the (m+m'−1)th horizontal scan period. That is to say, the light-emission state of the organic EL light emitting element ELP is terminated at the end of the period $TP(2)_{-1}$.

At the end of the period $TP(2)_{-1}$, the (n, m)th sub-pixel serving as a organic EL device 10 completes the light emitting operation.

In addition, it is possible to provide an alternative typical configuration in which the period $TP(3)_3$ allocated to a sequence of operations ending with an operation carried out by the 2Tr/1C driving circuit shown in FIG. 26 is divided into two operations, i.e., a sub-period $TP(3)_3$ and a sub-period $TP(3)'_3$. In the sub-period $TP(3)_3$, as described previously, the video-signal write transistor $T_{Sig}$ is turned off once. Then, the electric potential appearing on a data line DTL is changed to the video signal $V_{Sig}$ used for controlling the luminance of the organic EL light emitting element ELP. Subsequently, in the sub-period $TP(3)'_3$, the scan line SCL is set at a high level in order to put the video-signal write transistor $T_{Sig}$ back in a turned-on state and, thus, the element driving transistor $T_{Drv}$ in a turned-on state. Timing charts in this case are shown in FIG. 30.

Tenth Embodiment

The tenth embodiment implements a variety of modified versions of the organic EL display apparatus according to the second embodiment of the present invention and a variety of modified versions of the organic EL device 10 employed in the organic EL display apparatus as an organic EL device 10 according to the second embodiment of the present invention.

As explained previously, the driving circuit employed in the organic EL device according to each of the fifth to eighth embodiments has five transistors and one capacitor. FIG. 31 is a diagram showing a typical configuration of an equivalent circuit of a driving circuit employed in an organic EL device according to a tenth embodiment employing three transistors and one capacitor.

FIG. 31 is a diagram showing an equivalent circuit of a driving circuit employed in an organic EL device according to the tenth embodiment whereas FIG. 32 is a conceptual diagram showing an organic EL display apparatus employing a plurality of aforementioned organic EL devices. FIG. 33 shows timing charts of the organic EL device. Each of FIGS. 34A to 34D and 35A to 35C shows a model of turned-on and turned-off states of the transistors employed in the organic EL device.

In comparison with the fifth to eighth embodiments described above, the driving circuit employed in an organic EL device according to the tenth embodiment does not include two transistors, i.e., the second-node initialization transistor $T_{ND2}$ and the light-emission control transistor $T_{EL\_C}$. That is to say, in addition to a capacitor $C_1$, the configuration of the driving circuit according to the tenth embodiment includes three transistors, i.e., a video-signal write transistor $T_{Sig}$, an element driving transistor $T_{Drv}$ and a first-node initialization transistor $T_{ND1}$.

In the tenth embodiment, the first-node initialization transistor $T_{ND1}$ employed in the driving circuit can be designed into the same configuration as the first-node initialization transistor $T_{ND1}$ employed in any one of the fifth to eighth embodiments explained previously. For example, the first-node initialization transistor $T_{ND1}$ employed in the equivalent circuit shown in FIG. 31 as an equivalent circuit of the driving circuit employed in the tenth embodiment is designed into the same configuration as the first-node initialization transistor $T_{ND1}$ employed in the fifth embodiment explained previously by referring to FIG. 12. As shown in FIGS. 12 and 31, the first-node initialization transistor $T_{ND1}$ has a shield electrode on the side close to the first node $ND_1$. However, the configuration of the first-node initialization transistor $T_{ND1}$ is by no means limited to the configuration of the first-node initialization transistor $T_{ND1}$ employed in the fifth embodiment but can also be designed into the same configuration as the first-node initialization transistor $T_{ND1}$ employed in any one of the sixth to eighth embodiments. In addition, the video-signal write transistor $T_{Sig}$ employed in the equivalent shown in FIG. 31 is designed as a transistor having the so-called single-gate structure. As explained previously in the description of the fifth embodiment, however, the configuration of the video-signal write transistor $T_{Sig}$ is by no means limited to the single-gate structure but the video-signal write transistor $T_{Sig}$ can also be designed into the same structure as the video-signal write transistor $T_{Sig}$ employed in any one of the first to fourth embodiments described before.

Basically, the configuration of the driving circuit employed in the organic EL device according to the tenth embodiment is obtained by adding a first-node initialization transistor $T_{ND1}$ to the 2Tr/1C driving circuit employed in the organic EL device according to the ninth embodiment explained previously by referring to FIG. 26. It is to be noted that, for the sake of convenience, in the following description, the driving circuit employed in the organic EL device according to the tenth embodiment is referred to as a second 3Tr/1C driving circuit.
Element Driving Transistor $T_{Drv}$ Since the configuration of the element driving transistor $T_{Drv}$ employed in the second 3Tr/1C driving circuit is the same as the element driving transistor $T_{Drv}$ explained before in the description of the first embodiment, no detailed description of the element driving transistor $T_{Drv}$ employed in the second 3Tr/1C driving circuit is given in order to avoid duplications. In the case of the second 3Tr/1C driving circuit, however, the drain area of the element driving transistor $T_{Drv}$ is connected to a current supply section 100 which generates a voltage $V_{CC-H}$ and a voltage $V_{CC-L}$ in the same way as the third modified version of the ninth embodiment. Since the voltages $V_{CC-H}$ and $V_{CC-L}$ are identical with those of the third modified version of the ninth embodiment, no detailed description of the voltages $V_{CC-H}$ and $V_{CC-L}$ is given either in order to avoid duplications.
Video-Signal Write Transistor $T_{Sig}$ Since the configuration of the video-signal write transistor $T_{Sig}$ employed in the second 3Tr/1C driving circuit is the same as the video-signal write transistor $T_{Sig}$ explained before in the description of the fifth embodiment, no detailed description of the video-signal write transistor $T_{Sig}$ employed in the second 3Tr/1C driving circuit is given in order to avoid duplications.
First-Node Initialization Transistor $T_{ND1}$ Since the configuration of the first-node initialization transistor $T_{ND1}$ employed in the second 3Tr/1C driving circuit is the same as the first-node initialization transistor $T_{ND1}$ explained before in the description of the fifth and other embodiments, no detailed description of the first-node initialization transistor $T_{ND1}$ employed in the second 3Tr/1C driving circuit is given in order to avoid duplications.
Organic EL Light Emitting Element ELP Since the configuration of the organic EL light emitting element ELP employed in the second 3Tr/1C driving circuit is the same as the organic EL light emitting element ELP explained before in the description of the first embodiment, no detailed description of the organic EL light emitting element ELP employed in the second 3Tr/1C driving circuit is given in order to avoid duplications.

Operations of the second 3Tr/1C driving circuit are described as follows.
Period $TP(3_2)_{-1}$ (With Reference to FIGS. 33 and 34A)

An operation carried out in a period $TP(3_2)_{-1}$ is, for example, an operation performed in the immediately preceding display frame. Virtually, the operation is the same as the operation carried out in the period $TP(5)_{-1}$ explained previously in the description of the first embodiment.

A period $TP(3_2)_0$ to a period $TP(3_2)_3$, which are shown in FIG. 33, correspond respectively to the period $TP(5)_0$ to the period $TP(5)_4$, which are shown in FIG. 4. These periods form a sequence of periods allocated to a sequence of operations ending with an operation to be carried out immediately prior to the next signal write process. The operations performed in the period $TP(3_2)_0$ to the period $TP(3_2)_3$ are identical with those carried out by the first embodiment. To put it concretely, in the period $TP(3_2)_3$, the (n, m)th organic EL device 10 is as a rule in a no-light emission state. That is to say, the periods $TP(3_2)_0$ to $TP(3_2)_3$ are a sequence of periods having a duration stretched for example from the beginning of the (m+m')th horizontal scan period of the immediately preceding display frame to the end of the (m−1)th horizontal scan period of the current display frame. In addition, it is also possible to provide a configuration in which the periods $TP(3_2)_1$ to $TP(3_2)_3$ are included in the mth horizontal scan period of the current display frame. It is to be noted that, in order to make the following explanation simple, the start and end of a period $TP(3_2)_4$ coincide with the start and end of the mth horizontal scan period respectively.

Each of the period $TP(3_2)_0$ to the period $TP(3_2)_3$ is explained as follows. It is to be noted that, as explained before in the description of the first embodiment, the length of each of the periods $TP(3_2)_1$ to $TP(3_2)_4$ can be properly set in accordance with the design of the organic EL display apparatus.

Figure 34A:
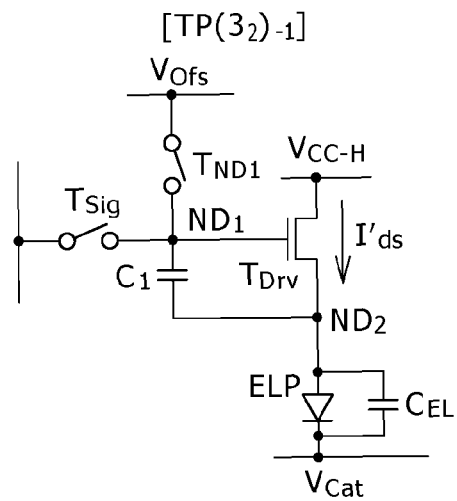
Figure 34B:
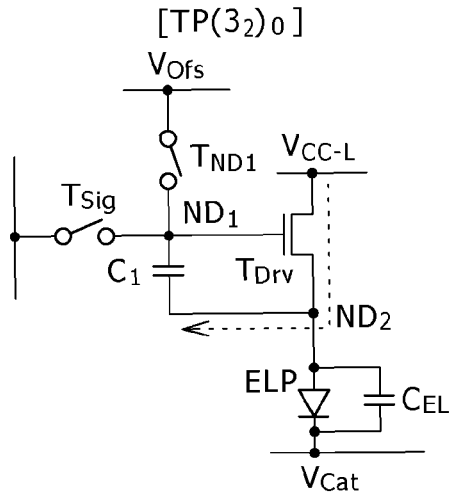

Period $TP(3_2)_0$ (With Reference to FIG. 34B)

The period $TP(3_2)_0$ is a period allocated to, for example, operations carried out for the immediately preceding display frame and the current display frame. That is to say, this period $TP(3_2)_0$ is a period beginning with the (m+m')th horizontal scan period in the immediately preceding display frame and ending with the (m−1)th horizontal scan period in the current display frame. In this period $TP(3_2)_0$, the (n, m)th organic EL device 10 is as a rule in a no-light emission state. At a point a transition is made from the period $TP(3_2)_{-1}$ to the period $TP(3_2)_0$, a voltage generated by the current supply section 100 is switched from a level $V_{CC-H}$ to a level $V_{CC-L}$. As a result, an electric potential appearing on the second node $ND_2$ serving as the source area of the element driving transistor $T_{Drv}$ as well as the anode electrode of the organic EL light emitting element ELP falls to the voltage $V_{CC-L}$, putting the organic EL light emitting element ELP in a no-light transmission state. In addition, an electric potential appearing on the first node $ND_1$ in a floating state also falls to follow the drop of the an electric potential appearing on the second node $ND_2$. As described before, the first node $ND_1$ serves as the gate electrode of the element driving transistor $T_{Drv}$.

Figure 34C:
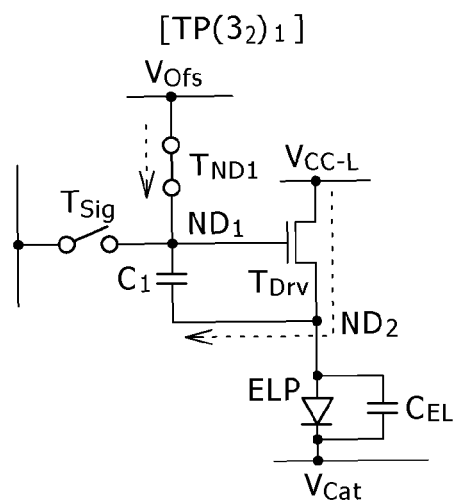

Period $TP(3_2)_1$ (With Reference to FIG. 34C)

At the beginning of the next period $TP(3_2)_1$, the first-node initialization transistor control circuit 104 is driven in order to set a first-node initialization transistor control line $AZ_{ND1}$ at a high level so as to put the first-node initialization transistor $T_{ND1}$ in a turned-on state. As a result, an electric potential appearing on the first node $ND_1$ becomes equal to a voltage $V_{Ofs}$ of 0 volts, for example. The electric potential appearing on the second node $ND_2$ is sustained at the voltage $V_{CC-L}$ which is −10 volts, for example.

By carrying out the operations described above, the difference in electric potential between the gate electrode of the element driving transistor $T_{Drv}$ and the source area of the element driving transistor $T_{Drv}$ rises to a voltage at least equal to the threshold voltage $V_{th}$ of the element driving transistor $T_{Drv}$, putting the element driving transistor $T_{Drv}$ in a turned-on state.

Figure 34D:
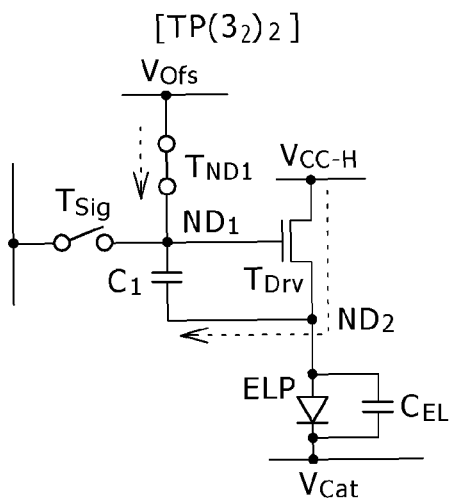

Period $TP(3_2)_2$ (With Reference to FIG. 34D)

Then, during the following period $TP(3_2)_2$, a threshold-voltage cancel process is carried out. That is to say, with the turned-on state of the first-node initialization transistor $T_{ND1}$ sustained as it is, a voltage generated by the current supply section 100 is switched from the voltage $V_{CC-L}$ to the voltage $V_{CC-H}$. As a result, an electric potential appearing on the second node $ND_2$ changes in a direction to an electric potential equal to a difference obtained as a result of subtracting the threshold voltage $V_{th}$ of the element driving transistor $T_{Drv}$ from an electric potential appearing on the first node $ND_1$ even though an electric potential appearing on the first node $ND_1$ does not change, being sustained at the voltage $V_{Ofs}$ of 0 volts. That is to say, an electric potential appearing on the second node $ND_2$, which is in a floating state, rises. Then, as the difference in electric potential between the gate electrode of the element driving transistor $T_{Drv}$ and the source area of the element driving transistor $T_{Drv}$ reaches the threshold voltage $V_{th}$ of the element driving transistor $T_{Drv}$, the element driving transistor $T_{Drv}$ is put in a turned-off state. To put it more concretely, the electric potential appearing on the second node $ND_2$, which is in a floating state, approaches a voltage difference of $(V_{Ofs}-V_{th})=-3$ volts and eventually becomes equal to the voltage difference of $(V_{Ofs}-V_{th})$. In this case, if the validity of Eq. (3) given earlier is assured or, in other words, if an electric potential satisfying Eq. (3) is selected and determined in advance, the organic EL light emitting element ELP never emits light.

In the period $TP(3_2)_2$, the electric potential appearing on the second node $ND_2$ eventually becomes equal to the voltage difference of $(V_{Ofs}-V_{th})$. That is to say, the electric potential appearing on the second node $ND_2$ is determined, depending on only the threshold voltage $V_{th}$ of the element driving transistor $T_{Drv}$ and the voltage $V_{Ofs}$ used for initializing the gate electrode of the element driving transistor $T_{Drv}$. In other words, the electric potential appearing on the second node $ND_2$ is not dependent on the threshold voltage $V_{th-EL}$ of the organic EL light emitting element ELP.

Figure 35A:
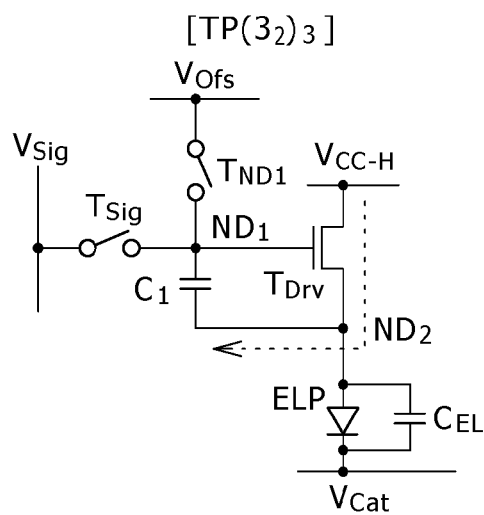

Period $TP(3_2)_3$ (With Reference to FIG. 35A)

In the following period $TP(3_2)_3$, the first-node initialization transistor control circuit 104 is driven in order to set the first-node initialization transistor control line $AZ_{ND1}$ at a low level so as to put the first-node initialization transistor $T_{ND1}$ in a turned-off state. As a result, the electric potential appearing on the first node $ND_1$ and the electric potential appearing on the second node $ND_2$ virtually do not change. In actuality, the electric potentials change due to a coupling effect of the parasitic capacitance $C_{gs}$ between the gate electrode of the element driving transistor $T_{Drv}$ and the source area of the element driving transistor $T_{Drv}$ or the like. Nevertheless, the changes in electric potential can be normally ignored.

Figure 35B:
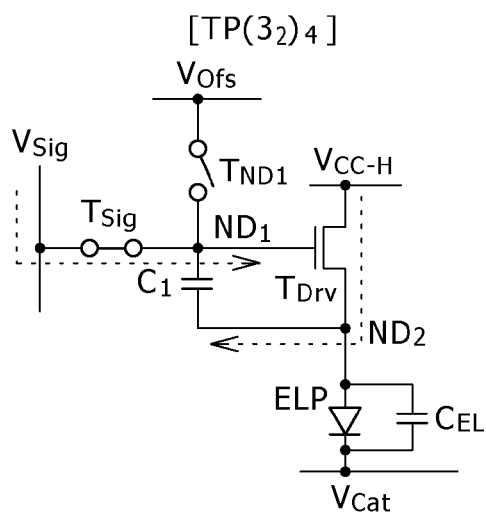

Period $TP(3_2)_4$ (With Reference to FIG. 35B)

In the following period $TP(3_2)_4$, a signal write operation for the element driving transistor $T_{Drv}$ and a mobility correction process are carried out. The mobility correction process is a process for correcting the electric potential appearing on the second node $ND_2$ serving as the source area of the element driving transistor $T_{Drv}$ on the basis of the magnitude of the mobility μ of the element driving transistor $T_{Drv}$. To put it more concretely, the video-signal outputting circuit 102 is driven in order to set an electric potential appearing on a data line DTL at the video signal $V_{Sig}$ used for controlling the luminance of the organic EL light emitting element ELP. Subsequently, the scan circuit 101 is driven in order to set the scan line SCL at a high level in order to put the video-signal write transistor $T_{Sig}$ in a turned-on state. As a result, the electric potential appearing on the first node $ND_1$ rises to the voltage $V_{Sig}$, putting the element driving transistor $T_{Drv}$ in a turned-on state.

Unlike the first embodiment described previously, the voltage $V_{CC-H}$ generated by the current supply section 100 is applied to the drain area of the element driving transistor $T_{Drv}$. Thus, an electric potential appearing in the source area of the element driving transistor $T_{Drv}$ rises. After a time period $t_0$ determined in advance has lapsed, an electric potential appearing on the scan line SCL is set at a low level in order to put the video-signal write transistor $T_{Sig}$ in a turned-off state and the first node $ND_1$ serving as the gate electrode of the element driving transistor $T_{Drv}$ in a floating state. In addition, it is nice to determine the entire length to of the period $TP(3_2)_4$ as a design value in advance when designing the organic EL display apparatus so that the electric potential appearing on the second node $ND_2$ becomes equal to a voltage of $(V_{Ofs} - V_{th} + \Delta V)$.

Even in the period $TP(3_2)_4$, if the mobility µ of the element driving transistor $T_{Drv}$ is large, the increase $\Delta V$ of the electric potential appearing in the source area of the element driving transistor $T_{Drv}$ is also large. If the mobility µ of the element driving transistor $T_{Drv}$ is small, on the other hand, the increase $\Delta V$ of the electric potential appearing in the source area of the element driving transistor $T_{Drv}$ is also small.

Figure 35C:
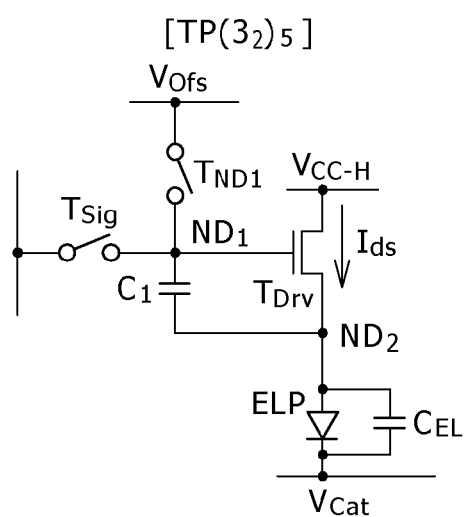

Period $TP(3_2)_5$ (With Reference to FIG. 35C)

At the end of the execution of the operations described above, the threshold-voltage cancel process, the signal write process and the mobility correction process are completed. Then, the same process as the process carried out in the period $TP(5)_7$ explained before in the description of the first embodiment is carried out. As a result, an electric potential appearing on the second node $ND_2$ rises, exceeding a level of $(V_{th-EL} + V_{Cat})$ Thus, the organic EL light emitting element ELP starts emission of light. At that time, a drain current $I_{ds}$ flowing through the organic EL light emitting element ELP can be expressed by Eq. (5). Thus, the drain current $I_{ds}$ flowing through the organic EL light emitting element ELP does not depend on the threshold voltage $V_{th-EL}$ of the organic EL light emitting element ELP and the threshold voltage $V_{th}$ of the element driving transistor $T_{Drv}$. That is to say, the luminance exhibited by the organic EL light emitting element ELP as a quantity representing the amount of light emitted by the organic EL light emitting element ELP is not affected by the threshold voltage $V_{th-EL}$ of the organic EL light emitting element ELP and the threshold voltage $V_{th}$ of the element driving transistor $T_{Drv}$. On top of that, it is possible to avoid generation of current variations caused by variations of the mobility µ of the element driving transistor $T_{Drv}$ as variations of the drain current $I_{ds}$.

The light-emission state of the organic EL light emitting element ELP is sustained continuously till the (m+m'−1)th horizontal scan period. That is to say, the light-emission state of the organic EL light emitting element ELP is terminated at the end of the period $TP(3_2)_{-1}$.

At the end of the period $TP(3_2)_{-1}$, the (n, m)th sub-pixel serving as a organic EL device 10 completes the light emitting operation.

The above description has explained the configuration of the organic EL display apparatus according to the tenth embodiment, the organic EL device 10 employed in the organic EL display apparatus as the organic EL device according to the tenth embodiment and the configuration of the second 3Tr/1C driving circuit included in the organic EL device as a driving circuit for driving an organic EL light emitting element ELP of the organic EL device. It is to be noted that the second 3Tr/1C driving circuit shown in FIG. 31 can be changed to a configuration additionally including a second-node initialization transistor $T_{ND2}$, a light-emission control transistor $T_{EL\_C}$ or both. If a second-node initialization transistor $T_{ND2}$ is added to the driving circuit for example, it is no longer necessary to supply the voltage $V_{CC-L}$ from the current supply section 100 but an initialization voltage can yet be applied to the second node $ND_2$ by adoption of the same method as the one explained previously in the description of the first embodiment. In addition, if a light-emission control transistor $T_{EL\_C}$ is added to the configuration of the second 3Tr/1C driving circuit, the current supply section 100 merely needs to generate a fixed voltage $V_{CC}$ and, by adoption of the same driving method as the driving method explained previously in the description of the second modified version of the ninth embodiment with reference to FIGS. 24C and 24D, an initialization voltage can be applied to the second node $ND_2$.

The above description exemplifies the present invention by describing the preferred embodiments. It is to be noted, however, that the scope of the present invention is by no means limited to these embodiments. The configurations/structures of the organic EL display apparatus according to each of the embodiments and the organic EL device 10 employed in the organic EL display apparatus are typical configurations/structures and can thus be changed properly. In addition, the operation of the driving circuit employed in each of the organic EL devices and the driving method adopted by the driving circuit as a method to drive the organic EL light emitting element ELP of the organic EL device are also a typical operation and a typical method respectively and can thus be changed properly as well.

What is claimed is:

1. An organic electro luminescence device comprising:
   an organic electro luminescence light emitting element; and
   a driving circuit for driving said organic electro luminescence light emitting element, wherein
   said driving circuit includes
   (A) an element driving transistor,
   (B) a video-signal write transistor, and
   (C) a capacitor having a pair of particular and other electrodes,
   with regard to said element driving transistor,
   (A-1) a source/drain area provided on a particular side of said element driving transistor to serve as a particular source/drain area of said element driving transistor is connected to a current supply section, and
   (A-2) a source/drain area provided on the other side of said element driving transistor to serve as another source/drain area of said element driving transistor is connected to the anode electrode of said organic electro luminescence light emitting element and said particular electrode of said capacitor, forming a second node,
   said video-signal write transistor is a transistor with a dual-gate structure including a first sub-transistor having a first channel creation area as well as a first gate electrode and including a second sub-transistor having a second channel creation area as well as a second gate electrode,
   a source/drain area provided on a particular side of said first sub-transistor to serve as a particular source/drain area of said first sub-transistor is connected to a data line,
   a source/drain area provided on the other side of said second sub-transistor to serve as another source/drain area of said second sub-transistor is connected to the gate electrode of said element driving transistor and said other electrode of said capacitor, forming a first node,
   said first gate electrode of said first sub-transistor and said second gate electrode of said second sub-transistor are connected to a scan line,
   said first gate electrode of said first sub-transistor faces a particular face of said first channel creation area of said first sub-transistor through a gate insulation layer sandwiched by said first gate electrode and said particular face of said first channel creation area, said second gate electrode of said second sub-transistor faces a particular face of said second channel creation area of said second sub-transistor through said gate insulation layer sandwiched by said second gate electrode and said particular face of said second channel creation area, said second sub-transistor has a shield electrode facing the other face of said second channel creation area through a shield insulation layer sandwiched by said shield electrode and said other face of said second channel creation area, and said shield electrode is connected to said other source/drain area of said second sub-transistor.

2. The organic electro luminescence device according to claim 1 wherein:

said second sub-transistor further has a second shield electrode facing said other face of said second channel creation area through a shield insulation layer sandwiched by said second shield electrode and said other face of said second channel creation area; and said second shield electrode is connected to a common area in which a source/drain area provided on the other side of said first sub-transistor to serve as another source/drain area of said first sub-transistor overlaps a source/drain area provided on a particular side of said second sub-transistor to serve as a particular source/drain area of said second sub-transistor.

3. The organic electro luminescence device according to claim 1 wherein:

said first sub-transistor has a third shield electrode facing the other face of said first channel creation area through a shield insulation layer sandwiched by said third shield electrode and said other face of said first channel creation area; and said third shield electrode is connected to said particular source/drain area of said first sub-transistor.

4. The organic electro luminescence device according to claim 1 wherein:

said second sub-transistor further has a second shield electrode facing said other face of said second channel creation area through a shield insulation layer sandwiched by said second shield electrode and said other face of said second channel creation area;

said first sub-transistor has third and fourth shield electrodes facing the other face of said first channel creation area through a shield insulation layer sandwiched by said third and fourth shield electrodes and said other face of said first channel creation area;

said second and fourth shield electrodes are connected to a common area in which a source/drain area provided on the other side of said first sub-transistor to serve as another source/drain area of said first sub-transistor overlaps a source/drain area provided on a particular side of said second sub-transistor to serve as a particular source/drain area of said second sub-transistor; and said third shield electrode is connected to said particular source/drain area of said first sub-transistor.

5. An organic electro luminescence device comprising:

an organic electro luminescence light emitting element; and a driving circuit for driving said organic electro luminescence light emitting element, wherein said driving circuit includes (A) an element driving transistor, (B) a video-signal write transistor, (C) a capacitor having a pair of particular and other electrodes, and (D) a first-node initialization transistor, with regard to said element driving transistor, (A-1) a source/drain area provided on a particular side of said element driving transistor to serve as a particular source/drain area of said element driving transistor is connected to a current supply section, and (A-2) a source/drain area provided on the other side of said element driving transistor to serve as another source/drain area of said element driving transistor is connected to the anode electrode of said organic electro luminescence light emitting element and said particular electrode of said capacitor, forming a second node, with regard to said video-signal write transistor, (B-1) a source/drain area provided on a particular side of said video-signal write transistor to serve as a particular source/drain area of said video-signal write transistor is connected to a data line, (B-2) a source/drain area provided on the other side of said video-signal write transistor to serve as another source/drain area of said video-signal write transistor is connected to the gate electrode of said element driving transistor and said other electrode of said capacitor, forming a first node, and (B-3) the gate electrode of said video-signal write transistor is connected to a scan line, said first-node initialization transistor is a transistor with a dual-gate structure including a first sub-transistor having a first channel creation area as well as a first gate electrode and including a second sub-transistor having a second channel creation area as well as a second gate electrode, a source/drain area provided on a particular side of said first sub-transistor to serve as a particular source/drain area of said first sub-transistor is connected to a first-node initialization voltage supply line, a source/drain area provided on the other side of said second sub-transistor to serve as another source/drain area of said second sub-transistor is connected to said first node, said first gate electrode of said first sub-transistor and said second gate electrode of said second sub-transistor are connected to a first-node initialization transistor control line, said first gate electrode of said first sub-transistor faces a particular face of said first channel creation area of said first sub-transistor through a gate insulation layer sandwiched by said first gate electrode and said particular face of said first channel creation area, said second gate electrode of said second sub-transistor faces a particular face of said second channel creation area of said second sub-transistor through said gate insulation layer sandwiched by said second gate electrode and said particular face of said second channel creation area, said second sub-transistor has a shield electrode facing the other face of said second channel creation area through a shield insulation layer sandwiched by said shield electrode and said other face of said second channel creation area, and said shield electrode is connected to said other source/drain area of said second sub-transistor.

6. The organic electro luminescence device according to claim 5 wherein:

said second sub-transistor further has a second shield electrode facing said other face of said second channel creation area through a shield insulation layer sandwiched by said second shield electrode and said other face of said second channel creation area; and said second shield electrode is connected to a common area in which a source/drain area provided on the other side of said first sub-transistor to serve as another source/drain area of said first sub-transistor overlaps a source/drain area provided on a particular side of said second sub-transistor to serve as a particular source/drain area of said second sub-transistor.

7. The organic electro luminescence device according to claim 5 wherein:

said first sub-transistor has a third shield electrode facing the other face of said first channel creation area through a shield insulation layer sandwiched by said third shield electrode and said other face of said first channel creation area; and said third shield electrode is connected to said particular source/drain area of said first sub-transistor.

8. The organic electro luminescence device according to claim 5 wherein:

said second sub-transistor further has a second shield electrode facing said other face of said second channel creation area through a shield insulation layer sandwiched by said second shield electrode and said other face of said second channel creation area;

said first sub-transistor has third and fourth shield electrodes facing the other face of said first channel creation area through a shield insulation layer sandwiched by said third and fourth shield electrodes and said other face of said first channel creation area;

said second and fourth shield electrodes are connected to a common area in which a source/drain area provided on the other side of said first sub-transistor to serve as another source/drain area of said first sub-transistor overlaps a source/drain area provided on a particular side of said second sub-transistor to serve as a particular source/drain area of said second sub-transistor; and said third shield electrode is connected to said particular source/drain area of said first sub-transistor.

9. An organic electro luminescence display apparatus comprising:

(1) a scan circuit;

(2) a video-signal outputting circuit;

(3) a total of M×N organic electro luminescence devices laid out to form a two-dimensional matrix of N said organic electro luminescence devices arranged in a first direction and M said organic electro luminescence devices arranged in a second direction different from said first direction;

(4) M scan lines each connected to said scan circuit and each stretched in said first direction;

(5) N data lines each connected to said video-signal outputting circuit and each stretched in said second direction; and (6) a current supply section, wherein each of said organic electro luminescence devices includes an organic electro luminescence light emitting element and a driving circuit for driving said organic electro luminescence light emitting element, said driving circuit includes (A) an element driving transistor, (B) a video-signal write transistor, and (C) a capacitor having a pair of particular and other electrodes, with regard to said element driving transistor, (A-1) a source/drain area provided on a particular side of said element driving transistor to serve as a particular source/drain area of said element driving transistor is connected to said current supply section, and (A-2) a source/drain area provided on the other side of said element driving transistor to serve as another source/drain area of said element driving transistor is connected to the anode electrode of said organic electro luminescence light emitting element and said particular electrode of said capacitor, forming a second node, said video-signal write transistor is a transistor with a dual-gate structure including a first sub-transistor having a first channel creation area as well as a first gate electrode and including a second sub-transistor having a second channel creation area as well as a second gate electrode, a source/drain area provided on a particular side of said first sub-transistor to serve as a particular source/drain area of said first sub-transistor is connected to one of said data lines, a source/drain area provided on the other side of said second sub-transistor to serve as another source/drain area of said second sub-transistor is connected to the gate electrode of said element driving transistor and said other electrode of said capacitor, forming a first node, said first gate electrode of said first sub-transistor and said second gate electrode of said second sub-transistor are connected to one of said scan lines, said first gate electrode of said first sub-transistor faces a particular face of said first channel creation area of said first sub-transistor through a gate insulation layer sandwiched by said first gate electrode and said particular face of said first channel creation area, said second gate electrode of said second sub-transistor faces a particular face of said second channel creation area of said second sub-transistor through said gate insulation layer sandwiched by said second gate electrode and said particular face of said second channel creation area, said second sub-transistor has a shield electrode facing the other face of said second channel creation area through a shield insulation layer sandwiched by said shield electrode and said other face of said second channel creation area, and said shield electrode is connected to said other source/drain area of said second sub-transistor.

10. An organic electro luminescence display apparatus comprising:

(1) a scan circuit;

(2) a video-signal outputting circuit;

(3) a total of M×N organic electro luminescence devices laid out to form a two-dimensional matrix of N said organic electro luminescence devices arranged in a first direction and M said organic electro luminescence devices arranged in a second direction different from said first direction;

(4) M scan lines each connected to said scan circuit and each stretched in said first direction;

(5) N data lines each connected to said video-signal outputting circuit and each stretched in said second direction; and (6) a current supply section, wherein
each of said organic electro luminescence devices includes an organic electro luminescence light emitting element and a driving circuit for driving said organic electro luminescence light emitting element,
said driving circuit includes
- (A) an element driving transistor,
- (B) a video-signal write transistor,
- (C) a capacitor having a pair of particular and other electrodes, and
- (D) a first-node initialization transistor, with regard to said element driving transistor,
- (A-1) a source/drain area provided on a particular side of said element driving transistor to serve as a particular source/drain area of said element driving transistor is connected to said current supply section, and
- (A-2) a source/drain area provided on the other side of said element driving transistor to serve as another source/drain area of said element driving transistor is connected to the anode electrode of said organic electro luminescence light emitting element and said particular electrode of said capacitor, forming a second node, with regard to said video-signal write transistor,
- (B-1) a source/drain area provided on a particular side of said video-signal write transistor to serve as a particular source/drain area of said video-signal write transistor is connected to one of said data lines,
- (B-2) a source/drain area provided on the other side of said video-signal write transistor to serve as another source/drain area of said video-signal write transistor is connected to the gate electrode of said element driving transistor and said other electrode of said capacitor, forming a first node, and
- (B-3) the gate electrode of said video-signal write transistor is connected to one of said scan lines, said first-node initialization transistor is a transistor with a dual-gate structure including a first sub-transistor having a first channel creation area as well as a first gate electrode and including a second sub-transistor having a second channel creation area as well as a second gate electrode, a source/drain area provided on a particular side of said first sub-transistor to serve as a particular source/drain area of said first sub-transistor is connected to a first-node initialization voltage supply line, a source/drain area provided on the other side of said second sub-transistor to serve as another source/drain area of said second sub-transistor is connected to said first node, said first gate electrode of said first sub-transistor and said second gate electrode of said second sub-transistor are connected to a first-node initialization transistor control line, said first gate electrode of said first sub-transistor faces a particular face of said first channel creation area of said first sub-transistor through a gate insulation layer sandwiched by said first gate electrode and said particular face of said first channel creation area, said second gate electrode of said second sub-transistor faces a particular face of said second channel creation area of said second sub-transistor through said gate insulation layer sandwiched by said second gate electrode and said particular face of said second channel creation area, said second sub-transistor has a shield electrode facing the other face of said second channel creation area through a shield insulation layer sandwiched by said shield electrode and said other face of said second channel creation area, and said shield electrode is connected to said other source/drain area of said second sub-transistor.

\* \* \* \* \*